(12) United States Patent
Burchard et al.

(10) Patent No.: US 12,092,709 B2
(45) Date of Patent: Sep. 17, 2024

(54) NV CENTER-BASED MICROWAVE-FREE GALVANICALLY ISOLATED MAGNETOMETER

(71) Applicants: ELMOS SEMICONDUCTOR SE, Dortmund (DE); Duotec GMBH, Halver (DE); Quantum Technologies GmbH, Leipzig (DE)

(72) Inventors: Bernd Burchard, Essen (DE); Jan Meijer, Bochum (DE); Arthur Rönisch, Kierspe (DE); Robert Staacke, Leipzig (DE)

(73) Assignees: Elmos Semiconductor SE, Dortmund (DE); Quantum Technologies GmbH, Leipzig (DE); Duotec GmbH, Halver (DE)

( * ) Notice: Subject to any disclaimer, the term of this patent is extended or adjusted under 35 U.S.C. 154(b) by 0 days.

(21) Appl. No.: 17/794,955

(22) PCT Filed: Jan. 25, 2021

(86) PCT No.: PCT/DE2021/100069
§ 371 (c)(1),
(2) Date: Jul. 23, 2022

(87) PCT Pub. No.: WO2021/151429
PCT Pub. Date: Aug. 5, 2021

(65) Prior Publication Data
US 2023/0349989 A1    Nov. 2, 2023

(30) Foreign Application Priority Data
Jan. 30, 2020  (DE) .................. 10 2020 102 311.1

(51) Int. Cl.
*G01R 33/26* (2006.01)
*G01R 33/00* (2006.01)
(Continued)

(52) U.S. Cl.
CPC ......... *G01R 33/26* (2013.01); *G01R 33/0052* (2013.01); *G01R 33/323* (2013.01);
(Continued)

(58) Field of Classification Search
CPC .. G01R 33/26; G01R 33/0052; G01R 33/323; G01R 33/3621; G01R 33/032;
(Continued)

(56) References Cited

U.S. PATENT DOCUMENTS

| 8,547,090 B2 | 10/2013 | Lukin et al. |
| 8,947,080 B2 | 2/2015 | Lukin et al. |

(Continued)

FOREIGN PATENT DOCUMENTS

| DE | 4322830 A1 | 1/1995 |
| DE | 102014019354 A1 | 6/2016 |

(Continued)

OTHER PUBLICATIONS

Bernd Burchard—Diamond-based electronic and optoelectronic devices and device structures—Dissertation—1994—Germany.
(Continued)

*Primary Examiner* — G. M. A Hyder
(74) *Attorney, Agent, or Firm* — Mindful IP PLLC; Michael J. McCandlish

(57) ABSTRACT

A scalar magnetometer includes a sensor element, a circuit carrier, a pump radiation source, a radiation receiver and evaluation means. The pump radiation source emits pump radiation. The sensor element preferably includes one or more NV centers in diamond as paramagnetic centers. This paramagnetic center emits fluorescence radiation when irradiated with pump radiation. The radiation receiver converts a intensity signal of the fluorescence radiation into a receiver output signal. The evaluation means detects and/or stores and/or transmits the value of the receiver output signal. The
(Continued)

material of the circuit carrier is preferably transparent for the pump radiation in the radiation path between pump radiation source and sensor element and transparent for the fluorescence radiation in the radiation path between sensor element and radiation receiver. The components sensor element, pump radiation source, radiation receiver and evaluation means are preferably mechanically attached to the circuit carrier.

21 Claims, 18 Drawing Sheets

(51) Int. Cl.
    *G01R 33/32*     (2006.01)
    *G01R 33/36*     (2006.01)
    *G06N 10/40*     (2022.01)
    *G01V 3/30*     (2006.01)

(52) U.S. Cl.
    CPC ......... *G01R 33/3621* (2013.01); *G06N 10/40* (2022.01); *G01V 3/30* (2013.01)

(58) Field of Classification Search
    CPC ............ G06N 10/40; G06N 3/02; G06N 7/01; G06N 10/00; G06N 20/00; G01V 3/30; G01N 24/006; C03C 8/14; H05K 1/0274; H05K 2201/0108; H05K 2201/10151
    See application file for complete search history.

(56) References Cited

U.S. PATENT DOCUMENTS

| | | |
|---|---|---|
| 9,222,887 B2 | 12/2015 | Englund |
| 9,541,610 B2 | 1/2017 | Kaup et al. |
| 9,551,763 B1 | 1/2017 | Hahn et al. |
| 9,557,391 B2 | 1/2017 | Egan et al. |
| 9,599,562 B2 | 3/2017 | Englund |
| 9,632,045 B2 | 4/2017 | Englund et al. |
| 9,638,821 B2 | 5/2017 | Meyer |
| 9,658,301 B2 | 5/2017 | Walsworth |
| 9,664,767 B2 | 5/2017 | Cappellaro et al. |
| 9,720,055 B1 | 8/2017 | Hahn et al. |
| 9,817,081 B2 | 11/2017 | Hahn et al. |
| 9,823,314 B2 | 11/2017 | Hahn et al. |
| 9,829,545 B2 | 11/2017 | Stetson, Jr. et al. |
| 9,910,104 B2 | 3/2018 | Boesch et al. |
| 9,910,105 B2 | 3/2018 | Boesch et al. |
| 10,006,973 B2 | 6/2018 | Hahn et al. |
| 10,007,885 B1 | 6/2018 | Gorshkov et al. |
| 10,012,704 B2 | 7/2018 | Coar |
| 10,088,452 B2 | 10/2018 | Villani, Jr. et al. |
| 10,120,039 B2 | 11/2018 | Stetson, Jr. et al. |
| 10,168,393 B2 | 1/2019 | Stetson, Jr. et al. |
| 10,241,158 B2 | 3/2019 | Manickam et al. |
| 10,277,208 B2 | 4/2019 | Krause et al. |
| 10,345,396 B2 | 7/2019 | Manickam et al. |
| 10,359,479 B2 | 7/2019 | Manickam et al. |
| 10,408,889 B2 | 9/2019 | Kaup et al. |
| 10,408,890 B2 | 9/2019 | Bruce et al. |
| 2016/0216304 A1* | 7/2016 | Sekelsky ............... B60L 53/126 |
| 2017/0032224 A1 | 2/2017 | Zhang et al. |
| 2017/0212182 A1* | 7/2017 | Hahn ..................... G01R 33/60 |
| 2019/0154766 A1* | 5/2019 | Lutz ..................... G01R 15/245 |

FOREIGN PATENT DOCUMENTS

| | | |
|---|---|---|
| DE | 102015016021 A1 | 10/2018 |
| DE | 102017107597 A1 | 10/2018 |
| DE | 102018127349 A1 | 5/2019 |
| DE | 102019105337 A1 | 8/2020 |
| DE | 102019105340 A1 | 8/2020 |
| DE | 102019105343 A1 | 8/2020 |
| DE | 102019105346 A1 | 8/2020 |
| DE | 102019105359 A1 | 8/2020 |
| DE | 102019105363 A1 | 8/2020 |
| DE | 102019105372 A1 | 8/2020 |
| DE | 102019105389 A1 | 8/2020 |
| DE | 102019134408 A1 | 8/2020 |
| DE | 102020100996 A1 | 8/2020 |
| DE | 102020101000 A1 | 8/2020 |
| DE | 102020101036 A1 | 8/2020 |
| DE | 102020101060 A1 | 8/2020 |
| DE | 102019009126 A1 | 11/2020 |
| DE | 102019009133 A1 | 11/2020 |
| DE | 102019009136 A1 | 11/2020 |
| DE | 102019009145 A1 | 11/2020 |
| DE | 102019121028 A1 | 11/2020 |
| DE | 102019121029 A1 | 11/2020 |
| DE | 102020101784 A1 | 11/2020 |
| DE | 102019117423 A1 | 12/2020 |
| DE | 202020106145 U1 | 12/2020 |
| DE | 102019120076 A1 | 1/2021 |
| DE | 102019120716 A1 | 1/2021 |
| DE | 102020004617 A1 | 1/2021 |
| DE | 102020109477 A1 | 1/2021 |
| DE | 102020119396 A1 | 1/2021 |
| DE | 102020119414 A1 | 1/2021 |
| DE | 102019121137 A1 | 2/2021 |
| DE | 102020000075 A1 | 2/2021 |
| DE | 102020125169 A1 | 4/2021 |
| DE | 102020125171 A1 | 4/2021 |
| DE | 102020125172 A1 | 4/2021 |
| DE | 102020125173 A1 | 4/2021 |
| DE | 102020125174 A1 | 4/2021 |
| DE | 102020125175 A1 | 4/2021 |
| DE | 102020125176 A1 | 4/2021 |
| DE | 102020125177 A1 | 4/2021 |
| DE | 102020125178 A1 | 4/2021 |
| DE | 102020125179 A1 | 4/2021 |
| DE | 102020125180 A1 | 4/2021 |
| DE | 102020125181 A1 | 4/2021 |
| DE | 102020125182 A1 | 4/2021 |
| DE | 102020125183 A1 | 4/2021 |
| DE | 102020125185 A1 | 4/2021 |
| DE | 102020125186 A1 | 4/2021 |
| DE | 102020125187 A1 | 4/2021 |
| DE | 102020125188 A1 | 4/2021 |
| DE | 102020125190 A1 | 4/2021 |
| DE | 102020125191 A1 | 4/2021 |
| DE | 102020125189 A1 | 5/2021 |
| DE | 102020129308 A1 | 5/2021 |
| DE | 102020129315 A1 | 5/2021 |
| DE | 102020129319 A1 | 5/2021 |
| DE | 102020129322 A1 | 5/2021 |
| DE | 102020129324 A1 | 5/2021 |
| DE | 102020129326 A1 | 5/2021 |
| DE | 102020129329 A1 | 5/2021 |
| DE | 102020129330 A1 | 5/2021 |
| DE | 102020129332 A1 | 5/2021 |
| DE | 102020129337 A1 | 5/2021 |
| DE | 102020129338 A1 | 5/2021 |
| DE | 102020129340 A1 | 5/2021 |
| DE | 102020129348 A1 | 5/2021 |
| DE | 102020129349 A1 | 5/2021 |
| DE | 102020129366 A1 | 5/2021 |
| DE | 102020129367 A1 | 5/2021 |
| DE | 102020129368 A1 | 5/2021 |
| DE | 102020129379 A1 | 5/2021 |
| DE | 202020106110 U1 | 5/2021 |
| WO | 2016083140 A1 | 6/2016 |
| WO | 2018169997 A1 | 9/2018 |
| WO | 2020089465 A2 | 5/2020 |
| WO | 2020239172 A1 | 12/2020 |
| WO | 2021013308 A1 | 1/2021 |
| WO | 2021089091 A1 | 5/2021 |

(56) References Cited

OTHER PUBLICATIONS

Bernard C. Kess and Patrick Meyrueis—Applied Digital Optics From Micro-Optics To Nanophotonics—ISBN 978-0-470-02263-4, 2009, United Kingdom.
Alexander M. Zaitsev—Optical Properties of Diamond—ISBN 978-3-642-08585-7, 2001, Germany.

* cited by examiner

NV CENTER-BASED MICROWAVE-FREE GALVANICALLY ISOLATED MAGNETOMETER

CROSS REFERENCE TO RELATED APPLICATIONS

This application is a US National Phase of the International Patent Application Number PCT/DE2021/100069, filed Jan. 25, 2021, which claims priority to German patent application DE 10 2020 102 311.1, filed Jan. 30, 2020, the contents of which are incorporated herein by reference in their entireties.

TECHNICAL FIELD

The disclosure is directed to a scalar magnetometer and its device parts and essential applications. The core of the scalar magnetometer is a quantum optical system. The quantum optical system typically comprises at least one quantum dot. In particular, the quantum dot may comprise one or more paramagnetic centers in one or more crystals and/or in particular at least one plurality of paramagnetic centers in one or more crystals and/or in particular one or more NV centers in one or more diamond crystals and/or in particular at least one plurality of NV centers in one or more diamond crystals and/or in particular one or more SiV centers in one or more diamond crystals and/or in particular one or more G centers in one or more silicon crystals. A part that distinguishes the disclosure presented herein from the prior art, among other features, is at least one circuit carrier (GPCB) that is part of the quantum optical system. The inventors propose that the quantum optical system comprises a circuit carrier (GPCB) made of an at least partially optically transparent material. According to the proposal, the quantum dot can interact with an optical radiation. According to the disclosure, the circuit carrier (GPCB) can then interact with the quantum dot in such a way that the circuit carrier (GPCB) acts as an optical functional element for at least part of the optical radiation that can interact or has interacted with the quantum dot. In the following, this radiation is the pump radiation (LB) and/or the fluorescence radiation (FL) and/or, if applicable, the compensation radiation (CL), whereby an interaction of the quantum dot with the compensation radiation (CL) is actually not desired.

INTRODUCTION AND OVERVIEW

A wide variety of applications uses magnetometers in a wide variety of places. A magnetometer in the sense of this document is a device for the measurement of the magnetic flux density B. The term is therefore explicitly not limited to the measurement of the earth's magnetic field.

The English edition of Wikipedia describes a magnetometer as a device that measures magnetization. In particular, magnetometers can determine the direction, the strength, the relative change of the magnetic field at a given spatial position. Measuring the magnetization of a magnetic material is an example of such an application.

Carl Friedrich Gauss invented the first magnetometer capable of measuring absolute magnetic field strength in 1833. Today, Hall probes are often used to measure magnetic fields.

Magnetometers are used to measure the earth's magnetic field in order to detect and measure magnetic anomalies for exploring the earth's interior. In aircraft, they are used to determine direction and to determine attitude. A military application is the detection of submarines and other submerged floating objects, as well as mine detection. Therefore, magnetometer technologies are considered military technologies.

Magnetometers can be used for metal detection and metal classification if the magnetometers can detect and process not only static signals but also dynamic signals. In that case, for example, the response of surrounding materials to a temporal jump in magnetic flux density B can be detected and spectrally analyzed.

BACKGROUND

At this point, we refer to the pending unpublished patent applications DE 10 2019 120 076.8, PCT/DE 2020/100 648, DE 10 2020 119 414.5, DE 10 2019 121 137.9, DE 10 2019 009 155.8, DE 10 2020 000 075.4, DE 10 2020 125 169.6, DE 10 2020 125 171.8, DE 10 2020 125 172.6, DE 10 2020 125 173.4, DE 10 2020 125 191.2, DE 10 2020 125 190.4, DE 10 2020 125 188.2, DE 10 2020 125 187.4, DE 10 2020 125 186.6, DE 10 2020 125 185.8, DE 10 2020 125 183.1, DE 10 2020 125 182.3, DE 10 2020 125 181.5, DE 10 2020 125179.3, DE 10 2020 125 180.7, DE 10 2020 125 178.5, DE 10 2020 125 177.7. DE 10 2020 125 176.9, DE 10 2020 125 174.2, DE 10 2020 125 175.0, PCT/DE 2020/100 827, DE 10 2020 125 189.0, DE 10 2020 129 308.9, DE 10 2020 129 315.1; DE 10 2020 129 319.4, DE 10 2020 129 322.4, DE 10 2020 129 324.0, DE 10 2020 129 326.7, DE 10 2020 129 329.1, DE 10 2020 129 330.5, DE 10 2020 129 332.1, DE 10 2020 129 337.2, DE 10 2020 129 338.0, DE 10 2020 129 340.2, DE 10 2020 129 348.8, DE 10 2020 129 349.6, DE 10 2020 129 366.6, DE 10 2020 129 367.4, DE 10 2020 129 368.2, DE 10 2020 129 379.8, PCT/DE 2020/100 953, DE 10 2019 117 423.6, DE 10 2019 120 716.9. DE 10 2019 117 423.6, DE 10 2020 004 617.7, DE 10 2020 109 477.9.

Furthermore, we refer to the pending published patent applications DE 10 2019 121 028 A1, DE 10 2019 009 126 A1, DE 10 2019 009 136 A1, DE 10 2019 009 145 A1, DE 10 2019 009 133 A1, WO 2020 239 172 A1 (PCT/DE 2020/100 430), DE 10 2019 121 029 A1, DE 10 2018 127 349 A1, WO 2020 089 465 A2 (PCT/EP 2019/079 992). The publication date of the last-mentioned group of documents is after the priority date 30 Jan. 2020 of the document DE 10 2020 102 311.1. The document presented here claims the priority date 30 Jan. 2020 of the document DE 10 2020 102 311.1.

In addition, we refer to the already granted German patent DE 10 2020 101 784 B3. The publication date of DE 10 2020 101 784 B3 is after the priority date of Jan. 30, 2020, of the document DE 10 2020 102 311.1. The document submitted here claims the priority date of Jan. 30, 2020, of the document DE 10 2020 102 311.1.

We also refer to DE 10 2015 016 021 A1, published before the priority date of Jan. 30. 2020, of this document.

We also refer to the German utility models DE 20 2020 106 110 U1 and DE 20 2020 106 145 U1. The publication dates of the German utility models DE 20 2020 106 110 U1 and DE 20 2020 106 145 U1 are after the priority date of Jan. 30, 2020, of the document DE 10 2020 102 311.1. The document submitted here claims the priority date of Jan. 30, 2020, of the document DE 10 2020 102 311.1.

We use the technical teachings of the applications and document indicated above in this document and assume them to be known. The combination of the technical teachings disclosed therein with the technical teaching presented herein is part of the disclosure and claim to the extent permitted by the national law in which the application is nationalized.

Various magnetometers based on NV centers are known from the patent literature. For example, the documents WO 2016 083 140 A1 and WO 2018 169 997 A1 describe an AFM magnetometer that is suitable, for example, for the investigation of microelectronic circuits. The documents U.S. Pat. No. 9,541,610 B2, U.S. Pat. No. 9,551,763 B1 and U.S. Pat. No. 10,408,889 B2 describe a magnetometer having a spatial sensitivity.

The documents U.S. Pat. No. 9,910,105 B2, U.S. Pat. No. 10,006,973 B2, U.S. Pat. No. 10,007,885 B1, U.S. Pat. No. 10,012,704 B2, U.S. Pat. No. 10,088,452 B2, U.S. Pat. No. 10,120,039 B2, U.S. Pat. No. 10,168,393 B2, U.S. Pat. No. 10,241,158 B2, U.S. Pat. No. 10,277,208 B2, U.S. Pat. No. 10,345,396 B2, U.S. Pat. No. 10,359,479 B2, U.S. Pat. No. 10,408,890 B2, U.S. Pat. No. 8,547,090 B2, U.S. Pat. No. 8,947,080 B2, U.S. Pat. No. 9,222,887 B2, U.S. Pat. No. 9,557,391 B2, U.S. Pat. No. 9,599,562 B2, U.S. Pat. No. 9,632,045 B2, U.S. Pat. No. 9,638,821 B2, U.S. Pat. No. 9,658,301 B2, U.S. Pat. No. 9,664,767 B2, U.S. Pat. No. 9,720,055 B1, U.S. Pat. No. 9,817,081 B2, U.S. Pat. No. 9,823,314 B2, U.S. Pat. No. 9,829,545 B2 and U.S. Pat. No. 9,910,104 B2 describe NV center-based magnetometers and details thereof.

All these magnetometers use microwaves for spin manipulation.

SUMMARY

The proposal is therefore based on the task of creating a solution that does not have the above disadvantages of the prior art and has further advantages. Devices and methods according to the claims solve this task. Other aspects of the design and manufacture of the magnetometer are the subject of subsidiary claims.

An idea of the magnetometer presented here is to couple very many paramagnetic centers, here NV centers in diamond, to use these paramagnetic centers as a radiation source for microwave radiation by nonlinear coupling effects. This idea can be applied more generally to quantum dots. Such quantum dots may comprise individual paramagnetic centers. The quantum dots may also comprise a plurality of quantum dots for the purposes of this paper. Preferably, a quantum dot comprises a local plurality of paramagnetic centers that are close enough to each other to couple. When reference is made herein to a plurality of paramagnetic centers, this preferably refers to localized clusters, i.e., density increases of density paramagnetic centers. In contrast to the technical teaching of the documents already cited above, the technical teaching of the document presented here chooses a different construction and connection technique, which allows some very efficient applications.

Various paramagnetic centers are also known from the prior art, which appear suitable from today's point of view. In addition to the NV center, these are, for example, the SiV center in diamond and/or the ST1 center in diamond and/or the L2 center in diamond. Whenever NV center is mentioned in this document, the term NV center in the description and stressing includes these centers in case of doubt, since their analogous application should be obvious to the person skilled in the art.

We refer here explicitly to the book A. M. Zaitsev, "Optical Properties of Diamond: A Data Handbook" Springer Berlin Heidelberg; Edition: Softcover reprint of hardcover 1st ed. 2001 (Feb. 19, 2010), which names a number of other color centers. When we write here of NV centers or the above-named particularly suitable centers, the expert should read along the centers named in this book. We have not investigated a suitability of these centers for the preparation of this work. However, it is clear to the expert that among the numerous centers there will be others which will have similar or perhaps even better characteristics than the NV center. In this respect, the centers mentioned there are included in the claims and description if they are suitable.

We also refer to the work B. Burchard "Elektronische und optoelektronische Bauelemente und Bauelementstrukturen auf Diamantbasis". Hagen 1994 and to DE 4 322 830 A1 regarding the use of color centers in electronic components.

DESCRIPTION

Magnetometer

The disclosure relates to a magnetometer comprising a sensor element (NVD), a circuit carrier (GPCB), a pump radiation source (PLED), a radiation receiver (PD) and comprising evaluation means (ADC, IF). The pump radiation source (PLED) emits pump radiation (LB) when electrically energized using an electrical pump current ($I_{pump}$) through a pump current source (I0). The sensor element (NVD) comprises at least one paramagnetic center. Preferably, the sensor element (NVD) is a diamond or a plurality of diamonds having one or more NV centers or SiV centers or functionally equivalent centers as paramagnetic centers. The paramagnetic center of the sensor element (NVD) typically emits fluorescence radiation (FL) when irradiated with pump radiation (LB). In the case of an NV center in diamond as a paramagnetic center, the pump wavelength of the pump radiation (LB) should be in the wavelength range of 500 to 700 nm. Especially preferred is a pump radiation (LB) having a pump wavelength of 532 nm for the excitation of NV centers in diamond. Preferably, lasers and/or LEDs (light emitting diodes) form the pump radiation source (PLED). A transmission signal (S5), typically imposed on the electrical pump current ($I_{pump}$), can technically very easily modulate the radiation output of lasers and/or LEDs (light emitting diodes). Thus, this transmission signal (S5) is then typically impressed on the radiation power output of the pump radiation source (PLED) and thus on the temporal course of the intensity of the pump radiation (LB).

The fluorescence radiation (FL) of the paramagnetic center typically depends on the value of the magnetic flux density B or the value of other physical parameters at the location of the paramagnetic center. Such other physical parameters may be, for example, the temperature $\vartheta$, the acceleration a, the velocity v, the electric flux density D, the electric field strength E, the magnetic field strength H, the gravitational field strength g, the rotational velocity w, the rotational acceleration «, the distance r of the location of the paramagnetic center from the axis of rotation, etc. A typical sensor element (NVD) proposed herein as a whole preferably comprises a plurality of crystals, each preferably comprising one or more paramagnetic centers and/or each comprising one or more clusters of paramagnetic centers, hereinafter also paraphrased as "each comprising at least a plurality of paramagnetic centers". Preferably, the orientation of such crystals is stochastically distributed. However, use of oriented crystal platelets is also possible. Preferably, crystals of such crystals have one or more paramagnetic centers. Preferably, the crystals are a plurality of crystals. Nevertheless, the sensor element (NVD) may also use nanocrystals. Preferably, the crystals are not nanocrystals to avoid surface effects. Preferably, the crystals have a size larger than 1 µm, better larger than 2 µm, better larger than 5 µm, better larger than 10 µm, better larger than 20 µm, better larger than 50 µm, better larger than 100 µm, better larger than 200 µm, better larger than 500 µm.

Preferably, it is a plurality of diamond crystals comprising NV centers. Preferably, these are not CVD diamonds, which are often contaminated with hydrogen, but HPT-synthesized diamonds. Preferably, particle bombardment, in particular using electrons and/or protons, and subsequent heat treatment generates the NV centers and possibly also the other functionally equivalent centers in the diamonds. The disclosure refers to utility model DE 20 2020 106 110 U1 in this context. In particular, the particle bombardment preferably completely irradiates the crystals. The crystals then show a characteristic luminescence spectrum of radiation damage. This luminescence spectrum, in particular the electro- or photoluminescence spectrum, is an identifying feature for the use of such diamonds.

The radiation receiver (PD) is preferably a photodiode or a functionally equivalent radiation receiver, which is preferably sensitive to the fluorescence radiation (FL) of the paramagnetic center and converts the intensity of the fluorescence radiation (FL) into a receiver output signal (S0).

The evaluation means (ADC, IF) are preferably suitable and intended to detect and store and/or transmit the value of the receiver output signal (S0) as a measured value. These evaluation means (ADC, IF) may include, for example, amplifiers (V1, V2), filters, controllers, analog-to-digital converters (ADC), signal processors comprising memories and programs, data interfaces (IF), data buses, etc.

The proposed device is preferably characterized in that, in particular, one or both of the following conditions are met.

Condition 1

According to condition 1, the material of the circuit carrier (GPCB) is transparent for the pump radiation (LB) in the radiation path between the pump radiation source (PLED) and the sensor element (NVD). Furthermore, according to condition 1, the pump radiation (LB) from the pump radiation source (PLED) also preferentially passes through this radiation path, so that this property also becomes effective. Such a circuit carrier (GPCB) thus enables a particularly compact design, which distinguishes the technical teaching presented here from the prior art.

Condition 2

According to condition 2, the material of the circuit carrier (GPCB) is transparent for the fluorescence radiation (FL) in the radiation path between the sensor element (NVD) and the radiation receiver (PD). Furthermore, the fluorescence radiation (FL) from the paramagnetic center of the sensor element (NVD) passes through this radiation path, so this property is also effective. Such a circuit carrier (GPCB) thus also enables a particularly compact design, which also distinguishes the technical teaching presented here from the prior art.

Preferably, both conditions 1 and 2 are fulfilled together.

Preferably, at least one or more or all the components sensor element (NVD) and/or pump radiation source (PLED) and/or radiation receiver (PD) and/or evaluation means (ADC, IF) and/or microintegrated circuits (IC), if applicable, are attached to the circuit carrier (GPCB). This attachment can be done, for example, by bonding and/or soldering. In the case of bonding the contacts, the manufacturing device electrically, mechanically and possibly thermally connects the contacts of the pump radiation source (PLED) and/or radiation receiver (PD) and/or the evaluation means (ADC, IF) and/or the microintegrated circuits (IC), if applicable, to conductor tracks applied to the circuit carrier (GPCB) by electrically conductive bonding. The circuit carrier (GPCB) thus fulfills here by a use corresponding to a FR4 board and by the simultaneous use as optical functional element for a quantum optical system together with the use of paramagnetic centers at the same time the function of a board and an optical functional element. This double use in a quantum technological system is new compared to the prior art.

In a first variant of the magnetometer, the circuit carrier (GPCB) preferably comprises at least partially glass or another material transparent for radiation having the pump radiation wavelength ($\lambda_{pmp}$) of the pump radiation (LB) and/or for radiation having the fluorescence radiation wavelength ($\lambda_{fl}$) of the fluorescence radiation (FL). For example, this can also be acrylic glass or a similar material. If the material is not heat-resistant, bonding with an electrically conductive adhesive can also make the electrical connections as described, if necessary.

In an exemplary third variant of the magnetometer, the circuit carrier (GPCB) comprises at least one electrical line and/or another electrical functional component such as, for example, a resistor and/or a capacitor and/or an inductor and/or a fuse and/or a contact in thick-film technology. Preferably, the manufacturing of the circuit carrier (GPCB) comprises, for example, printing a glass body serving as the circuit carrier (GPCB) with a thick film paste suitable for this glass body. If necessary, a full-surface or partial-surface surface preparation, for example by roughening by means of laser beams and/or etching and/or coating with an adhesive, prepares the surface of the glass body of the circuit carrier (GPCB) at its surface at the corresponding points of the surface. The printing is preferably done by means of stencils or screen printing. After baking the thick film paste, the device can use the circuit carrier (GPCB) like a printed circuit board. Other methods of applying the thick film paste are also possible.

Furthermore, the circuit carrier (GPCB) may alternatively or additionally comprise at least one or more electrical leads and/or one or more other electrical functional components such as resistors and/or capacitors and/or inductors and/or fuses and/or contacts and/or diodes and/or transistors in thin film.

In a fourth exemplary variant of the proposal, solderings and/or bondings, in particular electrically and/or thermally conductive bondings, preferably attach and/or connect at least one or more or all of the components sensor element (NVD) and/or pump radiation source (PLED) and/or radiation receiver (PD) and/or evaluation means (ADC, IF) to a line and/or to a contact. These connections and/or attachments are preferably electrically and/or thermally conductive. Thus, in case of electrical and/or thermal conductivity of these connections, these attachments connect the components electrically and/or thermally to the respective line and/or contact.

In a fifth exemplary variant, the magnetometer preferably comprises an optical functional element that changes the beam path of at least part of the pump radiation (LB) and/or the fluorescence radiation (FL). This is particularly advantageous because, for example, suitable optical functional elements such as mirrors (ML) and lenses can, for example, increase the pump power density of the pump radiation (LB) at the locations of the paramagnetic centers (NV centers) used for the measurement and because, as a result, these can increase the coupling probability between the paramagnetic centers, resulting in increased sensitivity.

In a fifth exemplary variant, it is therefore particularly advantageous if in particular this optical functional element is a mirror surface (ML) and/or a lens and/or an optical or photonic grating and/or an aperture and/or a wave sump and/or a prism and/or a beam splitter and/or an optical waveguide.

In a sixth exemplary variant of the magnetometer, the manufacturing device not shown in the figures applies, for example, an optical waveguide (LWL) to the circuit carrier (GPCB) using thick-film technology. (More on this later.) This has the advantage that the printing device can produce a plurality of optical waveguides (LWL) in one printing operation. This makes it easy to fabricate a magnetometer array based on an array of optical waveguides (LWL) and associated optical systems.

Preferably, the optical waveguide (OWG) may locally comprise crystals comprising one or more paramagnetic centers. Very preferably, in the case of an optical waveguide (LWL), these are micro- or nanocrystals. The crystals comprising the paramagnetic centers are preferably micro- and nanocrystals and in particular preferably diamond crystals comprising NV centers. Preferably, the average size of the crystals is adapted to the pump radiation wavelength ($\lambda_{pmp}$) of the pump radiation (LB) and/or the fluorescence radiation wavelength ($\lambda_{fl}$) of the fluorescence radiation (FL). Preferably, the average size of the crystals along a direction of the crystals deviates from an integer multiple of half the pump radiation wavelength ($\lambda_{pmp}$) of the pump radiation (LB) and/or half the fluorescence radiation wavelength ($\lambda_{fl}$) of the fluorescence radiation (FL) by not more than 25%, more preferably not more than 10%, even more preferably not more than 5%. The basis of this assessment is preferably a random sample of 100 crystals, which can be measured by means of a microscope. Particularly advantageous are diamond crystals comprising a very high density of NV centers, which can then couple with each other and thus give a particularly high magnetic field sensitivity. The inventors refer to utility model DE 20 2020 106 110 U1 in this context.

It is conceivable that the optical waveguide (LWL) for the fluorescence radiation (FL) is a cavity waveguide preferably filled with vacuum or air or gas or some other filling material. The filling material should preferably show no fluorescence when irradiated using radiation having the pump radiation wavelength ($\lambda_{pmp}$) and especially no fluorescence radiation when having the fluorescence radiation wavelength ($\lambda_{fl}$). The cladding of this cavity waveguide can be made of a metal or a dielectric having a higher refractive index than the filling material of the cavity waveguide. Therefore, the cladding of the cavity waveguide reflects the fluorescence radiation (FL) of the paramagnetic center(s) of the sensor element (NVD) guided in it back into the interior space, i.e., the cavity inside the cavity waveguide. The paper presented here proposes to make the cladding of the cavity waveguide used as an optical waveguide (LWL) for the fluorescence radiation (FL) of the paramagnetic centers from a material optically transparent to radiation having the pump radiation wavelength ($\lambda_{pmp}$). The cladding of the hollow waveguide can manage the transport of the pump radiation (LB) to the sensor element (NVD), while the interior of the hollow waveguide manages the return transport of the fluorescence radiation (FL) to the radiation receiver (PD), for example. The device is then a quantum optical system, in particular a quantum sensor or a quantum computer, comprising at least one paramagnetic, but preferably comprising a plurality of paramagnetic centers, which may possibly be coupled with each other, i.e., in particular, entangled. The quantum optical system has a waveguide as optical waveguide (LWL). Thereby, a pump radiation source (PLED) transmits pump radiation (LB) to a paramagnetic center and/or to a plurality of paramagnetic centers. The hollow waveguide transports the fluorescence radiation (FL) of the paramagnetic center and/or the paramagnetic centers to a radiation receiver (PD) in the cavity. Preferably, the pump radiation source (PLED) transmits the pump radiation (LB) to the paramagnetic center and/or to the plurality of paramagnetic centers via the cladding of the hollow waveguide, which is, for example, a glass tube, which is here a hollow optical waveguide.

Typically, when NV centers in diamond are used as paramagnetic centers, the fluorescence radiation wavelength ($\lambda fl$) of the fluorescence radiation (FL) of the NV centers is such that they appear red. If the device uses compensation radiation sources (CLED), their compensation wavelength is selected in a possible variant such that it is in the infrared range, for example. By this, their compensation radiation (CL) cannot excite the fluorescence of the NV center and thus cannot excite fluorescence radiation (FL) of the NV center. In contrast, the pump radiation wavelength ($\lambda_{pmp}$) of the pump radiation (LB) is usually chosen to be smaller than the fluorescence radiation wavelength ($\lambda fl$) of the fluorescence radiation (FL), especially when NV centers are used as paramagnetic centers. This is done, for example, by the pump radiation source (PLED) of the pump radiation (LB) being preferably a green, blue, or ultraviolet LED in the case of NV centers in diamond as paramagnetic centers. In the case of NV centers in diamond or in diamonds, a laser diode of the company Osram of the type PLT5 520B is suitable, for example, as a pump radiation source (PLED) having 520 nm pump radiation wavelength ($\lambda_{pmp}$). The pump radiation (LB) of the pump radiation source (PLED) should have a pump radiation wavelength ($\lambda_{pmp}$) in a wavelength range of 400 nm to 700 nm wavelength and/or better 450 nm to 650 nm and/or better 500 nm to 550 nm and/or better 515 nm to 540 nm when using NV centers. Through this, the pump radiation (LB) can excite the paramagnetic center, which is preferably a NV center in diamond, to a higher energy level. In working out the disclosure, the inventors realized that, unlike the prior art, microwave radiation is not necessary for the paramagnetic center thus excited to a high level to drop to an intermediate level. Rather, it is sufficient if the sensor element (NVD), for example the diamond crystal, has a sufficiently high density of paramagnetic centers, NV centers. The inventors refer to utility model DE 20 2020 106 110 U1 in this context. Preferably, an exemplary diamond crystal has a NV center density of more than 500 ppm and/or of more than 200 ppm and/or of more than 100 ppm and/or of more than 50 ppm and/or of more than 20 ppm and/or of more than 10 ppm and/or of more than 5 ppm and/or of more than 2 ppm and/or of more than 1 ppm and/or of more than 0.1 ppm and/or of more than 0.01 ppm with respect to the number of carbon atoms per unit volume. The higher this density, the better. Densities of >200 ppm are quite particularly preferred. Of course, the sensor element (NVD) can also use lower concentrations such as more than 0.01 ppm and/or more than 10-3 ppm and/or more than $10^{-4}$ ppm and/or more than $10^{-5}$ ppm and/or more than $10^{-6}$ ppm. However, the fluorescence signal of the intensity of the fluorescence radiation (FL) then weakens more and more, so that weakening fluorescence signal of the fluorescence radiation (FL) then makes more and more demands on the electronic post-processing and worsens the signal-to-noise ratio. The density of the paramagnetic centers need not reach the highest possible density everywhere in the sensor element (NVD), i.e., the exemplary diamond. In working out the disclosure, the inventors realized that it is rather sufficient if the density of the paramagnetic centers locally exceeds this density. Preferably, then, the device uses, at least locally in a region of the sensor element (NVD) illuminated by the pump radiation (LB), more than 100, better still more than 1000, better still more than $10^4$, better still more than $10^5$, better still more than $10^6$, better still more than $10^7$ paramagnetic centers for the operation of the sensor system. Then, by spontaneous emission, some of the paramagnetic centers always spontaneously adopt a lower energy intermediate state after a transition time ta from the excited state. The prior art technical teachings achieve this only by using microwave radiation through stimulated emission. In working out the disclosure, the inventors realized that the high density of paramagnetic centers—a high density of NV centers when diamond is used—eliminates the need for device parts to generate and introduce the microwave radiation, thus saving money. Nevertheless, the use of microwave antennas and transmitters is useful when the pump radiation (LB) is to additionally modulate the fluorescence radiation (FL) of the paramagnetic centers or when the device is to include lower density diamonds. The omission of microwave radiation makes such sensor systems, as the one presented here, useful only for use in biological and especially medical applications. Otherwise, radiation exposure to tissue occurs, which massively limits the use of sensors using microwave excitation of the excited paramagnetic centers to an intermediate level for such purposes. The absence of microwave radiation also avoids thermal problems.

During the elaboration of the disclosure, the inventors realized that the absorption of the paramagnetic centers can weaken the fluorescence radiation (FL). Therefore, by means of its corresponding device parts, the device preferably detects and measures the intensity of the fluorescence radiation (FL) from the side of the sensor element (NVD) from which the pump radiation (LB) is also incident. I.e., the pump radiation (LB) enters the sensor element (NVD) and thus the crystal comprising the paramagnetic center via a surface of the sensor element (NVD) and the fluorescence radiation (FL) of the paramagnetic center preferably leaves the sensor element (NVD) again via this preferably same surface. This beam guidance typically doubles the signal-to-noise ratio compared to a transmission measurement, in which the fluorescence radiation (FL) of the paramagnetic center leaves the sensor element (NVD) again via another surface of the sensor element (NVD).

In another exemplary variant, the magnetometer comprises a pump radiation source (PLED) that emits pump radiation (LB), a sensor element (NVD) that converts the pump radiation (LB) of the pump radiation source (PLED) into an intensity of fluorescence radiation (FL) as a function of one of the said physical quantities—in this case the magnetic flux density B, a compensation radiation source (CLED) and a first amplifier (V1). The first amplifier (V1) amplifies the receiver output signal (S0) of the radiation receiver (PD) and provides it with an offset, which can be 0 if necessary. In this variant, the first amplifier (V1) directly generates a compensation transmission signal (S7) as its amplifier output signal (otherwise S4). The compensation radiation source (CLED) emits a compensation radiation (CL) in response to the compensation transmission signal (S7). The compensation radiation source (CLED) thereby radiates this compensation radiation (CL) into the radiation receiver (PD). The compensation radiation (CL) and the fluorescence radiation (FL) of the paramagnetic centers, in particular the NV centers, of the sensor element (NVD) superimpose in the radiation receiver (PD) in a summing and/or multiplying manner. Depending on the value of this superposition, the radiation receiver (PD) generates a receiver output signal (S0), which then depends on the value of this superposition. The gain of the first amplifier (V1) and its offset are set so that the control loop is stable, and the control loop regulates the value of the receiver output signal (S0) in the steady state to almost an equal value except for the control error of the P controller.

The circuit carrier (GPCB) preferably comprises glass or another material which is preferably also transparent for radiation having the compensation radiation wavelength ($\lambda_{KS}$) of the compensation radiation (CL). This has the advantage that the optically transparent circuit carrier (GPCB) galvanically separates the sensor element (NVD) from the pump radiation source (PLED) and the radiation receiver (PD) as well as the remaining electronics. Thus, the device can measure magnetic fields while the location of the device's sensor element (NVD) is at a very high electrical potential relative to the electrical potential of the device's evaluation circuitry (IC).

Preferably, in the magnetometer, at least one or more or all the further components first amplifier (V1) and/or compensation radiation source (CLED) are attached to and/or electrically connected to a lead and/or to a contact by means of soldering and/or bonding.

Preferably, the magnetometer comprises an optical functional element that alters the beam path of at least a portion of the compensating radiation (CL). In particular, this optical functional element may be a mirror surface (ML) or another of the functional elements mentioned in this paper.

To reduce the 1/f noise, the pump current source (I0) modulates the electrical pump current ($I_{pump}$) of the pump radiation source (PLED) using a transmission signal (S5) having a modulation bandwidth typically different from 0 Hz. Through this, the pump radiation (LB) is then also typically modulated in intensity using this modulation bandwidth of the transmission signal (S5). Preferably, the first amplifier (V1) of the magnetometer amplifies the then also modulated receiver output signal (S0) of the radiation receiver (PD) to a demodulated signal (S4). Preferably, the first amplifier (V1) is a synchronous demodulator which uses the transmission signal (S5) or a signal derived from the transmission signal (S5) to demodulate the demodulated signal (S4) from the modulated receiver output signal (S0). Preferably, the magnetometer comprises a second amplifier (V2) which processes the demodulated signal (S4), into a compensation transmission signal (S7). In this case, the second amplifier (V2) is now preferably a modulator that uses the transmission signal (S5) or a signal derived from the transmission signal (S5) to modulate the demodulated signal (S4) into the compensation transmission signal (S7) with a second gain and a second offset. The modulation of the compensation transmission signal (S7) by the second amplifier (V2) is typically complementary to the modulation of the transmission signal (S5) of the pump radiation (LB). Suitable gain and sign selection in the control loop adjusts the modulation of the transmission signal (S5) such that the control loop adjusts the receiver output signal (S0) to a substantially constant signal as the receiver output signal (S0).

Preferably, the magnetometer comprises paramagnetic centers comprising at least one NV center in diamond. Preferably, the sensor element (NVD) then comprises diamond.

Preferably, the density of the NV centers at least locally in a region of the sensor element (NVD) irradiated with the pump radiation (LB) is greater than 500 ppm and/or greater than 200 ppm and/or greater than 100 ppm and/or greater than 50 ppm and/or greater than 20 ppm and/or greater than 10 ppm and/or greater than 5 ppm and/or greater than 2 ppm and/or greater than 1 ppm and/or greater than 0.1 ppm and/or greater than 0.01 ppm relative to the number of carbon atoms per unit volume. The higher this density, the better. Quite particularly preferred are densities of >200 ppm, as described above. Preferably, the NV center density is greater than 0.0001 ppm and/or better greater than 0.0002 ppm and/or better greater than 0.0005 ppm and/or better greater than 0.001 ppm and/or better greater than 0.002 ppm and/or better greater than 0.005 ppm and/or better greater than 0.01 ppm and/or better than 0.02 ppm and/or better than 0.05 ppm and/or better than 0.1 ppm and/or better than 0.2 ppm and/or better than 0.5 ppm based on the number of carbon atoms per unit volume, wherein in particular a density of >200 ppm is preferred.

In an important variation, the sensor element comprises a plurality of crystals, in particular micro- and/or nanocrystals. Preferably, the crystals are a plurality of micro- and/or nanodiamonds. Preferably, in this variation, at least two, more preferably a plurality, of these crystals each comprise at least one paramagnetic center, as previously described. These can then typically couple with each other. The density of the paramagnetic centers should thereby be so high that the paramagnetic centers of the sensor element (NVD) mutually influence each other in such a way that, for example, the fluorescence radiation (FL) decreases in its intensity with an increasing amount of the magnetic flux density B in at least one range of the amount of the magnetic flux density B and/or that, for example, the fluorescence radiation (FL) increases in its intensity with an increasing amount of the magnetic flux density B in at least one range of the amount of the magnetic flux density B. This document understands intensity to mean the amplitude of the transmitted energy of a radiation.

To separate the fluorescence radiation (FL) from the pump radiation (LB) before impinging on the radiation receiver (PD), it is advantageous if the magnetometer comprises an optical filter (F1) that is transparent to radiation having the fluorescence radiation wavelength (Mf) of the fluorescence radiation (FL) and that is not transparent to radiation having the pump radiation wavelength ($\lambda_{pmp}$) of the pump radiation (LB). A mirror or a function-equivalent optical function element can also represent this function. An example is the use of a Fresnel lens. The prerequisite is that there is no alternative optical path for pump radiation (LB) from the pump radiation source (PLED) to the radiation receiver (PD) that bypasses the optical filter (F1). Apertures can ensure this if necessary. The optical filter (F1) ensures that the pump radiation (LB) cannot reach the radiation receiver (PD) or can only reach it in a sufficiently attenuated manner and that the fluorescence radiation (FL) can reach the radiation receiver (PD) in a sufficiently unattenuated manner. Preferably, the magnetometer comprises at least one functional element to increase the density of the intensity of the irradiation of at least a part of the sensor element (NVD), in particular with pump radiation (LB). This functional element can be, for example, a lise or a curved mirror that focuses the pump radiation (LB) on a region of the sensor element (NVD). The circuit carrier (GPCB) preferably has a dielectric strength of more than 100 V and/or better of more than 200 V and/or better of more than 500 V and/or better of more than 1 kV and/or better of more than 2 kV and/or better of more than 5 kV and/or better of more than 10 kV and/or better than 20 kV and/or better than 50 kV and/or better than 100 kV and/or better than 200 kV and/or better than 500 kV and/or better than 1 MV and/or better than 2 MV and/or better than 5 MV.

This dielectric strength refers to a voltage between the potential of a terminal of the pump radiation source (PLED) on one side of the circuit carrier (GPCB) and another point on the surface of the other side of the circuit carrier (GPCB) and/or to a voltage between the potential of a terminal of the compensation radiation source (CLED) on one side of the circuit carrier (GPCB) and another point on the surface of the other side of the circuit carrier (GPCB) and/or to a voltage between the potential of a terminal of the microintegrated circuit (IC) on one side of the circuit carrier (GPCB) and another point on the surface of the other side of the circuit carrier (GPCB) and/or to a voltage between the potential of a terminal of the radiation receiver (PD) on one side of the circuit carrier (GPCB) and another point on the surface of the other side of the circuit carrier (GPCB).

Module

As can be seen from the preceding text, the magnetometer includes a special module which was created in the course of working out the disclosure as a central part of the magnetometer. This module in itself is also claimed. The reason is that an alternative use of the module is possible.

This is a module, in particular for use in a magnetometer, as previously described. The module typically comprises a sensor element (NVD) and a circuit carrier (GPCB). The sensor element (NVD) comprises at least one paramagnetic center. Preferably, this is again an NV center in a diamond. As will be discussed below, multiple NV centers in high density are particularly preferred. The paramagnetic center of the sensor element (NVD) can emit fluorescence radiation (FL) having a fluorescence radiation wavelength ($\lambda_{fl}$) when irradiated with pump radiation (LB) having a pump radiation wavelength ($\lambda_{pmp}$). Typically, this emission depends on a physical quantity, which may be, for example, one of the quantities described above. For example, the paramagnetic center may be a NV center in diamond. For example, the physical quantity may be the magnitude of the magnetic flux density B. In that case, the intensity of the fluorescence radiation (FL) then depends on the value of the magnetic flux density B at the location of the paramagnetic center and the sensor element (NVD) then has one NV center or a plurality of NV centers or a plurality of NV centers as well as diamond. This paper understands a plurality of paramagnetic centers to mean, among other things, a cluster, i.e., a local collection and/or density increase of paramagnetic centers. When micro- and nano-crystals are used, they may be embedded in an optically transparent embedding material, for example in the circuit carrier (GPCB) itself. The material of the circuit carrier (GPCB) may be, for example, glass or a functionally equivalent material, such as acrylic glass. Preferably, the embedding material is a material that is as similar as possible to the material of the circuit carrier (GPCB). Preferably, the embedding material has substantially the same refractive index as the material of the circuit carrier (GPCB). Preferably, in the case of a circuit carrier (GPCB) made of glass, the embedding material is a glass powder mixed with crystals, in particular diamond crystals, having the paramagnetic centers, for example said NV centers. The processing process can bring the embedding material together with the crystals during this processing process, for example before solidification, still in the state of a paste, into a special shape by injection molding or the like. Preferably, the material of the circuit carrier (GPCB) is now transparent to the pump radiation wavelength ($\lambda_{pmp}$) of the pump radiation (LB) and/or the material of the circuit carrier (GPCB) is transparent per se. Preferably, electrical leads are attached to the circuit carrier (GPCB), which are preferably mechanically connected to it. The circuit carrier (GPCB) thus preferably has one or more or a plurality of electrical leads. In order to maximize the coupling among the parametric centers, for example among the NV centers, the density of these centers should be very high, at least locally, in the region of the irradiation of the pump radiation (LB). In the case of NV centers in diamond as a paramagnetic center, the density of NV centers should therefore be greater than 500 ppm and/or greater than 200 ppm and/or greater than 100 ppm and/or greater than 50 ppm and/or greater than 20 ppm and/or greater than 10 ppm and/or greater than 5 ppm and/or greater than 2 ppm and/or greater than 1 ppm and/or greater than 0.1 ppm and/or greater than 0.01 ppm in terms of the number of carbon atoms per unit volume in this local area. The higher this density is, the better. Quite particularly preferred are densities of >200 ppm, as described above. Preferably, the NV center density is greater than 0.0001 ppm and/or better greater than 0.0002 ppm and/or better greater than 0.0005 ppm and/or better greater than 0.001 ppm and/or better greater than 0.002 ppm and/or better greater than 0.005 ppm and/or better greater than 0.01 ppm and/or better greater than 0.02 ppm and/or better greater than 0.05 ppm and/or better greater than 0.1 ppm and/or better greater than 0.2 ppm and/or better greater than 0.5 ppm with respect to the number of carbon atoms per volume unit in said local area, wherein in particular a density of >200 ppm in the local area is preferred. Larger densities are still much better because they improve contrast and thus improve the signal-to-noise ratio. Lower densities not only attenuate the signal. They also weaken the coupling between the NV centers, again reducing the contrast between the fluorescence radiation (FL) intensity at 10 mT and the fluorescence radiation (FL) intensity at more than 50 mT in the case of NV centers as paramagnetic centers. Higher densities, on the other hand, strengthen the signal. They also strengthen the coupling between NV centers, again increasing the contrast between the fluorescence radiation (FL) intensity at 10 mT and the fluorescence radiation (FL) intensity at more than 50 mT. As described earlier, preferably the sensor element (NVD) of the module should comprise multiple crystals, in particular nanocrystals, comprising at least two of these crystals each comprising at least one paramagnetic center. Preferably, the sensor element (NVD) should comprise a plurality of paramagnetic centers. In this context, the density of the paramagnetic centers should be sufficiently high that the paramagnetic centers mutually influence each other such that the fluorescence radiation (FL) decreases in its intensity in at least one value range of the magnitude of the magnetic flux density B with an increasing magnitude of the magnetic flux density B and/or that the fluorescence radiation (FL) increases in its intensity in at least one value range of the magnitude of the magnetic flux density B with an increasing magnitude of the magnetic flux density B.

Preferably, the circuit carrier (GPCB) comprises optical functional elements. These may be lenses, apertures, gratings, digital optical functional elements, diffractive optical functional elements, photonic crystals, mirrors, beam splitters, optical waveguides, wave couplers and the like. In particular, one or some of these optical functional elements may be made in digital and/or diffractive optics. It is particularly advantageous if the fabrication device fabricates these optical functional elements by thick film printing of a glass frit. Regarding the possibilities of digital optics, reference should be made to the books by Bernard C. Kress and Patrick Meyrueis "Applied Digital Optics: From Micro-optics to Nanophotonics: Micro-Optics, Optical MEMS and Nanophotonics" Wiley; edition: 1st (Oct. 27, 2009) and Bernhard Kress and Patrick Meyrueis "Digital Diffractive Optics" Wiley; (2000). The combination of the technical teachings presented there with the technical teachings presented here is fully encompassing part of the document presented here.

Preferably, the leads of the circuit carrier (GPCB) produced in a thick-film process are electrically connected to at least some terminals of one or more electronic and/or electrical components by soldering and/or electrically conductive bonding. In this context, electronic components thus attached to the circuit carrier (GPCB) may be opto-electronic components, in particular lasers, LEDs and photodetectors, etc., which are preferably optically coupled to the circuit carrier (GPCB). Such an optical coupling is also present in the sense of this document if optical functional elements of the circuit carrier (GPCB) or optical functional elements that are mechanically connected to the circuit carrier (GPCB) are coupled to these opto-electronic components. For example, they may be optical waveguides (LWL) manufactured using thick film technology or other optical functional elements mentioned in this paper. Preferably, the fabrication device prints these optical functional elements on the circuit carrier (GPCB) using thick film technology. The application of suitable layers and structures is also possible via other processes, for example by means of bonding of these layers. Preferably, the layers are pre-structured in this case. If necessary, the manufacturing device can use a two-layer film, for example. The production device not shown in the figures structures a first layer. The second layer is unstructured, for example, and serves only for mechanical support. After applying the first layer to the circuit carrier blank, the manufacturing device removes the second layer. Only the first layer remains on the circuit carrier blank.

Preferably, the one or more electronic components is an opto-electronic component that is optically coupled to one or more paramagnetic centers of the sensor element (NVD) via the circuit carrier (GPCB), for example in the manner described above. This can mean that through this optical coupling the opto-electronic component can irradiate the paramagnetic center of the sensor element (NVD) and/or that the paramagnetic center of the sensor element (NVD) can irradiate the opto-electronic component.

Current Sensor

On this basis, this document can now outline an exemplary current sensor comprising a magnetometer as previously described and an electrical conductor (LTG). For the purposes of this document, one can also speak of such a current sensor if the magnetometer is intended and/or suitable to be connected to a conductor to form a current sensor.

Preferably, the electrical conductor (LTG) should be arranged with respect to the sensor element (NVD) in such a way that the additional magnetic flux density B generated by an electric current flow in the electrical conductor (LTG) can influence the intensity of the fluorescence radiation (FL) of the paramagnetic centers of the sensor element (NVD).

In order to maximize the magnetic flux density B at the location of the paramagnetic center in the sensor element (NVD), the electrical conductor (LTG) should not be straight but bent at least at one point. A U-shape with the smallest possible inner radius R at the end of the U-shape is particularly preferred. This U-shape achieves a maximization of the magnetic flux density B. The use of further windings is of course possible. In the case of a U-shape, the bend of the electrical conductor (LTG) defines a plane, whereby the sensor element (NVD) and/or the paramagnetic center is mounted at a distance from this plane of no more than 0.5 mm and/or worse no more than 1 mm and/or worse no more than 2 mm and/or worse no more than 5 mm and/or worse no more than 10 mm.

A coil (L) is also conceivable. In that case, the optimum point for the placement of the sensor element (NVD) comprising the paramagnetic centers is located in the center of the coil (L). Preferably, the device uses an optical waveguide (LWL), which in its interior at one point comprises the sensor element (NVD) comprising the paramagnetic centers, as part of the coil core of the coil (L) or as a coil core (FIG. 5).

A major advantage is that the sensor element (NVD) can be located in the immediate vicinity of the electrical conductor (LTG) and also in direct contact with the electrical conductor (LTG), since the device addresses and reads out the sensor element (NVD) purely optically. Preferably, the bending of the electrical conductor (LTG) of the current sensor defines a plane. Preferably, the sensor element (NVD) and/or the paramagnetic center is then mounted not more than 0.5 mm and/or not more than 1 mm and/or not more than 2 mm and/or not more than 5 mm and/or not more than 10 mm away from this plane. The technical teaching of this document is based on the conductor axis, i.e., the center of the electrical conductor (LTG) and the center of the sensor element (NVD).

For example, if the sensor element (NVD) uses NV centers in diamond as paramagnetic centers, these are characterized by a high speed. This high speed enables fast detection of modulated current fluctuations even at high electrical currents in the line. This high speed thus enables signal transmission over high-voltage and high-current lines, which corresponding signal transmission devices can use and implement very elegantly, cheaply, and easily.

Preferably, the current sensor detects the current value of the electrical current in the electrical conductor (LTG) over time as a current signal. The current sensor then preferably has means, in particular filters and amplifiers, to separate an information and/or data signal contained in the current signal from the current signal as an information signal.

Preferably, the information signal of the current sensor, which comprises information about the determined current measurement values, controls one or more devices, such as heaters, power supply devices, motors, valves, etc. Also, a device according to the proposal can use the information signal of the current sensor for data transmission and/or for information transmission and/or for signal transmission, for example, in control loops.

The current sensor may have a feature vector extraction unit which extracts an information signal, the so-called feature vector, from the temporal course of the current measurement values of the current sensor and converts it into a feature vector signal, i.e., a signal consisting of a temporal sequence of feature vectors, and/or converts data derived from the information signal into such a feature vector signal. A sub-device of the current sensor which executes a neural network model and/or an HMM model and which, using this neural network model and/or this HMM model, analyzes the feature vector signal and generates one or more signalizations, in particular for a higher-level control unit. With regard to the term feature vector, the inventors refer to the state of the art: Wikipedia (https://de.wikipedia.org/wiki/Merkmalsvektor, as of 12/23/2020) defines the feature vector as (quote): "A feature vector summarizes the (numerically) parameterizable properties of a pattern in a vectorial way. Different features characteristic for the pattern form the different dimensions of this vector. The totality of possible feature vectors is called the feature space. Feature vectors facilitate automatic classification because they greatly reduce the features to be classified (instead of a complete image, for example, only a vector of 10 numbers needs to be considered). Often, they serve as input for a cluster analysis ".

The current sensor can also record dynamic current value changes independently of the measured value evaluation described. These dynamic current value changes enable an evaluation of the temporal current value changes both without and with additional processing, for example in the form of Fourier transformation and/or wavelet transformation and/or filtering and/or other methods. This evaluation is preferably performed in a signal processor as a sub-device of the device.

A sub-device of the current sensor detects, for example, the status of an electrical conductor (LTG) by means of a time sequence of current measurement values of the current sensor in the form of a measurement value data stream. This current sensor sub-device may, for example, generate a feature vector signal, for example, as a temporal multi-dimensional sequence of values, using signal processing methods. The signal processing methods may be, for example, Fourier transform and/or FFT and/or wavelet transform or similar transforms or filtering, etc. The current sensor preferably obtains the temporal multidimensional sequence of values of the feature vector signal from the measurement data stream. Appropriate devices, such as signal processors, filters or transform units preferably perform such signal processing methods. For example, this feature vector extraction may be followed by a device that evaluates the feature vector signal. For example, this device may execute a neural network model or other artificial intelligence method, such as HMM models, Petri net, machine learning or deep learning. In this context, we refer again to the above-mentioned German patent applications on this subject, which are still unpublished. In this way, the AI unit can, for example, detect an incipient fault condition of the current-carrying device before it actually occurs. Prior to deployment, a so-called training program uses failure data and normal operating data, e.g., from laboratory tests, to determine the parameters for parameterizing the network nodes and network connections of such a neural network model. With regard to self-learning safety-related applications, reference should again be made to the German patent applications DE 10 2019 105 337 A1, DE 10 2019 105 340 A1, DE 10 2019 105 343 A1, which are still unpublished at the time of filing this paper, DE 10 2019 105 346 A1, DE 10 2019 105 359 A1, DE 10 2019 105 363 A1, DE 10 2019 105 372 A1, DE 10 2019 105 389 A1, DE 10 2019 134 408 A1, DE 10 2020 100 996 A1, DE 10 2020 101 000 A1, DE 10 2020 101 036 A1 and DE 10 2020 101 060 A1.

Thus, this paper also discloses herein a current sensor having a sub-device, wherein the sub-device executes a neural network model or an HMM model or the like (see above).

Energy Supply Facility

It is thus possible for the person skilled in the art, based on what is disclosed herein, to construct a power supply device comprising at least one magnetometer and/or module and/or current sensor as previously described.

For example, the power supply device may include or may be one of the following devices or may interact with one of the following devices:

a transformer,
a high current switch,
a thyristor,
a diode,
a diac,
a triac,
a transistor,
a power controller,
a current regulator,
a voltage regulator,
a voltage transformer,
a power amplifier,
a H-bridge.
a half bridge,
an inverter,
a rectifier,
an overhead power line,
a high-voltage power line,
a generator,
an engine,
a turbine,
a supply line,
an internal combustion engine,
a fuel cell,
a battery,
an accumulator
a transmitting or receiving coil for the transmission of electrical energy,
A charging station, especially for electric vehicles
a thermoelectric converter,
a photoelectric energy converter
an energy harvester.

Thus, such a power supply device has at least one paramagnetic center.

It is conceivable that the power supply device comprises a current sensor, as previously described, and that this sensor provides an information signal with the detected current values or variables derived therefrom, this information signal preferably controlling the power supply device.

For example, the current sensor can detect a string current or a neutral current of a three-phase network with a neutral point.

Battery Sensor

Based on the aforementioned devices, this document can thus exemplify a battery sensor, wherein the battery sensor comprises at least one of a magnetometer and/or a module and/or a current sensor as previously described.

In addition to the battery cells, such a battery thus preferably comprises one or more magnetometers and/or modules and/or current sensors, which, for example, detect the value of the current and/or the current density within the battery and/or at the battery terminals.

Power Monitoring Device

This document may indicate an exemplary power monitoring device based on the devices described above. This power monitoring device may have the function of a ground fault circuit interrupter. For example, in an electric vehicle, such a power monitoring device may determine whether all of the electric current that, for example, a battery feeds into a line having, for example, 1 kV voltage of the line opposite the body, also arrives at the motor at the end of the line. If, for example, a leakage current occurs in the direction of the car body, the power monitoring device can detect the current difference between the current value of the injected current and the current value of the extracted current and, if the amount of this current difference exceeds a limit value, can perform an emergency shutdown, for example by actuating an opening switch, in order to prevent fires. This power monitoring device preferably comprises an electrical conductor (LTG) and at least one first current sensor and at least one second current sensor, as previously described. Furthermore, the power monitoring device comprises a measured value evaluation device. The electrical conductor (LTG) has a first conductor position along the electrical conductor (LTG), and the electrical conductor (LTG) has a second conductor position along the electrical conductor (LTG) that is different from the first conductor position and spaced along the intended current flow in the electrical conductor (LTG). The first current sensor now determines a first current value of the electrical current in the electrical conductor (LTG) at the first conductor position in the form of a first measured value. Accordingly, the second current sensor preferably simultaneously determines a second current value of the electric current in the electric conductor (LTG) at the second conductor position in the form of a second measured value. The measured value evaluation device compares the first measured value with the second measured value to form a comparison value. For example, the comparison value can be the difference of the first measured value minus the second measured value. The measured value evaluation device forms this comparison value and/or provides it and/or transmits it to a higher-level device, for example to a higher-level central control computer of a control room. If the comparison value exceeds or falls below a corresponding, typically predefined threshold value, the measured value evaluation device preferably interrupts or reduces the current flow in the electrical conductor (LTG) or reduces the voltage potential of the electrical conductor (LTG) with respect to a reference potential.

In addition to the aforementioned formation of the comparison value by forming the difference between the first measured value and the second measured value, the formation of the comparison value can also be carried out, for example, by dividing the first measured value by the second measured value or inversely thereto.

Preferably, the measurement evaluation device has means, in particular a switch, for interrupting or reducing the current flow in the electrical conductor (LTG) or reducing the voltage potential of the electrical conductor (LTG) with respect to a reference potential as a function of the comparison value. Thus, if current is lost along the electrical conductor (LTG), the power monitoring device may infer a shunt to another line that is supplying or removing a portion of the electrical current at the second measurement point. If the amount of the comparison value exceeds a predetermined threshold value, the power monitoring device can trigger this disconnection, for example, by means of said opening switch. Electrical loads may be inserted into the line between the first conductor position corresponding to the first measuring point and the second conductor position corresponding to the second measuring point.

Thus, this document also proposes a power monitoring device in which the measured value evaluation device interrupts the current flow in the electrical conductor (LTG) or causes such an interruption of the current flow in the electrical conductor (LTG) by other measures, such as shutting off the power generation or the like, or causes a reduction of the current flow in the electrical conductor (LTG) or causes a reduction of the voltage between the potential of the electrical conductor (LTG) and a reference potential, if the first measured value deviates from the second measured value by more than $10^{-10}$ of the first measured value and/or by more than $10^{-9}$ of the first measured value and/or by more than $10^{-8}$ of the first measured value and/or by more than $10^{-7}$ of the first measured value and/or by more than $10^{-6}$ of the first measured value and/or by more than $10^{-5}$ of the first measured value and/or by more than $10^{-4}$ of the first measured value and/or by more than $10^{-3}$ of the first measured value. Which value is optimal in the particular application depends on the particular application. If the device is set too sensitively, even permissible noise can lead to faulty shutdowns. If it is set too insensitive, damage may already have occurred during tripping. Therefore, other values that satisfy one of these conditions are included in the stress.

Likewise, this document proposes a power monitoring device in which the measured value evaluation device interrupts the current flow in the electrical conductor (LTG) or causes such interruption of the current flow in the electrical conductor (LTG) or causes a reduction of the current flow in the electrical conductor (LTG) or causes a reduction of the voltage between the potential of the electrical conductor (LTG) and a reference potential, if the first measured value deviates from the second measured value by more than 100 mA from the first measured value and/or by more than 50 mA from the first measured value and/or by more than 20 mA from the first measured value and/or by more than 10 mA from the first measured value and/or by more than 5 mA from the first measured value and/or by more than 2 mA from the first measured value and/or by more than 1 mA from the first measured value and/or by more than 0.5 mA from the first measured value and/or by more than 0.2 mA from the first measured value and/or by more than 0.1 mA from the first measured value and/or by more than 0.05 mA from the first measured value. Which value is optimal in the particular application depends on the particular application. If the device is set too sensitively, even permissible noise can lead to faulty shutdowns. If it is set too insensitive, damage may already have occurred during tripping. As a rule, a designer applying the technical teachings of this paper will therefore set the switching point depending on the application. Therefore, other values that satisfy one of these conditions are included in the stress.

Supplementary to but also independent of the described measured value evaluation, the power monitoring device can record dynamic current value changes. The power monitoring device can enable an evaluation of the recorded temporal current value changes both without and with additional processing, for example in the form of Fourier transformation or other methods.

For example, a power monitoring device may detect the status of the line using a time sequence of first measured values and second measured values in the form of a measured value data stream. The power monitoring device may use signal processing methods to generate, for example, a feature vector signal from the measured value data stream. The signal processing methods may be, for example, a Fourier transform and/or an FFT and/or a wavelet transform or similar transforms or filtering, etc. The feature vector signal may be obtained, for example, as a time multidimensional sequence of values. Corresponding devices, such as signal processors, filters or transformation units preferably perform such signal processing methods. This feature vector extraction may, for example, be followed by a device that evaluates the feature vector signal. For example, this device may execute a neural network model or other artificial intelligence method, such as HMM models, Petri net, machine learning or deep learning. In this context, reference should be made to the German patent applications DE 10 2019 105 337 A1, DE 10 2019 105 340 A1, DE 10 2019 105 343 A1, which were still unpublished at the time of filing of the priority prior application of this document, DE 10 2019 105 346 A1, DE 10 2019 105 359 A1, DE 10 2019 105 363 A1, DE 10 2019 105 372 A1, DE 10 2019 105 389 A1, DE 10 2019 134 408 A1. DE 10 2020 100 996 A1, DE 10 2020 101 000 A1, DE 10 2020 101 036 A1 and DE 10 2020 101 060 A1 are referred to. In this way, the AI unit can detect, for example, an incipient fault condition before it actually occurs. For example, prior to the deployment of such a neural network model, a training program determines the parameters of the network nodes and the network connections of the neural network model, which the device proposed herein preferably executes in a sub-device of the device, using failure data and normal operating data from laboratory tests. With respect to self-learning safety-related applications, the inventors here again refer to the above unpublished German patent applications.

Thus, this paper also discloses herein a performance monitoring device comprising a sub-device, wherein the sub-device executes a neural network model or an HMM model or the like (see above).

Quantum Optical System

Likewise, based on the devices previously described, this document may outline a quantum optical system. Such, quantum optical system comprises at least one, preferably a plurality of optical quantum dots. Very preferably, these quantum dots are said paramagnetic centers and/or in particular NV centers in diamond and/or other, optically active impurities in one or a plurality of crystals. The quantum optical system proposed herein thereby preferably comprises one or more circuit carriers (GPCB). This is preferably transparent, in whole or in part, to the radiation used in each case. For this purpose, the circuit carrier (GPCB) is preferably at least partially made of an optically transparent material. The quantum dot can preferably interact with an optical radiation. For example, in the case of a NV center in diamond, a quantum dot may interact with pump radiation (LB) and fluoresce with a fluorescent radiation (FL). The present disclosure now proposes that the circuit carrier (GPCB) interacts with the quantum dot in such a way that the circuit carrier (GPCB) acts as an optical functional element, e.g., an optical waveguide, for at least a portion of the optical radiation that may interact or has interacted with the quantum dot.

Circuit Carrier

As can be seen from the preceding sections, the circuit carrier (GPCB) is a central component of the proposed various devices. The circuit carrier (GPCB) proposed herein is intended to be used in a magnetometer, a module, a current sensor, a power supply device, a battery sensor, a power monitoring device, a quantum optical system, as described previously.

Preferably, optical functional elements, such as in particular optical filters, in particular Bragg filters, mirrors, lenses, in particular micro-lenses, digital optical functional elements, diffractive optical functional elements, photonic crystals and photonic crystal structures, resonators, optical apertures and/or optical shields and/or nonlinear optical elements are incorporated into the circuit carrier (GPCB). This can be done, for example, by etching and/or mechanical processing and/or 3D printing and/or printing, in particular screen printing or stencil printing, and/or melting in circuit carrier parts having different optical properties, such as deviating refractive indices and deviating absorption and transmission coefficients and deviating scattering properties compared to the rest of the circuit carrier material. Also, irradiation using particles and photon beams can cause a local modification of the circuit substrate material.

Vehicle

Hereinafter, the term "vehicle" refers to a vehicle and/or flying machine and/or missile and/or projectile and/or surface or underwater vehicle and/or surface or underwater floating body and/or functionally equivalent devices for moving animate and inanimate things. The technical teachings of this paper may now specify, based on the aforementioned devices, a vehicle in which the vehicle comprises at least one magnetometer and/or at least one module and/or a current sensor and/or a battery sensor and/or a power monitoring device and/or a power supply device and/or a quantum optical system and/or a circuit carrier (GPCB). Preferably, these are in the form previously described. For example, in such a vehicle, the battery current of an electric car can be detected and monitored to detect fault conditions. Here it is advantageous that, in addition to the galvanic and thermal isolation, the line does not have to have a shunt resistor. Preferably, a state of the vehicle depends on a measured value determined by one of the devices described herein. Such a state may, for example, relate to the charging and discharging process of the vehicle battery and/or the state of the air conditioning system and/or the maximum speed and/or the selected driving route (energy-saving/not energy-saving), etc.

Exemplary Process for the Production of the Circuit Carrier (GPCB)

The purpose of this paper is to give an exemplary method for the production of a circuit carrier (GPCB) as proposed in this paper. However, the possibilities for its manufacture are not limited thereto. The exemplary method presented here begins, for example, with the provision of a circuit carrier blank. The method is based on the patterned application and/or printing of a paste onto said circuit carrier blank comprising an optically suitable powder, for example a glass powder, which melts upon heating and then forms, for example on a glass substrate as a circuit carrier blank (GPCB), light waveguides and other optical functional elements depending on the printed shapes. Melting the optically suitable powder thus results, at least locally, in a material that is sufficiently transparent to radiation of the wavelength of interest for the intended application. For the purposes of this document, an optically suitable powder is thus a powder if, after heating, it is optically transparent for the relevant radiation, in particular for radiation having the pump radiation wavelength ($\lambda_{pmp}$) of the pump radiation (LB) and/or for radiation having the fluorescence radiation wavelength ($\lambda_{fl}$) of the fluorescence radiation (FL) and/or for radiation having the compensation radiation wavelength ($\lambda_{ks}$) of the compensation radiation (CL) to a degree sufficient for the intended application. This document refers to such an optically suitable powder, for example in a paste and preferably comprising a volatile paste carrier, as a glass frit. An optically suitable powder may be, for example, glass powder. Heating causes the paste carrier, for example water, to volatilize and the powder material, for example glass powder, melts to form a transparent material and, depending on the print border, for example through the edge of an opening in a print stencil, forms an optical functional element. Robots and dispensers can perform such printing or application. Accordingly, the circuit carrier (GPCB) need not be planar. It can also assume any three-dimensional shape. For example, in a 3D printing process, it is possible to print the circuit carrier (GPCB) comprising all optical functional elements successively, for example, by means of an extruder. If the melting process of the paste is not already carried out during printing, a subsequent heat treatment is then typically required at least subsequently to convert the exemplary glass powder into a transparent glass body. Such an exemplary method for manufacturing an optical waveguide (LWL) thus comprises, for example, the steps:

i. Application of said glass frit paste by means of a printing or dispensing process (=application process) to the provided circuit carrier blank (GPCB), the application resulting in a linear glass frit structure at least locally.

ii. Performing a thermal treatment to melt the locally linear glass frit structure into a linear glass structure of the circuit carrier (GPCB); and iii. Using the linear glass structure of the circuit carrier (GPCB) as an optical waveguide (LWL).

For other exemplary structures, the following exemplary procedure results comprising the following exemplary steps:

Applying a glass frit paste to the circuit carrier blank (GPCB) by a printing or dispensing process, the application resulting in a glass frit structure at least locally;

Perform temperature treatment to melt the glass frit structure into a glass structure of the circuit carrier (GPCB);

Using the glass structure of the circuit carrier (GPCB) as an optical functional element, in particular as a lens and/or filter and/or aperture and/or mirror and/or photonic crystal and/or Bragg filter and/or Fabry-Perot interferometer.

When manufacturing a circuit carrier (GPCB) in the sense of this paper, it is advantageous if the manufacturing of the circuit carrier (GPCB) uses at least two, preferably more glass frit pastes. The first glass frit paste is used to fabricate the optical waveguide (LWL). The second glass frit paste additionally comprises crystals comprising paramagnetic centers. This makes it possible to create optical waveguides (LWL) that are interrupted by an optical waveguide region that includes these paramagnetic centers, e.g., as a sensor element (NVD).

These crystals comprising paramagnetic centers are preferably diamond crystals comprising NV centers and/or diamond crystals comprising ST1 centers and/or diamond crystals comprising L2 centers and/or silicon crystals comprising SiV centers and/or other paramagnetic centers in diamond crystals and/or silicon crystals and/or silicon carbide crystals or other crystals. Preferably, the crystals are micro- or nanocrystals.

Exemplary Method for the Production of a Circuit Carrier by Means of Laminating or Gluing Technology A further embodiment of the process for manufacturing a circuit carrier (GPCB) preferably comprises a formation of the layers by means of adhesive bonding. This embodiment preferably uses a first layer to realize the optical waveguides (LWL) and a second layer as a second layer to realize the sensor elements (NVD). Thus, it is a new idea compared to the prior art to fabricate a laminate of sheets in which one sheet comprises micro and/or nano crystals having paramagnetic centers. The manufacturing device, which is not shown in the figures, structures this sheet before or after lamination and/or bonding to the circuit carrier blank (GPCB). The same typically applies to an optically transparent sheet that serves as the material for the optical waveguide (LWL) and that the manufacturing device also glues or laminates onto the circuit carrier blank (GPCB). The manufacturing process can combine these sheet-based laminating and bonding techniques with the other deposition techniques, if necessary.

The method also proposed is a method of manufacturing a circuit carrier (GPCB). The method starts with providing a circuit carrier blank (GPCB). This may be, for example, a polished glass plate or the like. Other circuit carrier blanks (GPCB) are possible. This is typically followed by applying an optically transparent sheet to the circuit carrier blank (GPCB) by lamination or bonding or by means of another suitable application process. The process includes patterning the optically transparent sheet. This patterning may be performed by means of mechanical operations such as punching or cutting, or by means of optical operations such as laser cutting or ion or electron beam cutting or the like, or by means of photolithographic methods or other methods functionally equivalent thereto. Structuring can be performed temporally before or after deposition. Structuring can then produce sheet structures on the circuit substrate. Preferably, the sheet has a thickness greater than the longest wavelength of light used in the subsequent sensor system. Of course, the analogous thickness principle preferably applies to all optical waveguides (LWL) of this document. The proposed devices can then use the sheet structures thus created as optical functional elements.

Preferably, the use of such a sheet structure of the sheet structures as an optical functional element concerns the use of the sheet structure as a lens and/or filter and/or aperture and/or mirror and/or photonic crystal and/or digital optical functional element and/or diffractive optical functional element and/or Bragg filter and/or Fabry-Perot interferometer and/or optical resonator and/or optical wave coupler. The optical functional elements can be divided into light-conducting functional elements, dispersing functional elements, filtering functional elements, polarizing functional elements, deflecting functional elements, as well as aperture- and luminous flux-changing functional elements and energy-converting functional elements and nonlinear functional elements. Furthermore, wave-optical functional elements such as holographic functional elements may be considered. The inventors refer here to the relevant literature on photonics and optics and in particular micro-optics. For realization they refer here to the book Heinz Haferkorn, "Physikalisch-technische Grundlagen und Anwendungen", 27 Nov. 2002, 2003, WILEY-VCH Verlag GmbH & Co. KGaA. Further optical functional elements than the ones specifically listed above are thus conceivable.

Typically, the manufacturing device applies a further sheet to the circuit carrier blank (GPCB) in the manufacturing process by laminating or gluing or by means of another suitable application process, resulting in a sheet stack. Typically, one or more physical and/or chemical properties of individual sheets differ from each other.

For example, a sheet that the fabrication device may use in the fabrication process for making the circuit carrier (GPCB) may have ferromagnetic particles in its sheet material, which in extreme cases may mean that the entire sheet may be ferromagnetic. Thus, from such a sheet, the fabrication device can fabricate, for example, a bias magnet (BM) as part of the device.

For example, an optically transparent sheet that the manufacturing device may use in the manufacturing process for producing the circuit carrier (GPCB) may have colored particles in its sheet material, which in the extreme case may mean that the entire sheet is colored and therefore typically filters away the complementary color from white light. Thus, from such a sheet, the manufacturing device can produce, for example, optical filters (F1) as part of the device.

In particular, such a sheet that the manufacturing device can use in the manufacturing process for the production of the circuit carrier (GPCB) can have particles in its sheet material that absorb the pump radiation (LB) and/or the fluorescence radiation (FL) and/or the compensation radiation (CL). Thereby, this sheet can be transparent for radiation having the pump radiation wavelength ($\lambda_{pmp}$) of the pump radiation (LB), if this is not absorbed, and/or transparent for radiation having the fluorescence radiation wavelength ($\lambda_{fl}$) of the fluorescence radiation (FL), if this is not absorbed, and/or transparent for radiation having the compensation radiation wavelength ($\lambda_{ks}$) of the compensation radiation (CL), if this is not absorbed.

A fifth sheet that the fabrication device may use in the fabrication process for fabricating the circuit carrier (GPCB) may have a first refractive index, and another sheet that the fabrication device may also use in the fabrication process for fabricating the circuit carrier (GPCB) may have a second refractive index, wherein the first refractive index may be different from the second refractive index.

A sheet that the fabrication device can use in the fabrication process for manufacturing the circuit carrier (GPCB) can have crystals comprising paramagnetic centers in its sheet material. In this case, the crystals comprising paramagnetic centers are preferably diamond crystals comprising NV centers and/or diamond crystals comprising ST1 centers and/or diamond crystals comprising L2 centers and/or silicon crystals comprising SiV centers and/or other paramagnetic centers in diamond crystals and/or in silicon carbide crystals and/or in silicon carbide crystals or in other crystals.

Optical Device

On this basis, this document may also specify herein an optical device comprising an optical functional element, in particular on said circuit carrier (GPCB), which a manufacturing device has produced by a previously described method in a manufacturing process.

Preferably, this optical device also comprises optically active electronic components, such as LEDs or lasers, and optically sensitive electronic components, for example photodiodes and/or CCD elements and/or SPADs (Single Photon Avalanche Photo Diode) and/or an AVD (Avalanche Photo Diode). Preferably, these are optically coupled to the optical functional element produced by the previously described method. In addition, this optical device may also include other electrical and electronic and optical and fluidic components.

The other functional elements that can be part of the optical device can be, for example, components from the following list:

A line,
a microstrip line,
a tri-plate line,
an antenna,
a coil,
a transformer,
an electrode,
a contact surface,
a capacitor,
a diode,
a transistor,
a micro-integrated circuit,
a controller,
an amplifier,
an electrical filter,
an electrical resistance,
an electric heating element,
an electrical fuse,
a thermistor, one LED,
a laser,
a photo receiver,
a sensor element comprising an electrical output signal,
a direct-contact sensor or direct-contact sensor element.

A direct contact sensor element in the sense of this paper is a sensor element (NVD) which is intended and suitable to be in direct mechanical contact with other surfaces of other bodies moving relative to the mechanical contact surface of the sensor element (NVD), whereby a surface of this sensor element (NVD) is intended to be in mechanical contact with the respective surface of the other body which is moving. This can also be gases and liquids, i.e., fluids, whereby it is assumed for simplification that movement takes place in the fluid at a small distance from the sensor surface. This is important, for example, for measurements in boreholes. In boreholes, if applicable, the drill pipe comprising the drilling fluid can typically pass a gas/sand/water/oil mixture directly past such a sensor element (NVD). The movements of this mixture typically cause high abrasion on the surface of the sensor element.

From this, a method for measuring the magnetic flux density B within a borehole can be developed. It comprises for example the steps of positioning a magnetometer and/or a module and/or a current sensor and/or a quantum optical system and/or a circuit carrier and/or an optical device and/or a sensor system and/or a quantum technological device as a measurement system or part of a measurement system in the borehole, and the detection of the magnetic flux density B at the location of a paramagnetic center of the measuring system and of transferring the determined measured value to the surface.

Preferably, the measuring system comprises a direct contact sensor element. For example, it is conceivable as an application to provide the drill head of a drill bit of an impact drilling machine comprising NV centers and to detect the magnetic field strength at the drill tip in order to avoid drilling into live electrical lines. If the value of the magnetic flux density detected by the NV center exceeds a predefined threshold value, the drilling machine switches off.

Sensor System

This paper thus discloses, in general, a sensor system comprising a sensor element (NVD) that changes an optical property as a function of a physical quantity—e.g., the flux density B or one of the above-mentioned physical quantities—and comprising an optical device as described above. The sensor element (NVD) is thereby preferably optically coupled to the optical device. The optical device optically detects the optical property of the sensor element (NVD) and, by means of the optically sensitive electronic device (PD), converts the optically detected value of this optical property of the sensor element (NVD) into an electrical signal comprising a signal value which can be used or is used as a measure of a value of the physical quantity or which is intended to be used as such a value. Optical coupling can achieve potential isolation and thermal isolation between the sensor element (NVD) and the electronics. The technical teachings described herein greatly simplify placement of the sensor element (NVD) in areas having extreme environmental conditions such as field strengths, temperatures, electrical potentials, chemically corrosive environmental substances, etc.

In the case of using NV centers as sensitive subdevices of the sensor element (NVD), the physical quantity may be, for example, the value of the magnetic flux density B.

Therefore, the paramagnetic center in a crystal, in particular a NV center in a diamond crystal and/or in particular a SiV center in a diamond crystal and/or a G center in a silicon crystal, can also be considered as a sensor element (NVD).

Quantum Technological Device

This paper can now specify a quantum technological device based on the previously described technical teachings. In this regard, the quantum technological device preferably comprises an optical device as previously described. An optical functional element of the device is preferably a paramagnetic center in a crystal, in particular a NV center in a diamond crystal comprising one or more SiV centers in a diamond crystal and/or a G center in a silicon crystal.

Quantum Computer

Based on the technical teachings described previously, this paper thus discloses an optical quantum computer as a further application of the design principles described herein as a further application of the technical teachings of this paper. This quantum computer thereby comprises an optical device as previously described. An optical functional element of the device is a paramagnetic center in a crystal, in particular a NV center in a diamond crystal and/or a SiV center in a diamond crystal and/or a G center in a silicon crystal. In this context, reference should be made to the German patent DE 10 2020 101 784 B3, the technical teaching of which is fully part of this application. The technical teaching of the priority-establishing document DE 10 2019 133 466.7 of DE 10 2020 101 784 B3 is also fully part of this application. This applies insofar as this corresponds to the national law of the states in which the nationalization of the application submitted here takes place.

Preferably, such a quantum computer comprises multiple microintegrated circuits (IC) for generating the radio frequency signals, the microwave signals, the DC voltages and drive currents, and the pump radiation source (PLED) drive for resetting the quantum bits.

All these components of the quantum computer including the said microintegrated circuits (IC) are preferably accommodated on the circuit carrier (GPCB), which can thus be designed to be particularly compact.

Systems in Areas of Ionizing Radiation

If the device uses NV centers in diamond as paramagnetic centers, the design and/or use of the device can take advantage of the resistance of diamond to ionizing radiation. Thus, this document also claims the use of a magnetometer and/or a module and/or a current sensor and/or a power supply device and/or a battery sensor and/or a power monitoring device and/or a quantum optical system and/or a circuit carrier (GPCB) and/or a vehicle and/or an optical device and/or a sensor system and/or a quantum technological device and/or a quantum computer, as previously described by this document, in an environment comprising ionizing particle and/or photon radiation that is typically technically induced. Thereby, typically the radiation level in air is more than 21000% above the normal radiation level (~20 Bq/m$^3$).

This then also results, among other things, in a device for the technical or medical use of ionizing radiation, for example an X-ray device, which uses one or more of the devices and/or methods described above. Such a device then typically comprises, for example, a magnetometer and/or a module and/or a current sensor and/or a power supply device and/or a battery sensor and/or a power monitoring device and/or a quantum optical system and/or a circuit carrier and/or an optical device and/or a sensor system and/or a quantum technological device and/or a quantum computer, as previously described in this paper.

Direct Contact Systems and Direct Contact Sensor Elements e

This document already mentions direct-contact systems and direct-contact sensor elements above.

As already described above, a direct contact sensor element in the sense of this paper is a sensor element (NVD) which is intended and suitable to be in direct mechanical contact with one of its surfaces with a moving surface of another body, whereby one surface of the sensor element (NVD) is intended to be in contact with the respective moving surface of another body. This can also be gases and liquids, i.e., fluids. In working out the disclosure, the inventors have made the simplifying assumption that movement takes place in the fluid at a small distance from the sensor surface. This is of importance, for example, in measurements in boreholes where the drill pipe leads the drilling fluid in the form of a gas/sand/water/oil mixture directly past such a sensor element (NVD).

Therefore, a direct-contact system is a sensor system comprising at least one direct-contact sensor element as the sensor element (NVD).

A claimed direct-contact sensor system in the sense of this document therefore comprises, for example, a magnetometer and/or a module and/or a current sensor and/or a quantum optical system and/or a circuit carrier (GPCB) and/or an optical device and/or a sensor system and/or a quantum technological device, as this document describes them above. In this context, the direct-contact sensor system comprises a sensor element (NVD), in this case the direct-contact sensor element, which is preferably made of a material, in particular diamond, and which has a material surface. The sensor element (NVD), in order to be part of the previously enumerated devices, comprises a paramagnetic center and/or a quantum dot. Now, a material surface of the sensor element (NVD) is directly mechanically accessible via at least a portion of an outer surface of the sensor element (NVD) in the case of this direct-contact sensor element or system. For example, the housing of the device preferably has a corresponding mechanical window that leaves out this surface, for example.

The mechanical Vickers hardness of this directly accessible material surface of the sensor element should be above the limit for super hard materials (>40 GPa).

Sensor Element Comprising a Modulated Quantum Dot Density

The paramagnetic centers influence each other. Therefore, modulating the density of the paramagnetic centers can lead to a change in fluorescence as it changes the absorption of fluorescence radiation (FL). A magnetometer and/or a module and/or a current sensor and/or a power supply device and/or a battery sensor and/or a power monitoring device and/or a quantum optical system and/or a circuit carrier (GPCB) and/or an optical device and/or a sensor system and/or a quantum technological device and/or a quantum computer may use such a sensor element (NVD). Such a sensor element (NVD) preferably comprises a surface part of a sensor element surface comprising parametric centers and/or quantum dots, wherein the density of the parametric centers with respect to the surface part is modulated using a density function depending on the position on the surface part and/or depending on the depth perpendicular to the surface part in the region of this surface part. Preferably, the paramagnetic centers are arranged in clusters of these paramagnetic centers, for example NV centers in diamond. These clusters are preferably arranged in the form of a two- or three-dimensional grid, with the grid plane preferably parallel to the surface of the surface part. There may be multiple cluster planes of paramagnetic centers stacked below this surface to the depth of the crystal.

Thus, the density modulation of the paramagnetic centers, for example the NV centers, thus preferably shows at least one spatially periodic component, which usually corresponds to a lattice constant.

Quantum System

This paper also proposes herein a quantum system comprising a pump radiation source (PLED) emitting pump radiation (LB) in response to an electrical transmission signal (S5). Furthermore, the quantum system preferably comprises a sensor element (NVD) comprising at least one paramagnetic center, in particular comprising one or more NV centers in diamond. A drive circuit (IC) preferably generates the transmission signal (S5). The paramagnetic center or centers emit fluorescence radiation (FL) as a function of a physical quantity, in particular as a function of the magnitude of the magnetic flux density B at the location of the respective paramagnetic center, and as a function of the irradiated pump radiation (LB). The transmission signal (S5) is preferably periodic in time having a pump period. Over at least 5 pump periods, the magnitude of the transmission signal (S5) preferably exhibits an average value. In a first period, the magnitude of the transmission signal (S5) is above this mean value during these at least 5 pump periods. In a second time period, however, preferably the magnitude of the transmission signal (S5) is below said average value during said at least 5 pump periods. Preferably, the transmission signal (S5) of the pump radiation source (PLED) has a design such that the pump pulse is very short and therefore very high in order to maximize the coupling of the paramagnetic centers in the sensor element (NVD), for example the coupling of the NV centers in the diamond, and thereby to maximize the contrast between the level of the fluorescence radiation (FL) without magnetic field and the level of the fluorescence radiation (FL) with magnetic field.

The device preferably generates the ratio of the first amount of the first temporal length of the first time period divided by the second amount of the second temporal length of the second time period such that it is significantly different from 0.5.

Another quantum system comprises a pump radiation source (PLED) which emits pump radiation as a function of an electrical pump signal ($I_{pump}$, S5), and a sensor element (NVD) comprising at least one paramagnetic center, in particular comprising one or more NV centers in diamond, and a drive circuit (IC) which generates the electrical pump signal ($I_{pump}$, S5). The paramagnetic center or centers thereby emit a fluorescence radiation (FL) as a function of a physical quantity, in particular as a function of the magnitude of the magnetic flux density B at the location of the respective paramagnetic center, as a function of the irradiated pump radiation (LB). However, the signal generator (G) for the electrical pump signal ($I_{pump}$, S5) now modulates the electrical pump signal ($I_{pump}$, S5) using a spreading code as an example. This method, when applied, can lift the useful signal out of the typically white noise background.

For this purpose, such a quantum system preferably comprises a signal generator (G), a pump radiation source (PLED), a sensor element (NVD) comprising at least one or a plurality of paramagnetic centers, in particular NV centers in diamond, and a radiation receiver (PD). The signal generator (G) generates the transmission signal (S5). Preferably, the transmission signal (S5) is a spreading code signal. Preferably, the transmission signal (S5) is band-limited in a transmission frequency band having a lower transmission frequency and an upper transmission frequency, wherein preferably the magnitude of the lower transmission frequency is different from the magnitude of the upper transmission frequency. In particular, the transmission signal (S5) may be modulated using a spreading code. Preferably, the spreading code is a random signal or a band-limited pseudo-random signal. For example, clocked feedback shift registers can generate such a band-limited pseudo-random signal. The pump radiation source (PLED) then emits pump radiation (LB) in response to the transmission signal (S5) and thus to the spreading code. The pump radiation (LB) then irradiates the sensor element (NVD), with the sensor element (NVD) emitting fluorescence radiation (FL) as a function of the pump radiation (LB) and as a function of another physical quantity, in particular as a function of the magnetic flux density B. The fluorescence radiation (FL) then radiates into the radiation receiver (PD), where the radiation receiver (PD) converts the signal of the intensity of the fluorescence radiation (FL) into a receiver output signal (S0). A synchronous demodulator demodulates the receiver output signal (S0) using the transmission signal (S5) to form a demodulated signal (S4). This demodulated signal (S4) can then be used as a measurement signal. Its value corresponds to a value for the intensity of the fluorescence radiation (FL) and thus for the value of the physical quantity.

Receiver

During the elaboration of the disclosure, the inventors recognized that the speed of the devices enables them to be used as receivers for electromagnetic waves. Such a receiver is then preferably provided with a magnetometer and/or with a module and/or with a current sensor and/or with a quantum-optical system and/or with an optical device and/or with a sensor system and/or with a quantum-technological device such as this paper describes above.

The measurement signal is then preferably the received signal.

Borehole Measurement

In working out the disclosure, the inventors realized that the devices described herein could be used in boreholes for geological surveys. It is then a method for measuring the magnetic flux density B within a borehole or a geological search field, comprising the steps of Positioning a magnetometer and/or a module and/or a current sensor and/or quantum optical system and/or a circuit carrier and/or an optical device and/or a sensor system and/or a quantum technological device as a measurement system or part of a measurement system in the borehole or at a predetermined position of the geological search field;

Detection of magnetic flux density B at the location of a paramagnetic center of the measuring system;

Transfer of the determined measured value to the surface.

The transmission can, for example, be wire-bound via a data bus or an optical waveguide or wireless by means of electromagnetic waves or ultrasound. When positioned in a borehole, it is advantageous if the measuring system has a direct-contact sensor element so that the direct-contact sensor element can directly measure the magnetic properties of, for example, the surrounding rock and/or, for example, an oil/gas/water/sand mixture flowing past.

Method of Manufacturing an Optical System

It is particularly advantageous to be able to manufacture the necessary optical system at least partially by simple printing and dispensing processes at low cost. This is a process for the production of an optical system comprising, among other things the steps of providing a system carrier (GPCB) comprising a surface and of applying, in particular dispensing on, and/or printing a first glass frit paste onto the system carrier (GPCB) as a first glass frit structure and typically subsequently melting a glass frit structure to a molten glass frit structure and solidifying the molten glass frit structure to a solidified glass frit structure and using the solidified glass frit structure as an optical functional element.

The system carrier (GPCB) preferably has structures on the surface, in particular preferably fluidic and/or microfluidic structures, in particular depressions and/or trenches and/or lips and/or other means, which limit and/or control and/or influence the flow of the molten glass frit of the molten glass frit structure.

Preferably, at least some of the solidified glass frit structures are optically transparent, such that the devices disclosed herein can use them as optical functional elements, such as lenses or optical waveguides. This can be achieved, for example, by the glass frit paste comprising glass powder.

Preferably, at least some of the solidified glass frit structures are NOT optically transparent, so that the devices disclosed herein can use them, for example, as an aperture or wave sump. This can be achieved, for example, by black and/or dark particles in the glass frit.

However, such particles can also specifically scatter the light in an optical waveguide produced in this way. The solidified glass frit structure then has scattering particles. These can be white particles, for example.

A coloring of the scattered light can be achieved. The solidified glass frit structure then exhibits colored particles.

If necessary, the glass frit paste can have colored glass powder, which can be colored, for example, by the use of salts. In this way, specific color filters can be printed and/or dispensed.

A glass frit paste and/or a solidified glass frit structure may also have ferromagnetic particles, for example, to adjust a magnetic operating point of a quantum optical system.

Furthermore, in order to fabricate a quantum optical sensor system, it is useful if a solidified glass frit structure has particles and/or crystals comprising paramagnetic centers.

Preferably, then, at least one or more of the paramagnetic centers are NV centers in diamond and/or SiV centers in diamond and/or an ST1 center in diamond and/or an L2 center in diamond. Preferably, the density is particularly high, as already described elsewhere in this paper.

If a suitable printing technique is used, the printing technique can use a very small structural size of the print. Preferably, the glass frit paste has micro- and/or nanoparticles. The solidified glass frit structure then has a width of less than 1 mm and/or better less than 500 µm and/or better less than 200 µm and/or better less than 100 µm and/or better less than 50 µm and/or better less than 20 µm and/or better less than 10 µm and/or better less than 5 µm and/or better less than 2 µm and/or better less than 1 µm at at least one location. If diffractive optics are to be manufactured, the structure must be smaller than the wavelength. The width is then preferably even less than 0.5 µm and/or better less than 0.2 µm and/or better less than 0.1 µm.

When this precision of fabrication is achieved, for example, by the limiting trenches and/or lips in the surface of the system carrier (GPCB), optical functional elements can be fabricated. At least one partial device of the solidified glass frit structure is then preferably one of the following optical functional elements:

an optical filter, in particular a Bragg filter, and/or
a mirror and/or a mirror surface and/or
a lens, in particular a micro-lens and/or
a digital optical functional element and/or
a diffractive optical functional element and/or
a photonic crystal and a photonic crystal structure and/or
an optical or photonic grating and/or
a resonator and/or
an optical diaphragm and/or
a shaft sump and/or
an optical shield and/or
a prism and/or
a beam splitter and/or
an optical waveguide and/or
an optical resonator and/or
an optical wave coupler.

These can then be assembled to form more complex systems. Preferably, the system carrier (GPCB) is optically non-transparent in parts and/or optically transparent in parts. This depends on the type of application. The system carrier (GPCB) can therefore also be optically completely non-transparent and/or optically completely transparent. It is possible to use several sides of the system carrier (GPCB) for optical and/or electrical functional elements. It is also possible to manufacture electrical circuits in thick film and/or thin film technology on the system carrier (GPCB). The possible formation of the layers by means of adhesive processes realizes another possible embodiment.

Preferably, the system carrier (GPCB) comprises, under certain circumstances, an antenna, for example a microwave antenna for driving paramagnetic centers, in particular NV centers in diamond, by means of electromagnetic waves, in particular microwaves.

Method of Manufacturing an Optical System Comprising a Sheet

Analogous to the process using glass frit deposition, a process for producing an optical system using structured sheets stacked on top of each other is now also defined here in this paper as an example. This process then also begins with the provision of a system carrier (GPCB) comprising a surface. This is followed by applying and/or gluing and/or laminating a first sheet onto the system carrier (GPCB). A manufacturing device can structure this first sheet again in the manufacturing process before or after the application. This structuring can be done again, as before mechanically, for example by means of cutting, for example using a knife, or for example by means of a laser cutting device, or photolithographically. Thus, for example, structuring of the first sheet takes place in this way in order to obtain a first sheet structure, wherein the structuring can take place before or after the step of applying, gluing or laminating. Subsequently, the resulting first sheet structure can be used later as an optical functional element.

For example, a sheet structure may be optically transparent. For example, it may be an optically transparent sheet strip. The device then uses this optically transparent sheet strip as an optical waveguide, for example.

In order to be able to produce apertures, for example, it can be useful if a sheet structure is optically non-transparent.

If a first optically transparent sheet structure is to be used together with a second optically non-transparent sheet structure, which is likely to be the case as a rule, it is advisable to add further steps to the process.

The method thus extended then preferably comprises applying and/or gluing and/or laminating a second sheet onto the system carrier (GPCB), structuring the second sheet to obtain a second sheet structure, wherein the structuring can take place before or after the step of applying, gluing or laminating the second sheet, and using the second sheet structure as a second optical functional element. The second sheet may differ in composition and/or optical properties from the first sheet. These properties may include, for example, the refractive index, the absorption spectrum in light transmission, the reflection spectrum, the transmission spectrum, the scattering properties, the presence, number, density, density structuring and type of particles in the sheets, in particular particles comprising quantum dots, paramagnetic centers, clusters of paramagnetic centers, i.e., a plurality of paramagnetic centers, NV centers, clusters of NV centers, etc. Also, the first sheet structure and/or the second sheet structure may be optically non-transparent and may be distinguished from the other sheet by such transparency or non-transparency. Of course, a manufacturing device may process more than two different sheets in the manufacturing process of a device as defined herein.

Such a sheet structure can have diffuser devices or scattering structures in its sheet material, e.g., inside the sheet structure or on its surface, in particular for coupling light in and out. These structures can be different when several sheets are used.

Such a sheet structure can be optically transparent and colored.

The sheet material of such a sheet structure can have colored particles. These can be colored in their transparency or reflection.

The sheet material of such a sheet and/or sheet structure may have ferromagnetic particles.

The sheet structure can also have particles and/or crystals comprising paramagnetic centers in its sheet material. Thus, if the sheet structure is sufficiently optically transparent for fluorescence radiation (FL) and pump radiation (LB), a sheet structure made of such a sheet can serve as a sensor element. Such a sheet structure then preferably comprises, at least locally, a material within the sheet material having a paramagnetic center. This material may be one or more crystals. One or more crystals may again have such a high density of paramagnetic centers that, for example, the collective effects mentioned several times in this paper occur when several paramagnetic centers are coupled. For example, the crystals may be nanocrystals. For example, the crystals may be diamonds. At least one or more of the paramagnetic centers may be NV centers in diamond and/or SiV centers in diamond and/or an ST1 center in diamond and/or an L2 center in diamond and/or another paramagnetic center in a crystal.

The sheet structure has a width of less than 1 mm and/or less than 500 µm and/or less than 200 µm and/or less than 100 µm and/or less than 50 µm and/or less than 20 µm and/or less than 10 µm and/or less than 5 µm and/or less than 2 µm and/or less than 1 µm and/or less than 0.5 µm and/or less than 0.2 µm and/or less than 0.1 µm at at least one location.

At least one sub-device of the sheet structure is preferably one of the following optical functional elements:
an optical filter, in particular a Bragg filter and/or
a mirror and/or a mirror surface and/or
a lens, in particular a micro-lens and/or
a digital optical functional element and/or
a diffractive optical functional element and/or
a photonic crystal and a photonic crystal structure and/or
an optical or photonic grating and/or
a shaft coupler and/or
a resonator and/or
an optical diaphragm and/or
a shaft sump and/or an optical shield and/or
a prism and/or
a beam splitter and/or
an optical waveguide and/or
a light conducting functional element and/or
a dispersing functional element and/or
an optical filtering functional element and/or
a polarizing functional element and/or
a distracting functional element and/or
an aperture- and luminous flux-changing functional element and/or
an energy-converting functional element and/or
a non-linear functional element and/or
a wave-optical functional element and/or
a holographic functional element.

Advantage

Using the technical teachings disclosed herein, manufacturing devices in manufacturing processes can produce compact electro-optical measurement systems and/or compact optical systems and, in particular, quantum optical systems in at least some implementations of the devices disclosed herein. However, the advantages are not limited thereto. Suitable fabrication devices may use variations of the fabrication processes to fabricate various embodiments of the devices presented herein. The manufacturing processes presented may include dispensing and/or printing and/or the formation of layers using adhesive and/or laminating processes of sheets and/or sheet parts.

Features

The following characteristics summarize the proposal presented here in its internal structuring once again. Individual characteristics and sub-characteristics can be combined with other characteristics and/or sub-characteristics if it makes sense. The claim is derived from the applicable claims in each case. This description explains the relationships of the claim in more detail.

Magnetometer (1-26)

Feature 1: Magnetometer,
comprising a sensor element (NVD) and
comprising a circuit carrier (GPCB) and
comprising a pump radiation source (PLED) and
comprising a radiation receiver (PD) and
comprising evaluation means (ADC, IF),
wherein the pump radiation source (PLED) emits pump radiation (LB) is electrically energized by means of an electrical pump current ($I_{pump}$) and
wherein the sensor element (NVD) comprises at least one quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal, and
wherein the at least one quantum dot of the sensor element (NVD) is capable of emitting fluorescent radiation (FL) upon irradiation using pump radiation (LB), and
wherein the intensity of the fluorescence radiation (FL) of the at least one quantum dot depends on the value of the magnetic flux density B and/or on the value of another physical parameter at the location of the at least one quantum dot, and
wherein the radiation receiver (PD) is sensitive to the fluorescent radiation (FL) and converts the intensity of the fluorescent radiation (FL) or another parameter of the fluorescent radiation (FL), for example the value of a phase shift of the modulation of the intensity of the fluorescent radiation (FL), into a receiver output signal (S0), and
wherein a value or values of the receiver output signal (S0) depend on the value of the intensity of the fluorescent radiation (FL) or the value of the other parameter of the fluorescent radiation (FL), and
wherein the evaluation means (ADC, IF) are suitable and intended to detect and/or store and/or hold ready and/or pass on the value and/or values of the receiver output signal (S0) as a measured value,
characterized in that,
one or both of the following conditions hold,
"that the material of the circuit carrier (GPCB) is at least locally transparent for radiation having the pump radiation wavelength ($\lambda_{pmp}$) of the pump radiation (LB) in the radiation path between pump radiation source (PLED) and sensor element (NVD) and the pump radiation (LB) of the pump radiation source (PLED) passes this radiation path and/or
" that the material of the circuit carrier (GPCB) is at least locally transparent for radiation having the fluorescence radiation wavelength ($\lambda_{fl}$) of the fluorescence radiation (FL) in the radiation path between sensor element (NVD) and radiation receiver (PD) and the fluorescence radiation (FL) of the quantum dot, in particular of the paramagnetic center and/or in particular of the NV center and/or of the plurality of NV centers, of the sensor element (NVD) passes this radiation path,
and
that at least one or more or all of the components sensor element (NVD) and/or pump radiation source (PLED) and/or radiation receiver (PD) and/or evaluation means are mechanically attached to the circuit carrier (GPCB).

Feature 2: Magnetometer according to feature 1
wherein the circuit carrier (GPCB) is made of glass or other material transparent to pump radiation (LB) and/or fluorescent radiation (FL).

Feature 3: Magnetometer according to feature 1 or 2
wherein the circuit carrier (GPCB) is provided comprising at least one electrical lead and/or another electrical functional component such as a resistor and/or a capacitor and/or an inductor and/or a fuse and/or a contact in thick film technology or another build-up technology.

Feature 4: Magnetometer according to feature 1 or 3
wherein the circuit carrier (GPCB) is provided comprising at least one electrical lead and/or another electrical functional component such as a resistor and/or a capacitor and/or an inductor and/or a fuse and/or a contact in a layer build-up technique based on a formation of the layers by adhesive processes and/or in a lamination technique and/or a photolithography based technique.

Feature 5: Magnetometer according to one or more of the features 1 to 4
wherein the circuit carrier (GPCB) is provided comprising at least one electrical lead and/or other electrical functional component such as a resistor and/or a capacitor and/or an inductor and/or fuse and/or a contact and/or a diode and/or a transistor in thin film.

Feature 6: Magnetometer according to feature 3 and one or more of features 1 to 4.
   wherein at least one or more or all of the components sensor element (NVD) and/or pump radiation source (PLED) and/or radiation receiver (PD) and/or evaluation means (ADC, IF) are attached to a line and/or to a contact according to feature 3 by means of soldering and/or bonding, in particular electrically conductive bonding, and/or are electrically connected thereto, and wherein the line is mechanically connected to the circuit carrier (GPCB).

Feature 7: Magnetometer according to one or more of features 1 to 6
   wherein the magnetometer comprises an optical functional element that modifies the beam steering of at least a portion of the pump radiation (LB) and/or the fluorescence radiation (FL).

Feature 8: Magnetometer according to feature 7
   wherein this optical functional element is
      an optical filter, in particular a Bragg filter or
      a mirror and/or a mirror surface (ML) or
      a lens, in particular a microlens or a
      a digital optical functional element or
      a diffractive optical functional element or
      a photonic crystal and/or a photonic crystal structure or
      an optical or photonic grating or
      an optical resonator or
      an optical diaphragm or
      a wave sump or
      an optical shield or
      a prism or
      a beam splitter or
      an optical waveguide.

Feature 9: Magnetometer according to one or more of the features 1 to 8
   wherein an optical waveguide (LWL) is applied to the circuit carrier (GPCB) using thick-film technology or another construction technique.

Feature 10: Magnetometer according to feature 9
   wherein the optical waveguide comprises crystals having a quantum dot and/or
   wherein the optical waveguide comprises crystals having a paramagnetic center as a quantum dot, and/or
   wherein the waveguide comprises crystals having a plurality of paramagnetic centers as quantum dots, and
   wherein, in particular, the crystals comprising the paramagnetic centers may be diamond crystals comprising NV centers.

Feature 11: Magnetometer according to one or more of the features 1 to 10
   wherein device parts of the magnetometer measure the intensity of the fluorescence radiation (FL) emitted by the quantum dot, in particular by the paramagnetic center and/or in particular by the NV center and/or by the plurality of NV centers, on the side of the sensor element (NVD) from which the pump radiation (LB) is also incident on the paramagnetic centers.

Feature 12: Magnetometer according to one or more of the features 1 to 11
   comprising a compensating radiation source (CLED) and
   comprising a first amplifier (V1) and
   wherein the first amplifier (V1), possibly in cooperation with further subdevices, amplifies the receiver output signal (S0) of the radiation receiver (PD) and provides it with an offset, which may possibly also be 0, and generates a compensation transmission signal (S7) and
   wherein the compensation radiation source (CLED) emits a compensation radiation (CL) in response to the compensation transmission signal (S7), and
   wherein the compensating radiation source (CLED) radiates said compensating radiation (CL) into the radiation receiver (PD), and
   wherein the intensities of the compensating radiation (CL) and the fluorescent radiation (FL) are superimposed in the radiation receiver (PD) in a summing and/or multiplying manner, and
   where the receiver output signal (S0) then depends on this superposition and
   where the gain of the first amplifier (V1) and its offset are set to,
      that the control loop is stable and
      that this control loop regulates the value of the receiver output signal (S0) almost to an equal value except for the control error of the controller, which is preferably a P-controller or PI-controller or PID-controller.

Feature 13: Magnetometer according to feature 12
   wherein the circuit carrier (GPCB) comprises or is made of glass or other material transparent to the compensating radiation (CL).

Feature 14: Magnetometer according to feature 3 and one or more of features 12 to 13.
   wherein at least one or more or all of the components first amplifier (V1) and/or compensation radiation source (CLED) are attached to and/or electrically connected with a line and/or with a contact according to feature 3 by means of soldering and/or bonding, and
   wherein the line is mechanically connected to the circuit carrier (GPCB).

Feature 15: Magnetometer according to one or more of the features 12 to 14
   wherein the magnetometer comprises an optical functional element that alters the beam path of at least a portion of the compensating radiation (CL), and
   wherein in particular this optical functional element can be a mirror surface (ML).

Feature 16: Magnetometer according to one or more of the features 1 to 15
   wherein the pump radiation source (PLED) is modulated using a transmission signal (S5).

Feature 17: Magnetometer according to feature 16
   comprising a first amplifier (V1), which processes the receiver upstream signal (S0) of the radiation receiver (PD), to a demodulated signal (S4) and
   wherein the first amplifier (V1) is a synchronous demodulator (SDM) which uses the transmission signal (S5) or a signal derived from the transmission signal (S5) to demodulate the demodulated signal (S4) from the receiver output signal (S0).

Feature 18: Magnetometer according to feature 17
   comprising a second amplifier (V2), which processes the demodulated signal (S4) to a compensation transmission signal (S7) and
   wherein the second amplifier (V2) is a modulator which uses the transmission signal (S5) or a signal derived from the transmission signal (S5) for modulating the demodulated signal (S4) to the compensation transmission signal (S7) with a second gain and a second offset, and
   wherein the second amplifier (V2) adjusts the modulation of the compensation transmission signal (S7) complementary to the modulation of the pump radiation (LB), such that the receiver output signal (S0) is substantially a constant signal, and/or so that the receiver output signal (S0) essentially no longer has any signal component of the transmission signal (S5).

Feature 19: Magnetometer according to one or more of the features 1 to 18
wherein the quantum dot is or comprises a paramagnetic center, and
wherein the paramagnetic center is at least a NV center in diamond, and
wherein the sensor element (NVD) comprises diamond.

Feature 20: Magnetometer according to feature 19
wherein at least locally in the sensor element (NVD) the density of the NV centers is greater than 500 ppm and/or greater than 200 ppm and/or greater than 100 ppm and/or greater than 50 ppm and/or greater than 20 ppm and/or greater than 10 ppm and/or greater than 5 ppm and/or greater than 2 ppm and/or greater than 1 ppm and/or greater than 0.1 ppm and/or greater than 0.01 ppm greater than 0.0001 ppm and/or greater than 0,0002 ppm and/or greater than 0.0005 ppm and/or greater than 0.001 ppm and/or greater than 0.002 ppm and/or greater than 0.005 ppm and/or greater than 0.01 ppm and/or greater than 0.02 ppm and/or greater than 0.05 ppm and/or greater than 0.1 ppm and/or greater than 0.2 ppm and/or greater than 0.5 ppm based on the number of carbon atoms per unit volume, wherein in particular a density of >200 ppm is preferred.

Feature 21: Magnetometer according to one or more of features 1 to 21.
wherein the sensor element (NVD) comprises a plurality of crystals, in particular nanocrystals, and
wherein at least two of said crystals each comprise at least one quantum dot, in particular a paramagnetic center and/or in particular a NV center and/or a plurality of NV centers, in the sense of feature 1.

Feature 22: Magnetometer according to one or more of the features 1 to 21
wherein the sensor element (NVD) comprises a plurality of paramagnetic centers as defined in feature 1.

Feature 23: Magnetometer according to feature 22
wherein at least locally in the sensor element (NVD) the density of the paramagnetic centers in the sense of feature 1 is so high that the quantum dots or paramagnetic centers influence each other in such a way,
in that the fluorescence radiation (FL) decreases in intensity in a first range of values of the magnitude of the magnetic flux density B, in particular in a first range of values >10 mT, as the magnitude of the magnetic flux density B increases, or
in that the fluorescence radiation (FL) increases in intensity in a second range of values of the magnitude of the magnetic flux density B, in particular in a second range of values <1 mT, with an increasing magnitude of the magnetic flux density B,
wherein the first range of values is different from the second range of values, and
where the first value range does not overlap with the second value range.

Feature 24: Magnetometer according to one or more of the features 1 to 23
wherein the magnetometer comprises an optical filter (F1) which is transparent to radiation having the fluorescence radiation wavelength ($\lambda_{fl}$) of the fluorescence radiation (FL) and which is not transparent to radiation having the pump radiation wavelength ($\lambda_{pmp}$) of the pump radiation (LB), and
wherein the optical filter (F1) ensures that the pump radiation (LB) cannot reach the radiation receiver (PD) or can only reach it in a sufficiently attenuated manner, and
wherein the optical filter (F1) ensures that the fluorescence radiation (FL) can reach the radiation receiver (PD) sufficiently unattenuated.

Feature 25: Magnetometer according to one or more of the features 1 to 24
wherein the magnetometer comprises at least one functional element to increase the density of the intensity of irradiation, in particular using pump radiation (LB), of at least part of the sensor element (NVD).

Feature 26: Magnetometer according to one or more of the features 1 to 25
wherein the circuit carrier (GPCB) has a dielectric strength greater than 100 V and/or greater than 200 V and/or greater than 500 V and/or greater than 1 kV and/or greater than 2 kV and/or greater than 5 kV and/or greater than 10 kV and/or greater than 20 kV and/or greater than 50 kV and/or greater than 100 kV and/or greater than 200 kV and/or greater than 500 kV and/or greater than 1 MV and/or greater than 2 MV and/or greater than 5 MV.

Module (27-37)

Feature 27: Module, in particular for use in a magnetometer according to one or more of features 1 to 26,
comprising a sensor element (NVD) and
comprising a circuit carrier (GPCB) and
wherein the sensor element (NVD) comprises at least one quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal, and
wherein the quantum dot, in particular at least the paramagnetic center and/or in particular the NV center and/or in particular the plurality of NV centers, of the sensor element (NVD) is capable of emitting a fluorescence radiation (FL) having a fluorescence radiation wavelength ($\lambda_{fl}$) upon irradiation using a pump radiation (LB) having a pump radiation wavelength ($\lambda_{pmp}$), and
wherein the fluorescence radiation (FL) depends on the magnetic flux density B or another physical parameter at the location of the quantum dot, in particular at the location of the paramagnetic center and/or in particular at the location of the NV center and/or in particular at the location of the plurality of NV centers,
characterized by,
that the material of the circuit carrier (GPCB) is transparent for radiation having the pump radiation wavelength ($\lambda_{pmp}$) of the pump radiation (LB) and/or
that the material of the circuit carrier (GPCB) is transparent and
at least one line is connected to the circuit carrier (GPCB), so that the circuit carrier has at least this at least one line.

Feature 28: Module according to feature 27
wherein the quantum dot comprises a paramagnetic center, and
wherein the paramagnetic center comprises at least one NV center in diamond, and
wherein the sensor element (NVD) comprises diamond.

Feature 29: Module after feature 28
  wherein at least locally in the sensor element (NVD) the density of the NV centers is greater than 500 ppm and/or greater than 200 ppm and/or greater than 100 ppm and/or greater than 50 ppm and/or greater than 20 ppm and/or greater than 10 ppm and/or greater than 5 ppm and/or greater than 2 ppm and/or greater than 1 ppm and/or greater than 0.1 ppm and/or greater than 0.01 ppm greater than 0.0001 ppm and/or greater than 0.0002 ppm and/or greater than 0.0005 ppm and/or greater than 0.001 ppm and/or greater than 0.002 ppm and/or greater than 0.005 ppm and/or greater than 0.01 ppm and/or greater than 0.02 ppm and/or greater than 0.05 ppm and/or greater than 0.1 ppm and/or greater than 0.2 ppm and/or greater than 0.5 ppm based on the number of carbon atoms per unit volume, wherein in particular a density of >200 ppm is preferred.

Feature 30: Module according to one or more of features 27 to 29
  wherein the sensor element (NVD) comprises a plurality of crystals, in particular nanocrystals, and
  wherein at least two of said crystals each comprise at least one paramagnetic center as defined in feature 27.

Feature 31: Module according to one or more of features 27 to 30
  wherein the sensor element (NVD) comprises a plurality of paramagnetic centers as defined in feature 27.

Feature 32: Module according to feature 31
  wherein the density of the paramagnetic centers in the sense of feature 25 is sufficiently high that the paramagnetic centers influence each other in such a way,
  in that the fluorescence radiation (FL) of the paramagnetic centers decreases in intensity in at least one value range of the magnitude of the magnetic flux density B, in particular in a value range >10 mT, with an increasing magnitude of the magnetic flux density B, or
  in that the fluorescence radiation (FL) increases in intensity in at least one value range of the magnitude of the magnetic flux density B, in particular in a value range <1 mT, with an increasing magnitude of the magnetic flux density B.

Feature 33: Module according to one or more of features 27 to 32
  wherein the circuit carrier (GPCB) comprises optical functional elements.

Feature 34: Module according to feature 33
  wherein at least one of the optical functional elements is manufactured in digital optics.

Feature 35: Module according to one or more of features 27 to 34
  wherein the at least one lead of the circuit carrier (GPCB) is electrically connected to at least one terminal of at least one electronic and/or electrical component by soldering and/or electrically conductive bonding, and
  where the line is mechanically connected to the circuit carrier (GPCB).

Feature 36: Module after feature 35
  wherein the electronic component is an opto-electronic component that is optically coupled to the circuit carrier (GPCB).

Feature 37: Module after feature 36
  wherein the electronic component is an opto-electronic component that is optically coupled via the circuit carrier (GPCB) to one or more quantum dots, in particular one or more paramagnetic centers and/or in particular a plurality of paramagnetic centers, of the sensor element (NVD).

Current sensor (38-42)
  Feature 38: Current sensor
    comprising a magnetometer according to one or more of the features 1 to 26 and
    comprising an electrical conductor (LTG),
    wherein the electrical conductor (LTG) is arranged with respect to the sensor element (NVD) in such a way that the additional magnetic flux density B generated by an electrical current flow in the electrical conductor (LTG) can influence the intensity of the fluorescence radiation (FL).

Feature 39: Current sensor according to feature 38
    wherein the electrical conductor (LTG) is not straight but bent at least at one point.

Feature 40: Current sensor according to feature 39
    wherein the bending of the electrical conductor (LTG) defines a plane and
    wherein the sensor element (NVD) and/or the quantum dot, in particular the paramagnetic center and/or the plurality of paramagnetic centers, is mounted not more than 0.5 mm and/or not more than 1 mm and/or not more than 2 mm and/or not more than 5 mm and/or not more than 10 mm away from said plane, a distance of not more than 0.5 mm being preferred.

Feature 41: Current sensor according to one or more of features 38 to 40.
    wherein the current sensor detects the time course of the current value of the electric current in the electric conductor (LTG) as a current signal and
    wherein the current sensor has means, in particular filters and amplifiers, for separating an information and/or data signal contained in the current signal from the current signal as an information signal.

Feature 42: Current sensor according to feature 41
    where the information signal of the current sensor is used
      for the control of a device and/or
      for data transmission and/or
      for information transmission and/or
      for signal transmission.

Feature 43: Current sensor, in particular according to one or more of features 38 to 42.
    wherein a feature vector extraction unit of the current sensor extracts an information signal from the time course of the current measurement values and converts it to a feature vector signal and/or converts data derived from the information signal to a feature vector signal.

Feature 44: Current sensor according to feature 43
    wherein a sub-device of the current sensor executes a neural network model and/or an HMM model, which using this neural network model and/or this HMM model analyzes the feature vector signal and generates one or more signalizations, in particular for a higher-level control unit.

Power supply device (45-49)
  Feature 45: Power supply device
    wherein the power supply device comprises at least one magnetometer according to one or more of features 1 to 26 and/or a module according to one or more of features 27 to 37 and/or a current sensor according to one or more of features 38 to 40.

Feature 46: Energy supply facility according to feature 45
    wherein the power supply device comprises or is one of the following devices or interacts with one of the following devices:
      a transformer,
      a high current switch,
      a thyristor, a diode,
a diac,
a triac,
a transistor,
a power controller,
a current regulator,
a voltage regulator,
a voltage transformer,
a power amplifier,
an H-bridge,
a half bridge,
an inverter,
a rectifier,
an overhead power line,
a high-voltage power line,
a generator,
an engine,
a turbine,
a supply line,
an internal combustion engine,
a fuel cell,
a battery,
an accumulator,
a transmitting or receiving coil for the transmission of electrical energy,
a charging station, especially for electric vehicles,
a thermoelectric converter,
a photoelectric energy converter,
an energy harvester.

Feature 47: Power supply device
wherein the power supply device comprises at least one quantum dot, in particular a paramagnetic center and/or a plurality of paramagnetic centers.

Feature 48: Power supply device according to one or more of features 45 to 47.
wherein the power supply device comprises or is one of the following devices or interacts with one of the following devices:
a transformer,
a high current switch,
a thyristor,
a diode,
a diac,
a triac,
a transistor,
a power controller,
a current regulator,
a voltage regulator,
a voltage transformer,
a power amplifier,
an H-bridge,
a half bridge,
an inverter,
a rectifier,
an overhead power line,
a high-voltage power line,
a generator,
an engine,
a turbine,
a supply line,
an internal combustion engine,
a fuel cell,
a battery,
an accumulator,
a transmitting or receiving coil for the transmission of electrical energy,
A charging station, especially for electric vehicles
a thermoelectric converter,
a photoelectric energy converter,
an energy harvester.

Feature 49: Power supply device according to one or more of the features 45 to 48
wherein a current sensor according to feature 42 controls the power supply device or a partial device thereof, in particular by means of a measured value of this current sensor.

Battery sensor (50)

Feature 50: Battery sensor for monitoring the function of a battery or accumulator or other electrical energy storage device, referred to synonymously with battery in this document,
wherein the battery sensor comprises at least one magnetometer according to one or more of the features 1 to 26 and/or a module according to one or more of the features 27 to 37 and/or a current sensor according to one or more of the features 38 to 42.

Power monitoring device (51-55)

Feature 51. Power monitoring device, in particular a residual current circuit breaker or a fuse,
comprising an electrical conductor (LTG) and
having at least one first current sensor according to one or more of the features 38 to 42, and
comprising at least one second current sensor according to one or more of the features 38 to 42 and
comprising a measured value evaluation device,
wherein the electrical conductor (LTG) has a first conductor position and
wherein the electrical conductor (LTG) has a second conductor position different from the first conductor position and spaced along the intended current flow in the electrical conductor (LTG), and
wherein the first current sensor determines the electrical current in the electrical conductor (LTG) at the first conductor position in the form of a first measured value, and
wherein the second current sensor determines the electrical current in the electrical conductor (LTG) at the second conductor position in the form of a second measured value, and
wherein the measured value evaluation device compares the first measured value with the second measured value and forms and provides a comparison value and/or transmits it to a higher-level device.

Feature 52: Power monitoring device according to feature 51
wherein the measured value evaluation device generates the comparison value by forming the difference between the first measured value and the second measured value and/or
wherein the measured value evaluation device generates the comparison value by dividing the first measured value by the second measured value and/or
wherein the measured value evaluation device generates the comparison value by dividing the second measured value by the first measured value.

Feature 53: Power monitoring device according to feature 51 and/or 52.
wherein the measured value evaluation device has means, in particular a switch, for interrupting the current flow in the electrical conductor (LTG) as a function of the comparison value.

Feature 54: Performance monitoring device according to one or more of features 51 to 53.
- wherein the measured value evaluation device
- interrupts the current flow in the electrical conductor (LTG) in and/or
- causes such an interruption of the current flow in the electrical conductor (LTG) or
- causes a reduction of the current flow in the electrical conductor (LTG) or
- causes a reduction of the voltage between the potential of the electrical conductor (LTG) and a reference potential,
- if the first measured value deviates from the second measured value by more than $10^{-10}$ of the amount of the first measured value and/or by more than $10^{-9}$ of the amount of the first measured value and/or by more than $10^{-8}$ of the amount of the first measured value and/or by more than $10^{-7}$ of the amount of the first measured value and/or by more than $10^{-6}$ of the amount of the first measured value and/or by more than $10^{-5}$ of the amount of the first measured value and/or by more than $10^{-4}$ of the amount of the first measured value and/or by more than $10^{-3}$ of the amount of the first measured value.

Feature 55: Performance monitoring device according to one or more of features 51 to 54.
- wherein the measured value evaluation device
- interrupts the current flow in the electrical conductor (LTG) or
- causes such an interruption of the current flow in the electrical conductor (LTG) or
- causes a reduction of the current flow in the electrical conductor (LTG) or
- causes a reduction of the voltage between the potential of the electrical conductor (LTG) and a reference potential,
- if the first measured value differs from the second measured value by more than 100 mA from the first measured value and/or by more than 50 mA from the first measured value and/or by more than 20 mA from the first measured value and/or by more than 10 mA from the first measured value and/or by more than 5 mA from the first measured value and/or by more than 2 mA from the first measured value and/or by more than 1 mA from the first measured value and/or by more than 0.5 mA from the first measured value and/or by more than 0.2 mA from the first measured value and/or by more than 0.1 mA from the first measured value and/or by more than 0.05 mA from the first measured value and/or by more than 0.02 mA from the first measured value and/or by more than 0.01 mA from the first measured value and/or by more than 0.005 mA from the first measured value and/or by more than 0.002 mA from the first measured value and/or by more than 0.001 mA from the first measured value. The later user of the technical teaching of this document will determine the threshold depending on the respective application. Here, the interference fields in the environment of the sensor play a decisive role.

Feature 56: Performance monitoring device according to one or more of features 51 to 54.
- wherein the power monitoring device extracts an information signal from temporal changes of the first and/or second measured value, and
- wherein the power monitoring device provides and/or signals and/or signals the extracted information signal and/or data derived therefrom to a higher-level device.

Performance Monitoring Device Comprising a Neural Network Model (57)
Feature 57: Power monitoring device, in particular according to one or more of features 51 to 56,
- wherein a sub-device executes a neural network model and/or an HMM model.

Quantum Optical System (58)
Feature 58: Quantum optical system
- comprising at least one quantum dot, in particular comprising one or more paramagnetic centers in one or more crystals and/or in particular comprising at least one plurality of paramagnetic centers in one or more crystals and/or in particular comprising one or more NV centers in one or more diamond crystals and/or in particular comprising at least one plurality of NV centers in one or more diamond crystals and/or in particular comprising one or more SiV centers in one or more diamond crystals and/or in particular comprising one or more G centers in one or more silicon crystals,
- comprising at least one circuit carrier (GPCB),
- especially with a circuit carrier (GPCB) made of an optically transparent material,
- wherein the quantum dot can interact with an optical radiation and
- wherein the circuit carrier (GPCB) interacts with the quantum dot such that the circuit carrier (GPCB) acts as an optical functional element for at least a portion of the optical radiation that can interact or has interacted with the quantum dot.

Circuit Carrier (59-60)
Feature 59: Circuit carrier (GPCB)
- where the circuit carrier (GPCB) is intended to be used,
  - in a magnetometer according to features 1 to 26 and/or
  - in a module according to features 27 to 37 and/or
  - in a current sensor according to features 38 to 42 and/or
  - in a power supply device according to features 45 to 49 and/or
  - in a battery sensor according to feature 50 and/or
  - in a power monitoring device according to feature 51 to 57 and/or
  - in a quantum optical system according to feature 58.

Feature 60: Circuit carrier (GPCB) after feature 59
- whereby in the circuit carrier (GPCB) optical functional elements such as in particular
  - optical filters, especially Bragg filters and/or
  - mirrors and/or mirror surfaces (ML) and/or
  - lenses, especially micro-lenses and/or
  - digital optical functional elements and/or
  - diffractive optical functional elements and/or
  - photonic crystals and photonic crystal structures and/or
  - an optical or photonic grating and/or
  - resonators and/or
  - optical apertures,
  - a shaft sump and/or
  - optical shields and/or
  - a prism and/or
  - a beam splitter and/or
  - an optical waveguide
- are incorporated.

Vehicle (61)
Feature 61: Vehicle and/or flying vehicle and/or missile and/or projectile and/or surface or submerged vehicle and/or a surface or submerged floating body, hereinafter referred to as vehicle, wherein the vehicle comprises a subsystem including a sensor element (NVD); and wherein the sensor element (NVD) comprises a quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal, and wherein the vehicle can comprise as a subsystem
- at least one magnetometer according to one or more of the features 1 to 26 and/or
- at least one module according to one or more of the features 27 to 37 and/or
- at least one current sensor according to one or more of the features 38 to 42 and/or
- at least one quantum optical system according to feature 58 and/or at least one circuit carrier (GPCB) according to one or more of the features 59 to 60 and/or
- at least one optical device according to one or more of the features 83 to 86 and/or
- at least one sensor system according to one or more of the features 87 to 89 and/or
- at least one quantum technological device according to feature 90 and wherein the subsystem determines and/or outputs and/or transmits and/or provides a measured value which depends on the value of a physical parameter within the vehicle, in particular on a magnetic flux density B and/or an electric field strength and/or a temperature and/or on an orientation of the vehicle or a vehicle part and/or on a speed of the vehicle or a vehicle part and/or on an acceleration of the vehicle or a vehicle part acting on the sensor element (NVD).

Method of Manufacturing a Circuit Carrier (62-69)

Feature 62: Method of manufacturing a circuit carrier (GPCB) comprising the steps
- Providing a circuit carrier blank (GPCB);
- Application of a Glasfrit paste to the circuit carrier blank (GPCB) by a printing or dispensing process or other suitable application process, whereby the application results in a linear glass frit structure, at least locally;
- Performing temperature treatment to re-melt the local linear glass frit structure to a linear glass structure;
- Using the linear glass structure as an optical waveguide (LWL).

Feature 63: Method of manufacturing a circuit carrier (GPCB) comprising the steps:
- providing a circuit carrier blank (GPCB);
- application of a Glasfrit paste to the circuit carrier blank by a printing or dispensing or painting process, whereby the application results in a glass frit structure, at least locally;
- performing a temperature treatment to melt the glass frit structure into a glass structure of the circuit carrier (GPCB);
- using the glass structure of the circuit carrier (GPCB) as an optical functional element of the circuit carrier (GPCB), in particular as a lens and/or filter and/or aperture and/or mirror and/or photonic crystal and/or Bragg filter and/or Fabry-Perot interferometer.

Feature 64: Method of manufacturing a circuit carrier (GPCB) according to one or more of features 62 to 63.
wherein a glass frit paste used to make the circuit carrier (GPCB) has ferromagnetic particles.

Feature 65: Method of manufacturing a circuit carrier (GPCB) according to one or more of features 62 to 65.
wherein a glass frit paste used to make the circuit carrier (GPCB) has colored particles.

Feature 66: Method of manufacturing a circuit carrier (GPCB) according to one or more of features 62 to 65.
wherein a glass frit paste used to make the circuit carrier (GPCB) has particles, absorb the radiation having the pump radiation wavelength ($\lambda_{pmp}$) of the pump radiation (LB) and/or
absorb the radiation having the fluorescence radiation wavelength ($\lambda_{fl}$) of the fluorescence radiation (FL) and/or
absorb the radiation having the compensation radiation wavelength ($\lambda_{ks}$) compensation radiation (CL).

Feature 67: Method of manufacturing a circuit carrier (GPCB) according to one or more of features 62 to 67.
wherein a first glass frit paste used to form the circuit carrier (GPCB) comprises particles which, when molten, provide a first optically transparent material having a first refractive index, and
wherein a second glass frit paste used to form the circuit carrier (GPCB) comprises particles which, when molten, provide a second optically transparent material having a second refractive index, and
wherein the first refractive index is different from the second refractive index.

Feature 68: Method of manufacturing a circuit carrier (GPCB) according to one or more of features 62 to 67.
wherein a glass frit paste used for the fabrication of the circuit carrier (GPCB) comprises a quantum dot, in particular one or more crystals having one or more paramagnetic centers and/or in particular one or more crystals having at least a plurality of paramagnetic centers and/or in particular one or more diamond crystals having one or more NV centers and/or in particular one or more diamond crystals having at least a plurality of NV centers.

Feature 69: Method of manufacturing a circuit carrier (GPCB) according to feature 68.
wherein one or more crystals having paramagnetic centers comprise
- diamond crystals comprising NV centers and/or
- diamond crystals comprising ST1 centers and/or
- diamond crystals comprising L2 centers and/or
- diamond crystals comprising SiV centers and/or
- silicon crystals comprising G centers and/or
- diamond crystals and/or silicon crystals and/or silicon carbide crystals or other crystals having other paramagnetic centers.

Glass Frit Paste, in Particular for a Method of Manufacturing a Circuit Carrier (70-71)

Feature 70: Glass frit paste, in particular for a process according to one or more of features 62 to 69.
wherein a glass frit paste comprises crystals having quantum dots, in particular having one or more paramagnetic centers and/or in particular having at least a plurality of paramagnetic centers and/or having one or more NV centers and/or having at least a plurality of NV centers.

Feature 71: Glass frit paste after feature 70
wherein the glass frit paste comprises glass powder particles and/or other optically at least partially transparent fusible particles.

Feature 72: Glass frit paste according to one or more of features 70 to 71.
  wherein one or more crystals having paramagnetic centers comprise
  diamond crystals comprising NV centers and/or
  diamond crystals comprising ST1 centers and/or
  diamond crystals comprising L2 centers and/or
  diamond crystals comprising SiV centers and/or
  silicon crystals comprising G centers and/or
  diamond crystals and/or silicon crystals and/or silicon carbide crystals or in other crystals having other paramagnetic centers.

Method of Manufacturing a Circuit Carrier by Laminating or Bonding Technique (73-80)

Feature 73: Method for manufacturing a circuit carrier (GPCB) comprising the steps of
  Providing a circuit carrier blank (GPCB);
  Application of an optically transparent sheet to the circuit carrier blank (GPCB) by lamination or bonding or by means of another suitable application process;
  Structuring the optically transparent sheet before or after application so that sheet structures are created;
  Using a sheet structure of the sheet structures as an optical functional element.

Feature 74: Method of manufacturing a circuit carrier (GPCB) according to feature 73.
  wherein using a sheet structure of the sheet structures as an optical functional element is a use as a lens and/or filter and/or aperture and/or mirror and/or photonic crystal and/or digital optical functional element and/or diffractive optical functional element and/or Bragg filter and/or Fabry-Perot interferometer.

Feature 75: Method of manufacturing a circuit carrier (GPCB) according to one or more of features 73 to 74 comprising the step of
  Application of a second sheet to the circuit carrier blank (GPCB) by lamination or bonding or by means of another suitable application process,
  said second sheet used for the manufacture of the circuit carrier (GPCB) having ferromagnetic particles in its sheet material.

Feature 76: Method of manufacturing a circuit carrier (GPCB) according to one or more of features 73 to 75.
  Application of a third optically transparent sheet to the circuit carrier blank (GPCB) by lamination or bonding or by means of another suitable application process,
    wherein said third optically transparent sheet used for the fabrication of the circuit carrier (GPCB) has colored particles in its sheet material.

Feature 77: Method of manufacturing a circuit carrier (GPCB) according to one or more of features 73 to 76.
  application of a fourth sheet to the circuit carrier blank (GPCB) by lamination or bonding or by means of another suitable application process,
  wherein said fourth sheet used to make the circuit carrier (GPCB) has particles in its sheet material,
    wherein the particles or sub-devices of the particles
      absorb radiation having the pump radiation wavelength ($\lambda_{pmp}$) of the pump radiation (LB) and/or
      absorb radiation having a fluorescence radiation wavelength ($\lambda_{fl}$) of the fluorescence radiation (FL) and/or
      absorb radiation having the compensation radiation wavelength ($\lambda_{ks}$) of the compensation radiation (CL) and
    wherein the fourth sheet may be transparent to radiation having the pump radiation wavelength ($\lambda_{pmp}$) of the pump radiation (LB) when the pump radiation is not absorbed, and
    wherein the fourth sheet may be transparent to radiation having the fluorescence radiation wavelength ($\lambda_{fl}$) of the fluorescence radiation (FL) when not absorbed, and
    wherein the fourth sheet may be transparent to radiation having the compensation radiation wavelength ($\lambda_{ks}$) of the compensating radiation (CL) when it is not-absorbed.

Feature 78: Method of manufacturing a circuit carrier (GPCB) according to one or more of features 73 to 77.
  wherein a fifth sheet used for the fabrication of the circuit carrier (GPCB) has a first refractive index, and
  wherein a sixth sheet used to form the circuit carrier (GPCB) has a second refractive index, and
  wherein the first refractive index is different from the second refractive index.

Feature 79: Method of manufacturing a circuit carrier (GPCB) according to one or more of features 73 to 78.
  wherein a seventh sheet used for the production of the circuit carrier (GPCB) has quantum dots in its sheet material, in particular crystals comprising paramagnetic centers and/or in particular crystals comprising at least a plurality of paramagnetic centers and/or in particular diamond crystals comprising NV centers and/or in particular diamond crystals comprising at least a plurality of NV centers.

Feature 80: Method of manufacturing a circuit carrier (GPCB) according to feature 79.
  wherein one or more crystals having paramagnetic centers are
    Diamond crystals having NV centers and/or
    Diamond crystals having ST1 centers and/or
    Diamond crystals having L2 centers and/or
    Diamond crystals having SiV centers and/or
    Silicon crystals having G centers and/or
    diamond crystals and/or silicon crystals and/or silicon carbide crystals or in other crystals having other paramagnetic centers.

Sheet for a Method of Manufacturing a Circuit Carrier ($81^{-82}$)

Feature 81: Sheet, in particular for a process according to one or more of features 73 to 80.
  wherein the sheet has quantum dots in its sheet material, in particular crystals comprising paramagnetic centers and/or in particular crystals comprising at least a plurality of paramagnetic centers and/or in particular diamond crystals comprising NV centers and/or in particular diamond crystals comprising at least a plurality of NV centers.

Feature 82: slide after feature 81
  wherein one or more crystals having paramagnetic centers are
    Diamond crystals having NV centers and/or
    Diamond crystals having ST1 centers and/or
    Diamond crystals having L2 centers and/or
    Diamond crystals having SiV centers and/or
    Silicon crystals having G centers and/or
    diamond crystals and/or silicon crystals and/or silicon carbide crystals or in other crystals having other paramagnetic centers.

Optical Device (83-86)
  Feature 83: optical device
    having an optical functional element which has been produced by a method according to one or more of the features 62 to 69 and/or
    comprising an optical function element,
    wherein the optical functional element comprises a linear glass structure and/or
    wherein the optical functional element has or is a glass structure comprising at least one quantum dot, in particular comprising one or more crystals comprising one or more paramagnetic centers and/or in particular comprising one or more crystals comprising at least a plurality of paramagnetic centers and/or in particular comprising one or more diamond crystals comprising one or more NV centers and/or in particular comprising one or more diamond crystals comprising at least a plurality of NV centers.
  Feature 84: optical device according to feature 83
    comprising at least one optically active electronic component, in particular comprising an LED or a laser,
    which is optically coupled to the optical functional element, which in particular can be produced by a method according to one or more of the features 62 to 69.
  Feature 85: optical device according to feature 83 and/or 84
    having at least one optically sensitive electronic component, in particular having a photodiode and/or one or more CCD elements and/or a SPAD and/or an AVD,
    which is optically coupled to the optical functional element, which in particular can be produced by a method according to one or more of the features 62 to 80.
  Feature 86: optical device according to one or more of features 83 to 85,
    wherein the device comprises at least one electrical functional element, which may in particular be a functional element from the following list:
      a conductor,
      a microstrip line,
      a tri-plate line,
      an antenna,
      a coil,
      a transformer,
      an electrode,
      a contact surface,
      a capacitor,
      a diode,
      a transistor,
      a micro-integrated circuit,
      a regulator (controller),
      an amplifier,
      an electrical filter,
      an electrical resistance,
      an electric heating element,
      an electrical fuse,
      a thermistor,
      one LED,
      a laser,
      a photo receiver,
      a sensor element comprising an electrical output signal.
      direct contact sensor.
Sensor System (87-89)
  Feature 87: Sensor system
    having a sensor element (NVD) that changes an optical property as a function of a physical quantity, and
    having an optical device according to one or more of features 83 to 86 and according to feature 85 and feature 86,
    wherein the sensor element (NVD) is optically coupled to the optical device, and
    wherein the optical device optically detects the optical property of the sensor element (NVD) and converts it, by means of the optically sensitive electronic component, into a receiver output signal (S0) comprising a signal value that can be used or is used as a measure of a value of the physical quantity or that is intended to be used as such a value.
  Feature 88: Sensor system according to feature 87
    wherein the physical quantity is the magnetic flux density B.
  Feature 89: Sensor system according to feature 88
    wherein the sensor element (NVD) comprises a quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal.
Quantum Technological Device (90)
  Feature 90: quantum technological device
    comprising an optical device according to one or more of the features 83 to 86,
    wherein an optical functional element of the device is a quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal.
Quantum Computer (91)
  Feature 91: Quantum computer
    comprising an optical device according to one or more of the features 83 to 86.
Use in Ionizing Radiation Field (92-93)
  Feature 92: Use of an optical device
    in an environment comprising engineered, non-natural ionizing particle and/or photon radiation having a wavelength shorter than 10 nm, wherein the radiation level is more than 1000% above the normal, natural radiation level,
    wherein the optical device comprises an optical functional element, and
    wherein the optical functional element comprises at least one quantum dot, in particular one or more crystals having one or more paramagnetic centers and/or in particular one or more crystals having at least a plurality of paramagnetic centers and/or in particular one or more diamond crystals having one or more NV centers and/or in particular one or more diamond crystals having at least a plurality of NV centers, and
    wherein the optical device can be
      a magnetometer according to one or more of the features 1 to 26 and/or
      a module according to one or more of the features 27 to 37 and/or
      a current sensor according to one or more of the features 38 to 42 and/or
      a power supply device according to one or more of the features 45 to 49 and/or
      a battery sensor according to feature 50 and/or a power monitoring device according to one or more of the features 51 to 57 and/or a quantum optical system according to feature 58 and/or a circuit carrier according to one or more of the features 59 to 60 and/or a vehicle according to feature 61 and/or an optical device according to one or more of the features 83 to 86 and/or a sensor system according to one or more of the features 87 to 89 and/or a quantum technological device according to feature 90 and/or around a quantum computer according to feature 91.

Feature 93: Device for technical or medical use of ionizing radiation wherein the device comprises an optical functional element, and wherein the optical functional element comprises at least one quantum dot, in particular one or more crystals having one or more paramagnetic centers and/or in particular one or more crystals having at least a plurality of paramagnetic centers and/or in particular one or more diamond crystals having one or more NV centers and/or in particular one or more diamond crystals having at least a plurality of NV centers, and wherein the device might be a magnetometer according to one or more of the features 1 to 26 and/or a module according to one or more of the features 27 to 37 and/or a current sensor according to one or more of the features 38 to 42 and/or a power supply device according to one or more of the features 45 to 49 and/or a battery sensor according to feature 50 and/or a power monitoring device according to one or more of the features 51 to 57 and/or a quantum optical system according to feature 58 and/or a circuit carrier according to one or more of the features 59 to 60 and/or a vehicle according to feature 61 and/or an optical device according to one or more of the features 83 to 86 and/or a sensor system according to one or more of the features 87 to 89 and/or a quantum technological device according to feature 90 and/or around a quantum computer according to feature 91.

Direct Contact Sensor System (94)

Feature 94: Direct contact sensor system wherein the direct contact sensor system comprises a sensor element (NVD) made of a material, in particular diamond, having a material surface, and wherein the sensor element (NVD) comprises a quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal, and wherein a material surface of the sensor element (NVD) is directly mechanically accessible via at least a portion of an outer surface of the sensor element (NVD), and wherein the mechanical Vickers hardness of this directly accessible material surface is greater than 40 GPa (limit for super hard materials) and wherein the direct contact sensor system can comprise a magnetometer according to one or more of the features 1 to 26 and/or a module according to one or more of the features 27 to 37 and/or a current sensor according to one or more of the features 38 to 42 and/or a quantum optical system according to feature 58 and/or a circuit carrier according to one or more of the features 59 to 60 and/or an optical device according to one or more of the features 83 to 86 and/or a sensor system according to one or more of features 87 to 89 and/or a quantum technological device according to feature 90 as a subsystem and wherein said subsystem comprises the sensor element (NVD) in the case of the presence of the subsystem, and wherein the direct contact sensor system determines and/or outputs and/or transmits and/or provides a measured value that depends on the value of a physical parameter acting on the sensor element (NVD).

Sensor Element (95)

Feature 95: Sensor element (NVD)

in particular for a magnetometer according to one or more of the features 1 to 26 and/or for a module according to one or more of the features 27 to 37 and/or for a current sensor according to one or more of the features 38 to 42 and/or for a power supply device according to one or more of the features 45 to 49 and/or for a battery sensor according to feature 50 and/or for a power monitoring device according to one or more of the features 51 to 57 and/or for a quantum optical system according to feature 58 and/or for a circuit carrier according to one or more of the features 59 to 60 and/or for an optical device according to one or more of the features 83 to 86 and/or for a sensor system according to one or more of the features 87 to 89 and/or for a quantum technological device according to feature 90 and/or for a quantum computer according to feature 91, wherein the sensor element (NVD) comprises one or more quantum dots, in particular one or more paramagnetic centers in one or more crystals and/or in particular at least one plurality of paramagnetic centers and/or in particular one or more NV centers in one or more diamond crystals and/or in particular at least one plurality of NV centers in one or more diamond crystals and/or in particular one or more SiV centers in one or more diamond crystals and/or in particular one or more G centers in one or more silicon crystals, and comprising a surface portion of a sensor element surface having the one or more quantum dots, wherein the density of the quantum dots relative to the surface part is modulated using a density function as a function of the position on the surface part and/or as a Quantum system (96-98)

Feature 96: Quantum system
having a pump radiation source (PLED) which emits pump radiation (LB) as a function of a transmission signal ($I_{pump}$, S5), and
having a sensor element (NVD) comprising at least one quantum dot, in particular comprising at least one paramagnetic center in a crystal and/or in particular comprising at least one plurality of paramagnetic centers and/or in particular comprising at least one NV center in at least one diamond crystal and/or in particular comprising at least one plurality of NV centers in a diamond crystal and/or in particular comprising at least one SiV center in a diamond crystal and/or in particular comprising at least one G center in a silicon crystal, and
comprising a drive circuit (IC) that generates the transmission signal ($I_{pump}$, S5),
wherein the quantum dot or dots emit fluorescence radiation (FL) as a function of a physical quantity, in particular as a function of the magnitude of the magnetic flux density B at the location of the respective quantum dot, as a function of the intensity of the irradiated pump radiation (LB), and
wherein the transmission signal ($I_{pum}$, S5) is periodic in time having a pump period, and
wherein over at least 5 pump periods the magnitude of the transmission signal ($I_{pump}$, S5) has an average value, and
wherein in a first period the magnitude of the transmission signal ($I_{pump}$, S5) is above said average value during said at least 5 pumping periods, and
wherein in a second period the magnitude of the transmission signal ($I_{pump}$, S5) is below said average value during said at least 5 pumping periods, and
wherein the ratio of the first amount of the first time length of the first period divided by the second amount of the second time length of the second period is different from 0.5.

Feature 97: Quantum system
having a pump radiation source (PLED) which emits pump radiation as a function of a transmission signal ($I_{pump}$, S5), and
having a sensor element (NVD) comprising at least one quantum dot, in particular comprising at least one paramagnetic center and/or in particular comprising at least one plurality of paramagnetic centers and/or in particular comprising at least one NV center in at least one diamond crystal and/or in particular comprising at least one plurality of NV centers in one or more diamond crystals and/or in particular comprising at least one SiV center in a diamond crystal and/or in particular comprising at least one G center in at least one silicon crystal, and
comprising a drive circuit (IC) that generates the transmission signal ($I_{pump}$, S5),
wherein the quantum dot or dots emit fluorescence radiation (FL) as a function of a physical quantity, in particular as a function of the magnitude of the magnetic flux density B at the location of the respective quantum dot, as a function of the intensity of the irradiated pump radiation (LB), and function of the depth perpendicular to the surface part in the region of this surface part, and
said density modulation comprising at least a spatially periodic component.

wherein the transmission signal ($I_{pump}$, S5) is modulated using a spreading code.

Feature 98: Quantum system after feature 97
comprising a signal generator (G) and
comprising a pump radiation source (PLED) and
comprising a sensor element (NVD) comprising one or more quantum dots, in particular comprising one or more paramagnetic centers and/or in particular comprising at least one plurality of paramagnetic centers and/or in particular comprising one or more NV centers in one or more diamond crystals and/or in particular comprising at least one plurality of NV centers in one or more diamond crystals and/or in particular comprising one or more SiV centers in one or more diamond crystals and/or in particular comprising one or more G centers in one or more silicon crystals,
comprising a radiation receiver (PD),
wherein the signal generator (G) generates the transmission signal (S5) and
wherein the transmission signal (S5) is band-limited in a transmission frequency band having a lower transmission frequency and an upper transmission frequency, and
wherein the magnitude of the lower transmission frequency is different from the magnitude of the upper transmission frequency, and
wherein in particular the transmission signal (S5) can be modulated using a spreading code and
wherein in particular the spreading code can be a random signal or a band-limited pseudo-random signal, and
wherein the pump radiation source (PLED) emits pump radiation (LB) in response to the transmission signal (S5), and
wherein the pump radiation (LB) irradiates the sensor element (NVD) at least locally and
the sensor element (NVD) emitting fluorescence radiation (FL) as a function of the intensity of the pump radiation (LB) and as a function of a further physical quantity, in particular as a function of the magnetic flux density B, and
wherein the fluorescence radiation (FL) enters the radiation receiver (PD), and
wherein the radiation receiver (PD) converts the signal of the fluorescent radiation (FL) into a receiver output signal (S0), and
wherein a synchronous demodulator (SDM) demodulates the receiver output signal (S0) using the transmission signal (S5) to form a demodulated signal (S4).

Receiver (99-101)

Feature 99: Receiver
wherein the receiver comprises a sensor element (NVD); and
wherein the sensor element (NVD) comprises a quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal, and
whereby the receiver may comprise
a magnetometer according to one or more of the features 1 to 26 and/or
a module according to one or more of the features 27 to 37 and/or
a current sensor according to one or more of the features 38 to 42 and/or a quantum optical system according to feature 58 and/or a circuit carrier according to one or more of the features 59 to 60 and/or an optical device according to one or more of the features 83 to 86 and/or a sensor system according to one or more of features 87 to 89 and/or a quantum technological device according to feature 90 or might be a subsystem a magnetometer according to one or more of the features 1 to 26 and/or a module according to one or more of the features 27 to 37 and/or a current sensor according to one or more of the features 38 to 42 and/or a quantum optical system according to feature 58 and/or a circuit carrier according to one or more of the features 59 to 60 and/or an optical device according to one or more of the features 83 to 86 and/or a sensor system according to one or more of features 87 to 89 and/or a quantum technological device according to feature 90 and wherein said subsystem comprises the sensor element (NVD) in the case of the presence of the subsystem, and wherein the receiver determines and/or outputs and/or transmits and/or provides a temporal measured value progression from a sequence of measured values as a received signal, which depends on the value of a physical parameter, in particular an electromagnetic wave, which acts on the sensor element (NVD).

Feature 100: Recipient according to feature 99, wherein the receiver uses a quantum dot to extract and provide an information signal in an electromagnetic field.

Transmission Device (101)

Feature 101: Transmission device comprising a field generating device that generates an electromagnetic and/or magnetic field, wherein the field generating device impresses or modulates an information signal onto the electromagnetic and/or magnetic field, and comprising a receiver according to feature 100, wherein the receiver extracts the information signal from the time course of the electromagnetic, in particular of the magnetic flux density B, and/or of the magnetic field using of a quantum dot and makes it available, wherein the making available can take place in particular by means of the signaling via a line and/or by means of the provision of signal values and/or by means of the provision of sampled values and/or by means of the provision or transferring or signaling of information which the transmission device and/or the receiver extract from the information signal.

Borehole Measurement (102-103)

Feature 102: A method of measuring magnetic flux density B within a borehole or geological search field, comprising the steps of positioning a measuring system or a part of a measuring system in the borehole, wherein the measuring system comprises a sensor element (NVD) made of a material, in particular diamond, having a material surface, and wherein the sensor element (NVD) comprises a quantum dot, in particular a paramagnetic center in a crystal and/or in particular a plurality of paramagnetic centers and/or in particular a NV center in a diamond crystal and/or in particular a plurality of NV centers in a diamond crystal and/or in particular a SiV center in a diamond crystal and/or in particular a G center in a silicon crystal, and wherein the measuring system can comprise a magnetometer according to one or more of the features 1 to 26 and/or a module according to one or more of the features 27 to 37 and/or a current sensor according to one or more of the features 38 to 42 and/or a quantum optical system according to feature 58 and/or a circuit carrier of one or more of the features 59 to 60 and/or an optical device according to one or more of the features 83 to 86 and/or a sensor system according to one or more of features 87 to 89 and/or a quantum technological device according to feature 90 as a subsystem and wherein said subsystem comprises the sensor element (NVD) in the case of the presence of the subsystem; and wherein the measuring system determines and/or outputs and/or transmits and/or provides a measured value which depends on the value of a physical parameter, in particular the magnetic flux density B, which acts on the sensor element (NVD);

detecting the value of the physical parameter, in particular the value of the magnetic flux density B, at the location of the sensor element (NVD) of the measuring system as a determined measured value, and transfer or transport the determined measured value to the surface.

Feature 103: Procedure according to feature 102 wherein the measurement system comprises or is a direct contact sensor system.

Method of Manufacturing an Optical System

Feature 104: Method of manufacturing an optical system comprising the following steps:

provide a system carrier (GPCB) comprising an interface;

application, in particular dispensing, and/or printing of a first glass frit paste onto the system carrier (GPCB) as the first glass frit structure;

melting a glass frit structure to a molten glass frit structure;

solidification of the molten glass frit structure into a solidified glass frit structure;

using the solidified glass frit structure as an optical functional element.

Feature 105: Procedure according to feature 104 wherein the system carrier (GPCB) has structures on the surface, in particular fluidic and/or microfluidic structures, in particular depressions and/or trenches and/or lips and/or other means, which limit and/or control and/or influence the flow of the molten glass frit of the molten glass frit structure.

Feature 106: Method according to one or more of features 104 to 105.
   wherein the solidified glass frit structure is optically transparent.
Feature 107: Method according to one or more of features 104 to 106.
   wherein the solidified glass frit structure is not optically transparent.
Feature 108: Method according to one or more of features 104 to 107.
   wherein the solidified glass frit structure has diffuser devices.
Feature 109: Method according to one or more of features 104 to 108.
   wherein the solidified glass frit structure has colored particles.
Feature 110: Method according to one or more of features 104 to 109.
   wherein the solidified glass frit structure has transparent, colored particles.
Feature 111: Method according to one or more of features 104 to 110.
   wherein the glass frit paste comprised or comprises colored glass particles.
Feature 112: Method according to one or more of features 104 to 111.
   wherein the glass frit paste and/or the solidified glass frit structure comprises ferromagnetic particles.
Feature 113: Method according to one or more of the features 104 to 112
   wherein the solidified glass frit structure comprises particles and/or crystals having one or more quantum dots, in particular having one or more paramagnetic centers and/or in particular having at least a plurality of paramagnetic centers and/or in particular having one or more NV centers in one or more diamond crystals and/or in particular having at least a plurality of NV centers in one or more diamond crystals and/or in particular having one or more SiV centers in one or more diamond crystals and/or in particular having one or more G centers in one or more silicon crystals.
Feature 114: Procedure according to feature 113
wherein at least one or more paramagnetic centers of the paramagnetic centers are
   NV centers in diamond and/or
   SiV centers in diamond and/or
   a ST1 center in diamond and/or
   an L2 center in diamond and/or
   another paramagnetic center in a crystal.
Feature 115: Method according to one or more of features 104 to 114.
   wherein the solidified glass frit structure has a width at least one location of less than 1 mm and/or less than 500 µm and/or less than 200 µm and/or less than 100 µm and/or less than 50 µm and/or less than 20 µm and/or less than 10 µm and/or less than 5 µm and/or less than 2 µm and/or less than 1 µm and/or less than 0.5 µm and/or less than 0.2 µm and/or less than 0.1 µm.
Feature 116: Method according to one or more of features 104 to 115.
   wherein at least a sub-device of the solidified glass frit structure is one of the following optical functional elements:
   an optical filter, in particular a Bragg filter and/or
   a mirror and/or a mirror surface and/or
   a lens, in particular a micro-lens and/or
   a digital optical functional element and/or
   a diffractive optical functional element and/or
   a photonic crystal and a photonic crystal structure and/or
   an optical or photonic grating and/or
   a wave coupler and/or
   a resonator and/or
   an optical diaphragm and/or
   a wave sump and/or
   an optical shield and/or
   a prism and/or
   a beam splitter and/or
   an optical waveguide and/or
   a light conducting functional element and/or
   a dispersing functional element and/or
   an optical filtering functional element and/or
   a polarizing functional element and/or
   a distracting functional element and/or
   an aperture- and luminous flux-changing functional element and/or
   an energy-converting functional element and/or
   a non-linear functional element and/or
   a wave-optical functional element and/or
   a holographic functional element.

Method of Manufacturing an Optical System Comprising a Sheet (117-127)
   Feature 117: Method of manufacturing an optical system comprising the following steps:
      providing a system carrier (GPCB) comprising an interface;
      application and/or gluing and/or laminating of a first sheet onto the system carrier (GPCB);
      structuring the first sheet to obtain a first sheet structure, wherein the structuring may occur before or after the step of applying, adhering, or laminating;
      using the first sheet structure as an optical functional element.
   Feature 118: Procedure after feature 117
      wherein the first sheet structure is optically transparent.
   Feature 119: Method according to one or more of features 117 to 118 comprising the additional steps of
      applying and/or adhering and/or laminating a second sheet to the system carrier (GPCB);
      structuring the second sheet to obtain a second sheet structure, wherein the structuring may occur before or after the step of applying, adhering or laminating the second sheet;
      using the second sheet structure as a second optical functional element.
   Feature 120 Method according to one or more of the features 117 to 119
      wherein the first sheet structure is not optically transparent.
   Feature 121: Method according to one or more of features 117 to 120
      wherein the first sheet structure has diffuser devices or scattering structures in its sheet material.
   Feature 122: Method according to one or more of features 117 to 121
      wherein the first sheet structure is optically transparent and colored.
   Feature 123: Method according to one or more of features 117 to 122
      wherein the first sheet structure has colored particles in its material.
   Feature 124: Method according to one or more of features 117 to 123 wherein the sheet and/or the first sheet structure has ferromagnetic particles in its sheet material.

Feature 125: Method according to one or more of features 117 to 124
wherein the first sheet structure comprises in its sheet material particles and/or crystals having one or more quantum dots, in particular having one or more paramagnetic centers and/or in particular having at least a plurality of paramagnetic centers and/or in particular having one or more NV centers in one or more diamond crystals and/or in particular having at least a plurality of NV centers in one or more diamond crystals and/or in particular having one or more SiV centers in one or more diamond crystals and/or in particular having one or more G centers in one or more silicon crystals.

Feature 125: Procedure according to feature 124
wherein at least one or more paramagnetic centers of the paramagnetic centers are
NV centers in diamond and/or
SiV centers in diamond and/or
an ST1 center in diamond and/or
an L2 center in diamond and/or
a G center in silicon and/or
another paramagnetic center in a crystal.

Feature 126: Method according to one or more of features 117 to 125
wherein the first sheet structure has a width at least one location of less than 1 mm and/or less than 500 μm and/or less than 200 μm and/or less than 100 μm and/or less than 50 μm and/or less than 20 μm and/or less than 10 μm and/or less than 5 μm and/or less than 2 μm and/or less than 1 μm and/or less than 0.5 μm and/or less than 0.2 μm and/or less than 0.1 μm.

Feature 127: Method according to one or more of features 117 to 126
wherein at least a sub-device of the first sheet structure is one of the following optical functional elements:
an optical filter, in particular a Bragg filter and/or
a mirror and/or a mirror surface and/or
a lens, in particular a micro-lens and/or
a digital optical functional element and/or
a diffractive optical functional element and/or
a photonic crystal and a photonic crystal structure and/or
an optical or photonic grating and/or
a wave coupler and/or
a resonator and/or
an optical diaphragm and/or
a wave sump and/or
an optical shield and/or
a prism and/or
a beam splitter and/or
an optical waveguide and/or
a light conducting functional element and/or
a dispersing functional element and/or
an optical filtering functional element and/or
a polarizing functional element and/or
a distracting functional element and/or
an aperture- and luminous flux-changing functional element and/or
an energy-converting functional element and/or
a non-linear functional element and/or
a wave-optical functional element and/or
a holographic functional element.

BRIEF DESCRIPTION OF THE DRAWINGS

The figures explain some, but not all, aspects of the proposal. They are provided for clarification. The applicable claims are decisive for the stressing. The figures are only individual examples that do not limit the claim.

DETAILED DESCRIPTION OF THE DRAWINGS

FIG. 1

Figure 1:
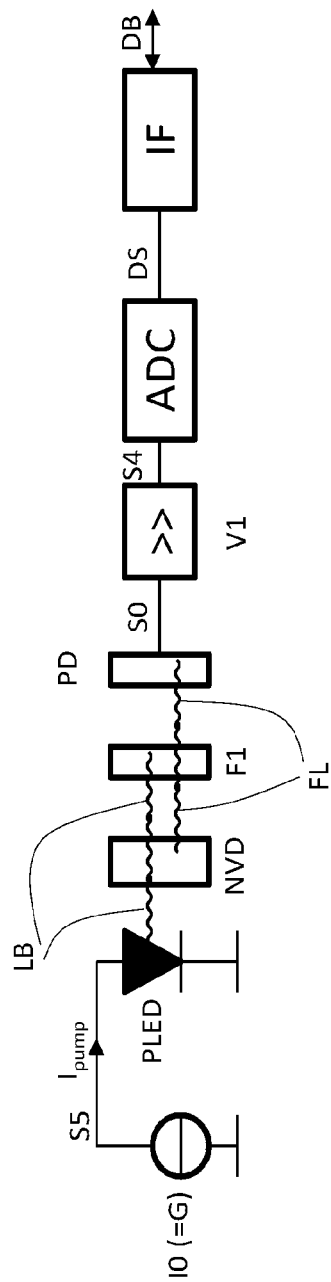
FIG. 1 shows the basic structure of the magnetometer as a highly simplified block diagram.

FIG. 1 shows the basic structure of the magnetometer as a highly simplified block diagram. The signal generator (G) in this simple example is a pump current source (I0), which cannot be modulated in this example. The pump current source (I0) generates the pump current ($I_{pump}$) as a transmission signal (S5). The pump current ($I_{pump}$) feeds the pump radiation source (PLED). The pump radiation source (PLED) emits pump radiation (LB) into a first transmission path (i1, not drawn). The intensity of the pump radiation (LB) typically depends on the transmission signal (S5). As a result, the pump radiation source (PLED) irradiates at least one area of the sensor element (NVD) using pump radiation (LB). The sensor element (NVD) emits fluorescence radiation (FL) depending on the pump radiation (LB). The intensity of the fluorescence radiation (FL) depends on the intensity of the pump radiation (LB) in the emission area of the fluorescence radiation (FL) and, if necessary, on other parameters, for example the magnitude of the magnetic flux density B, in this area. An optical filter (F1) preferably allows a portion of the fluorescence radiation (FL) sufficient for the measuring system to pass, while it does not allow a portion of the pump radiation (LB) sufficient for the measuring system to pass. As a result, essentially only the fluorescence radiation (FL) reaches the radiation receiver (PD) via a second transmission path (i2, not shown in FIG. 1). The radiation receiver (PD) converts the received intensity of the fluorescence radiation (FL) and possibly further received radiation into a receiver output signal (S0), the value of which represents the amount of radiation intensity received by the radiation receiver (PD). In the example of FIG. 1, a first amplifier (V1) amplifies the receiver output signal (S0) to a demodulated signal (S4). This name "demodulated signal" is chosen only because modulations will be added later.

In this example, an analog-to-digital converter (ADC) converts the demodulated signal (S4) into a digitized signal (DS). A data interface (IF) then enables access to this value via a data bus (DB).

FIG. 2

Figure 2:
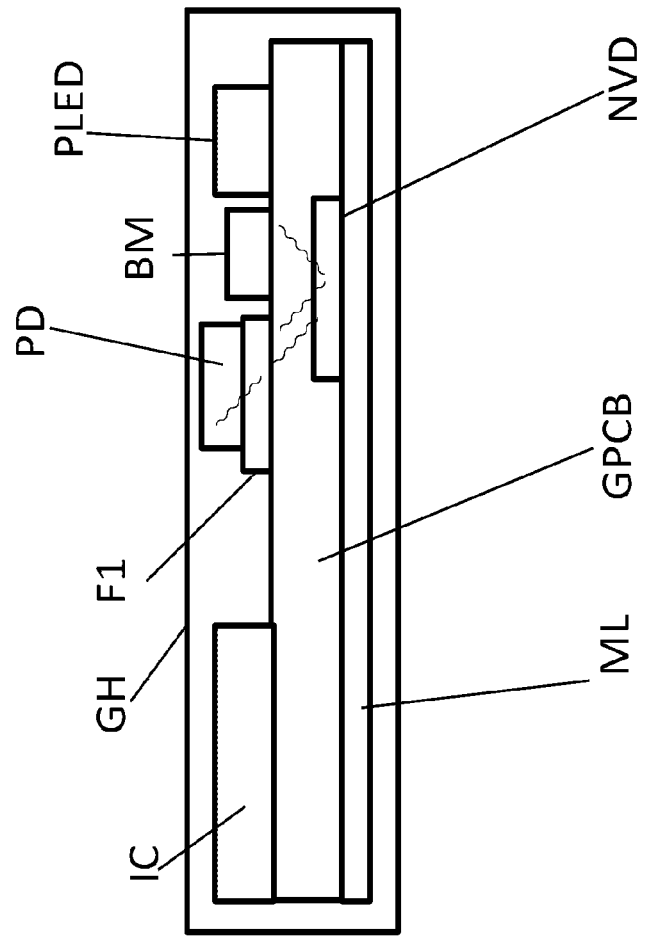
FIG. 2 shows a cross-sectional view of a module whose function corresponds to the basic structure of an exemplary magnetometer shown in FIG. 1.

FIG. 2 shows a cross-sectional view of an exemplary module, the function of which corresponds to the basic structure of an exemplary magnetometer shown in FIG. 1. On an exemplary circuit carrier (GPCB), which is made of optically transparent glass, for example, on the upper side of the circuit carrier (GPCB) lines not shown here are applied, for example in thick-film technology, to which, for example, a microintegrated circuit (IC), the radiation receiver (PD) and the pump radiation source (PLED) are electrically and possibly also mechanically connected. The pump radiation source (PLED) irradiates a sensor element (NVD), which for example includes NV centers in diamond, using pump radiation (LB). Depending on the magnetic flux density B as an exemplary physical quantity, the NV centers of the sensor element (NVD) emit fluorescence radiation (FL). An optical filter (F1) ensures that no pump radiation (LB) enters the radiation receiver (PD). A housing (GH) ensures that potential other optical paths are interrupted. The housing (GH) preferably comprises black thermoset as the housing material. A mirror surface (ML) ensures that as much as possible of the pump radiation (LB) from the pump radiation source (PLED) reaches the sensor element (NVD) and that as much as possible of the fluorescence radiation (FL) reaches the radiation receiver (PD) to maximize the sensitivity of the system.

The sensor element (NVD) is preferably mounted on the other side of the circuit carrier (GPCB). This means that it is electrically isolated from the microintegrated circuit (IC) and the other electronic components (PLED, PD) on the upper side of the circuit carrier (GPCB).

Figure 9:
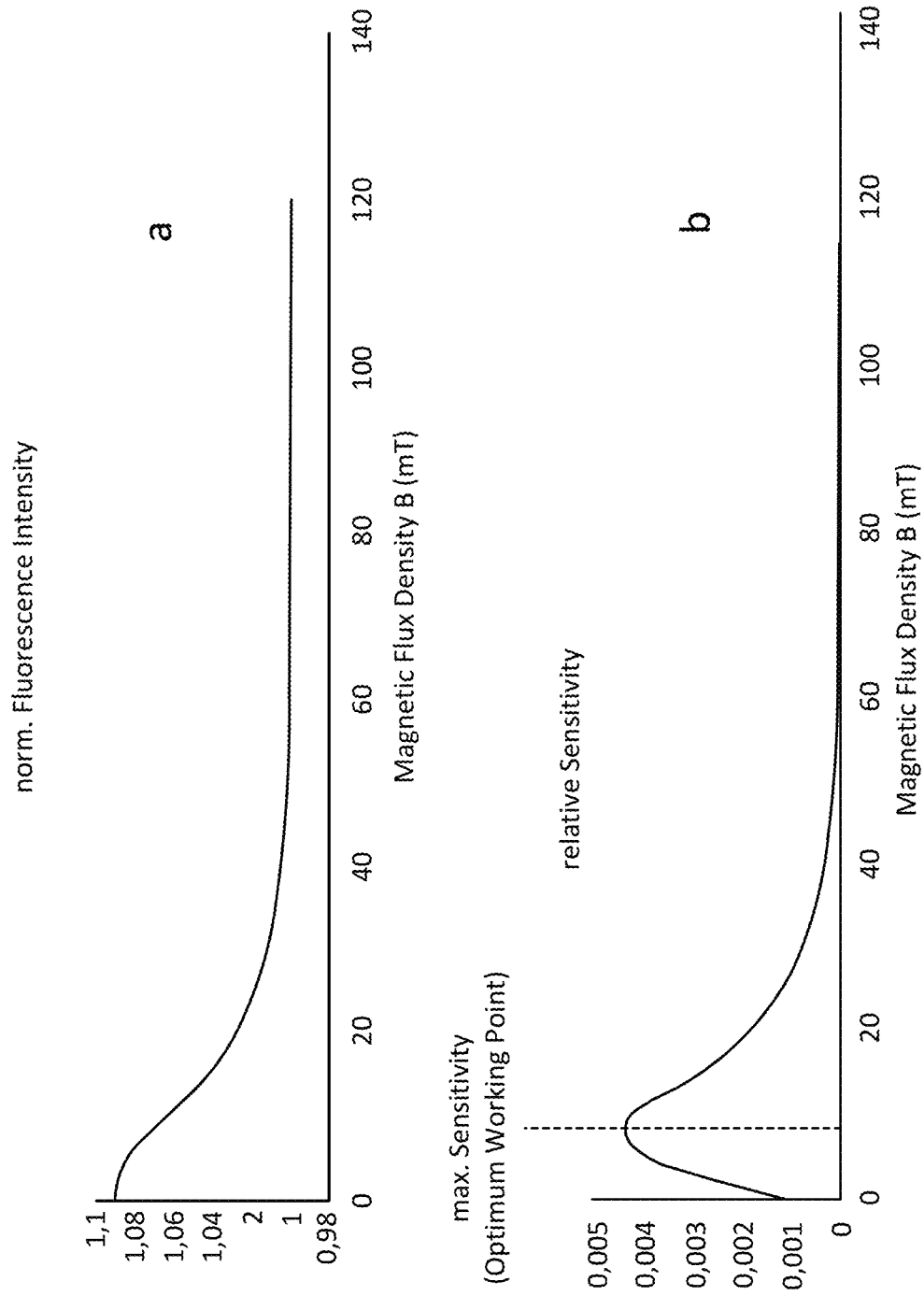
FIG. 9 shows a sensitivity curve for the change in intensity of fluorescence radiation (FL) as a function of magnetic flux density B.

A bias magnet (BM), which is typically a permanent magnet, is attached to the top of the circuit carrier (GPCB) here as an example to set the bias magnetic field. In FIG. 9 it can be seen later that, for example, a bias magnetic field of about 10 mA is often very suitable for NV centers.

FIG. 3

Figure 3:
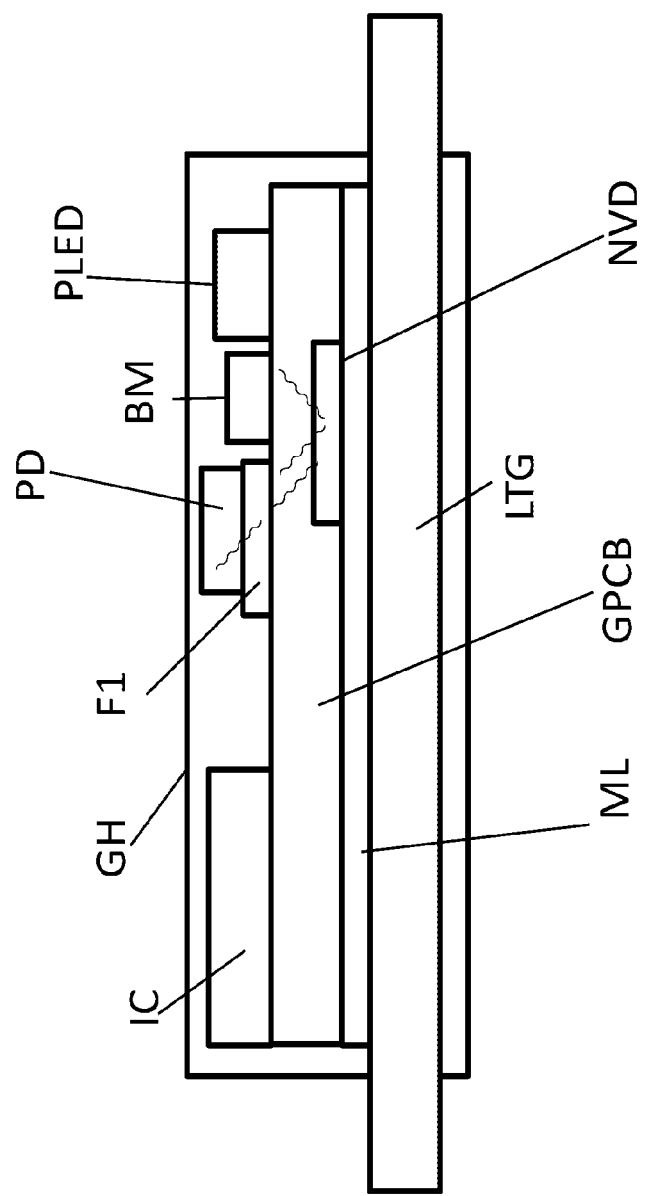
FIG. 3 shows a current sensor based on the module of FIG. 2.

FIG. 3 shows a current sensor based on the module of FIG. 2. The module of FIG. 2 is now supplemented by an electrical conductor (LTG). If a current flow takes place in the electrical conductor (LTG), this generates a magnetic flux density B, which influences the fluorescence radiation (FL) of the sensor element (NVD) and can therefore be measured and converted into a measured value and whose measured values can be passed on via the said data bus (DB), for example.

FIG. 4

Figure 4:
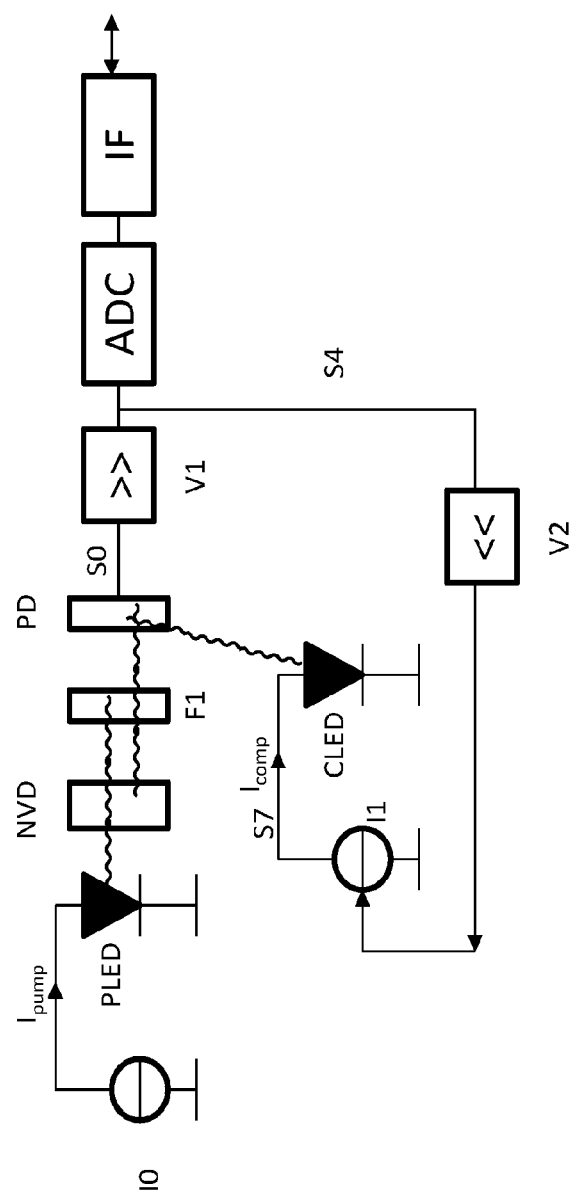
FIG. 4 shows the block diagram of a magnetometer comprising optical feedback compensation.

FIG. 4 shows the block diagram of a magnetometer comprising optical feedback compensation. It is similar to FIG. 1, but now a second amplifier (V2) amplifies the demodulated signal (S4). The second amplifier (V2) provides the demodulated signal (S4) if necessary with an offset. The second amplifier (V2) generates the compensation transmission signal (S7) by means of the compensation current source (I1). The compensation transmission signal (S7) feeds the compensation radiation source (CLED) using a compensation transmission current ($I_{comp}$). The compensation radiation source (CLED) also radiates into the radiation receiver (PD) via a third transmission path (I3, not shown here). Having a total intensity, the irradiation of the fluorescence radiation (FL) and the compensation radiation (CL) of the compensation radiation source (CLED) is preferably approximately summing. The instantaneous value of the receiver output signal (S0) of the radiation receiver (PD) depends on this instantaneous total intensity. Thus, the instantaneous value of the receiver output signal (S0) of the radiation receiver (PD) is also dependent on the intensity of the fluorescence radiation (FL) and the intensity of the compensation radiation (CL). The gains and signs in this control loop are thereby preferably selected in such a way that stability is achieved. This means that the total intensity is preferably constant, so that the physical conditions in the radiation receiver (PD) do not change even if the intensity of the fluorescence radiation (FL) changes, since a corresponding change in the intensity of the compensation radiation (CL) in the opposite direction compensates for this.

FIG. 5

Figure 5:
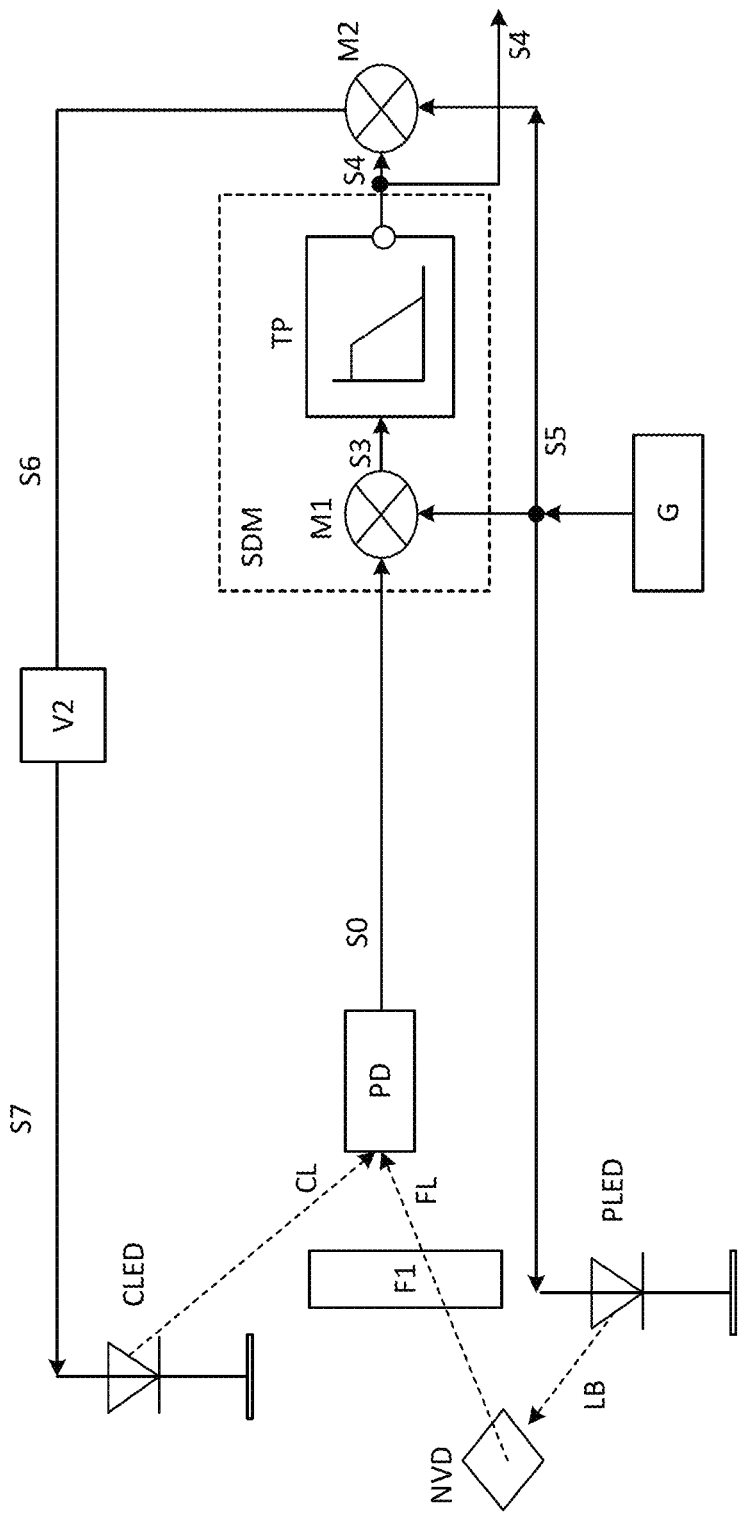
FIG. 5 shows the block diagram of a magnetometer comprising a chopper stage.

FIG. 5 shows the block diagram of an exemplary magnetometer comprising an exemplary chopper stage. As in FIG. 4, the radiation receiver (PD) again receives the total intensity of the radiations, namely the fluorescence radiation (FL) of the sensor element (NVD) and the compensation radiation (CL). An optical filter (F1) again prevents pump radiation (LB) from reaching the radiation receiver (PD). The radiation receiver (PD) converts the value of the total radiation intensity to the instantaneous value of the receiver output signal (S0). A synchronous demodulator (SDM) converts the receiver output signal (S0) to the demodulated signal (S4) using the transmission signal (S5). A signal generator (G) preferably generates the transmission signal (S5). The transmission signal (S5) preferably has a frequency different from 0 Hz. In the example of FIG. 5, the exemplary synchronous demodulator (SDM) comprises a first multiplier (M1) which converts the receiver output signal (S0) into an instantaneous value of the multiplier output signal (S3) by multiplying the instantaneous value of the receiver output signal (S0) by the instantaneous value of the transmission signal (S5). An exemplary low-pass filter (TP) amplifies and filters the multiplier output signal (S3) to the demodulated signal (S4). Thus, the low-pass filter (TP) here has taken over the function of the first amplifier (V1) of FIG. 1 and FIG. 4. Preferably, the low-pass filter (TP) lets through essentially only a DC signal and no frequencies of the transmission signal (S5) and higher. Evaluation means (ADC, IF) which are no longer shown can then process the demodulated signal (S4) as shown in FIG. 4. A second multiplier (M2) multiplies the instantaneous value of the demodulated signal (S4) with the instantaneous value of the transmission signal (S5) to the instantaneous value of the compensation pre-signal (S6). If necessary, a second amplifier (V2) further amplifies the compensation pre-signal (S6) to the compensation transmission signal (S7) and typically provides it with an offset. The intensity of the compensation radiation (CL) emitted by the compensation radiation source (CLED) typically depends on the instantaneous value of the compensation transmission signal (S7). The intensity of the pump radiation (LB) emitted by the pump radiation source (PLED) typically depends on the instantaneous value of the transmission signal (S5). The gains and offsets in the control loop are preferably designed in such a way that stability is achieved essentially apart from control errors and system noise.

FIG. 6

Figure 6:
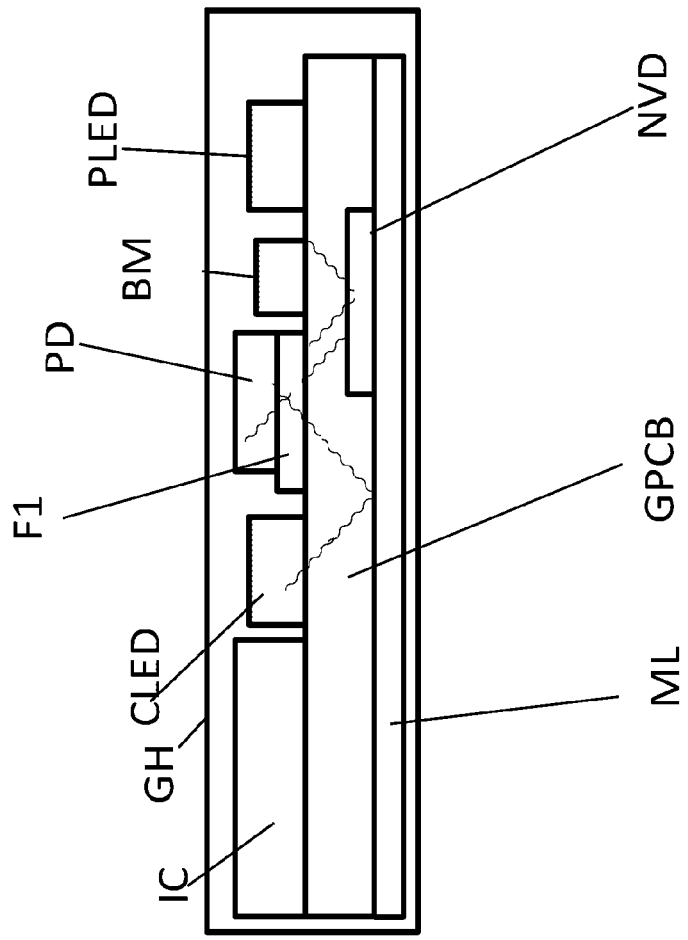
FIG. 6 shows a cross-section of a module whose function corresponds to the structure of an exemplary magnetometer shown in FIG. 5.

FIG. 6 shows a cross-sectional view of a module which corresponds in its function to the structure of an exemplary magnetometer of FIG. 5. It corresponds to the module of FIG. 2. In contrast to FIG. 2, it now comprises the additional compensation radiation source (CLED) of FIGS. 4 and 5. A user of the technical teaching disclosed herein will preferably select the compensation radiation wavelength ($\lambda ks$) of the compensation radiation (CL) such that it can pass the optical filter (F1) in the example of FIG. 6. For example, if the pump radiation (LB) is green and the fluorescent radiation (FL) is red, for example, an infrared radiation may be useful as the compensation radiation (CL).

FIG. 7

Figure 7:
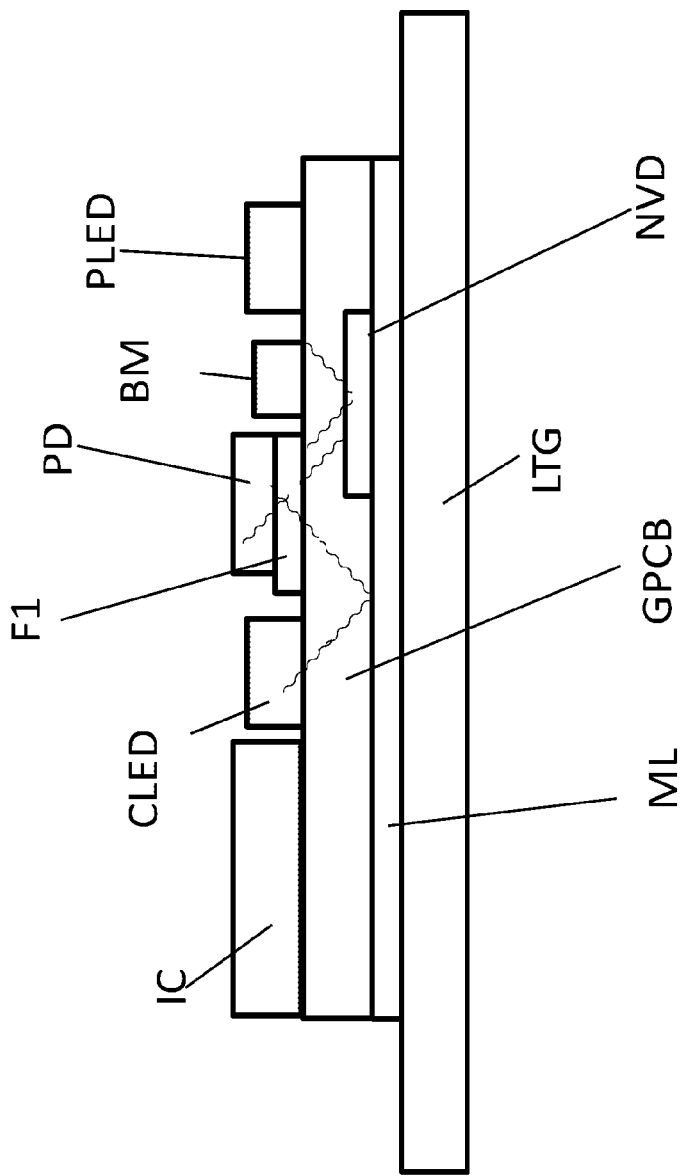
FIG. 7 shows a current sensor based on the module of FIG. 6.

FIG. 7 again shows a current sensor based on the module of FIG. 6. Analogous to FIG. 3, it again comprises the said electrical conductor (LTG).

FIG. 8

Figure 8:
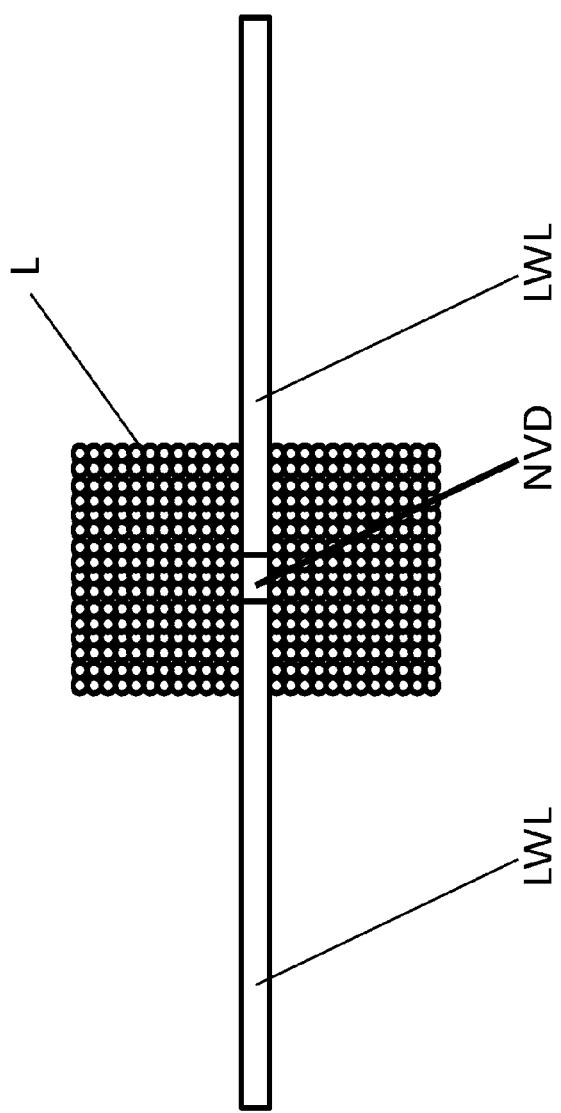
FIG. 8 shows a sensor element in an optical waveguide as the core of an electric coil for current measurement.

FIG. 8 shows a sensor element in an optical waveguide as the core of an electrical coil (L) for current measurement. The optical transmission paths of the systems shown above can also be designed completely or partially as optical waveguides (OFC). It may then be useful to wind a coil (L) as an electrical conductor (LTG) around the optical waveguide (LWL) and the sensor element (NVD) inserted in the optical waveguide (LWL) in order to maximize the magnetic flux density B.

FIG. 9

FIG. 9a shows an exemplary fluorescence curve for a sensor element comprising NV centers in diamond. FIG. 9b shows the corresponding sensitivity curve for the change in the intensity of the fluorescence radiation as a function of the magnetic flux density B.

FIGS. 10 to 18

FIGS. 10 to 18 show a method of manufacturing an optical module. The sequence of individual steps may be modified. Steps may be added to the process. Steps can be omitted if necessary and if it makes sense to do so.

FIG. 10

Figure 10:
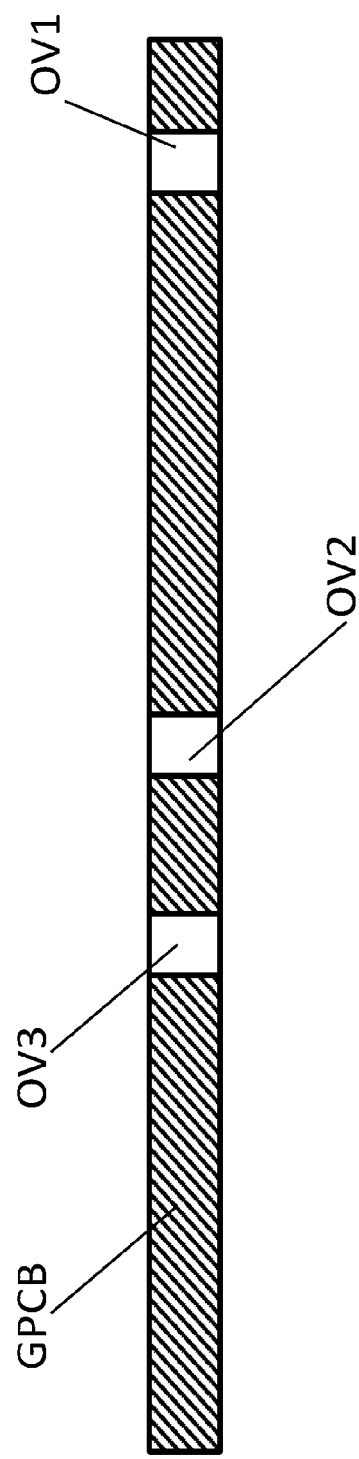
FIGS. 10 to 18 show a method of manufacturing an optical module using a glass frit paste that is molten.

The exemplary method begins with the provision of a system carrier (GPCB) in FIG. 10. In the example of FIG. 10, the system carrier (GPCB) is optically opaque. It has a first exemplary optically transparent feedthrough (OV1) and a second exemplary optically transparent feedthrough (OV2) and a third exemplary optically transparent feedthrough (OV3), which allow later functional elements to communicate optically with the other side of the system carrier (GPCB).

FIG. 11

In the example shown here, the manufacturing device not shown applies a glass frit paste of glass dust and a carrier to the system carrier (GPCB) of FIG. 10. This application can use functionally equivalent materials from other substances (e.g., from salts). In this case, the application of the glass frit paste is carried out using stencil printing, for example. The sections of the glass frit paste printed in this way later form the first transmission path (i1) and the second transmission path (i2) and the third transmission path (i3).

FIG. 12

Figure 11:
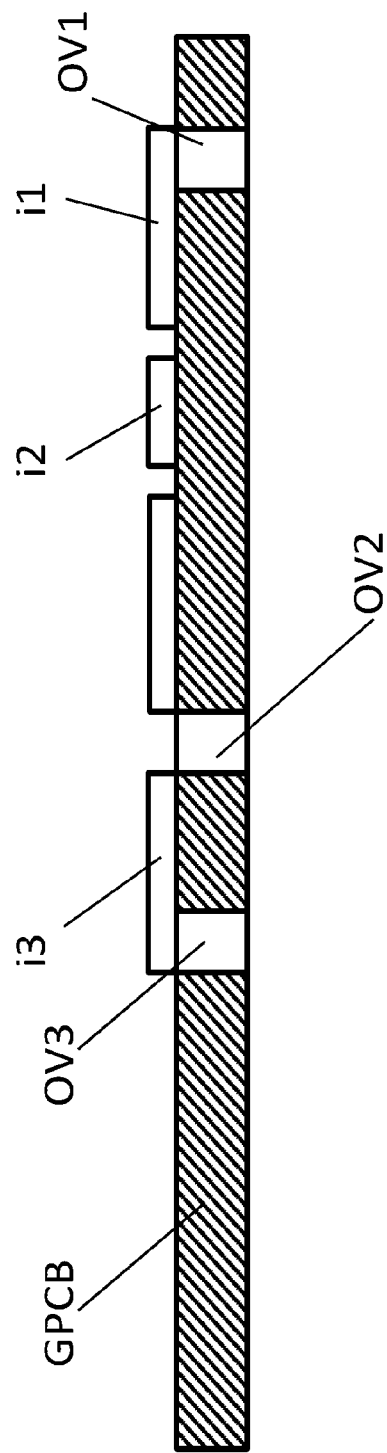

The manufacturing device, which is not drawn, applies a glass frit paste comprising ferromagnetic particles to the other side of the system carrier (GPCB), for example by means of stencil printing, onto the system carrier of FIG. 11. This glass frit paste, which comprises ferromagnetic particles, is later to form the bias magnet (BM), for example.

FIG. 13

Figure 12:
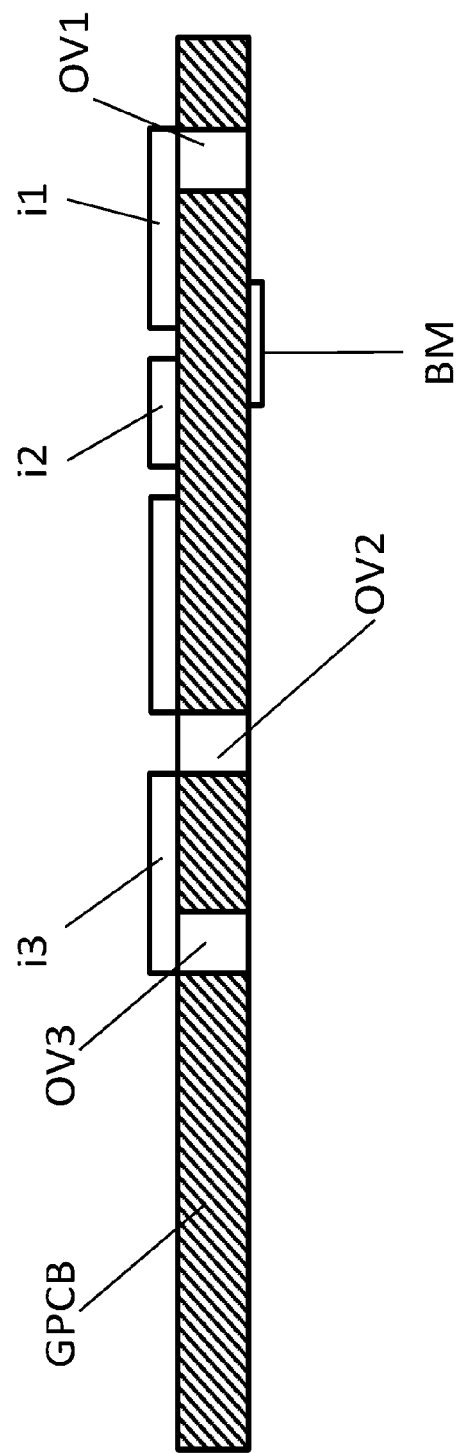

On the system carrier (GPCB) of FIG. 12, the manufacturing device, which is not drawn, introduces a glass frit paste, for example by means of stencil printing, into the gap between the glass frit paste section, which will later constitute the second transmission path (i2), and the glass frit paste section, which will later constitute the first transmission path (i1). This glass frit paste may be interspersed with, for example, diamond microcrystals comprising high density NV centers. This new glass frit paste section will then later form the sensor element (NVD).

FIG. 14

Figure 13:
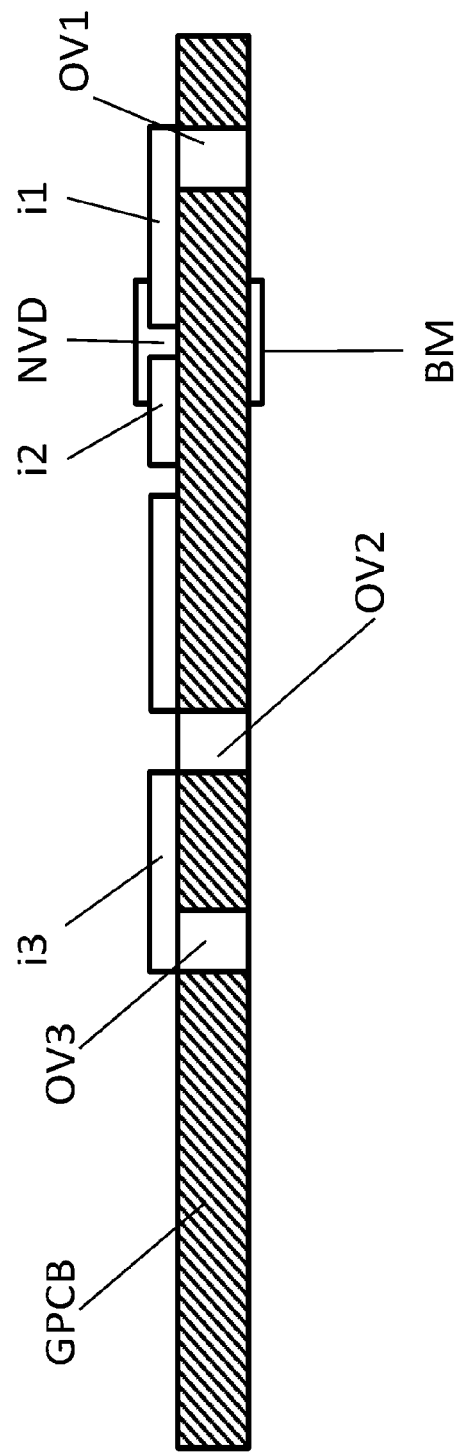

The production device, which is not drawn, applies a glass frit paste, for example by means of stencil printing, to the system carrier (GPCB) of FIG. 13 in the gap between the glass frit paste section, which will later represent the second transmission path (i2), and the glass frit paste section located to the left of it. This glass frit paste can be interspersed with colored glass particles or a coloring salt, for example. This additional material is chosen in such a way that later this section no longer transmits pump radiation (LB) from the pump radiation source (PLED), but does transmit radiation having the fluorescence radiation wavelength ($\lambda_{fl}$) of the fluorescence radiation (FL) from the sensor element (NVD). This new glass frit paste section will then later form the optical filter (F1).

FIG. 15

Figure 14:
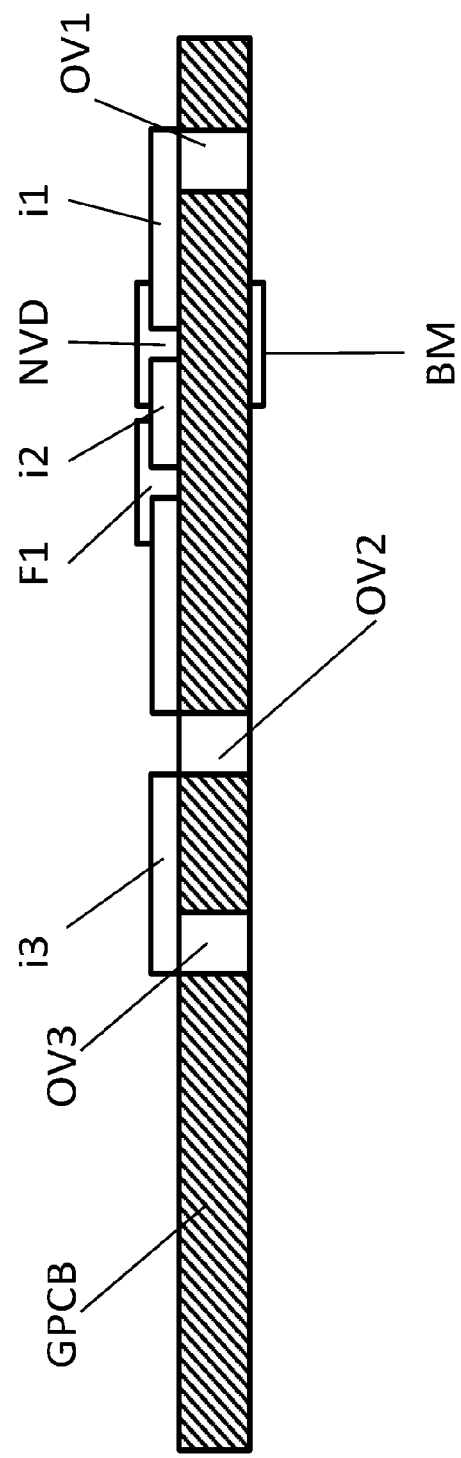

On the system carrier (GPCB) of FIG. 14, the manufacturing device, which is not drawn, introduces a glass frit paste, for example by means of stencil printing, into the gap between the glass frit paste section, which will later represent the third transmission path (i3), and the glass frit paste section located to the right of it. This glass frit paste can, for example, be interspersed with white colored glass particles or with particles of a different refractive index. This additional material then leads, in the exemplary case proposed here, to a scattering of the compensation radiation (CL) and the fluorescence radiation (FL) by these particles, so that this radiation can then later fall through the second exemplary optically transparent feedthrough (OV2) onto the radiation receiver (PD), which is not yet mounted here. This new glass frit paste section will later form an optical diffuser device (STR) in the beam path.

FIG. 16

Figure 15:
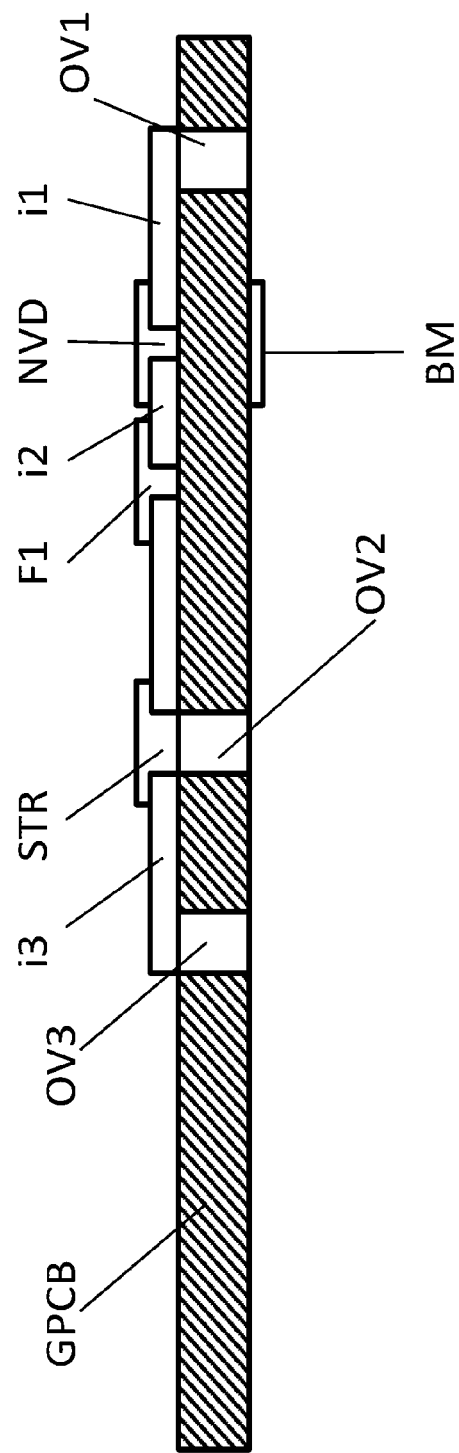

Heat treatment of the system carrier (GPCB) of FIG. 15 melts and remelts the glass frit paste sections. They now preferably form a firm mechanical bond with the system carrier (GPCB).

FIG. 17

Figure 16:
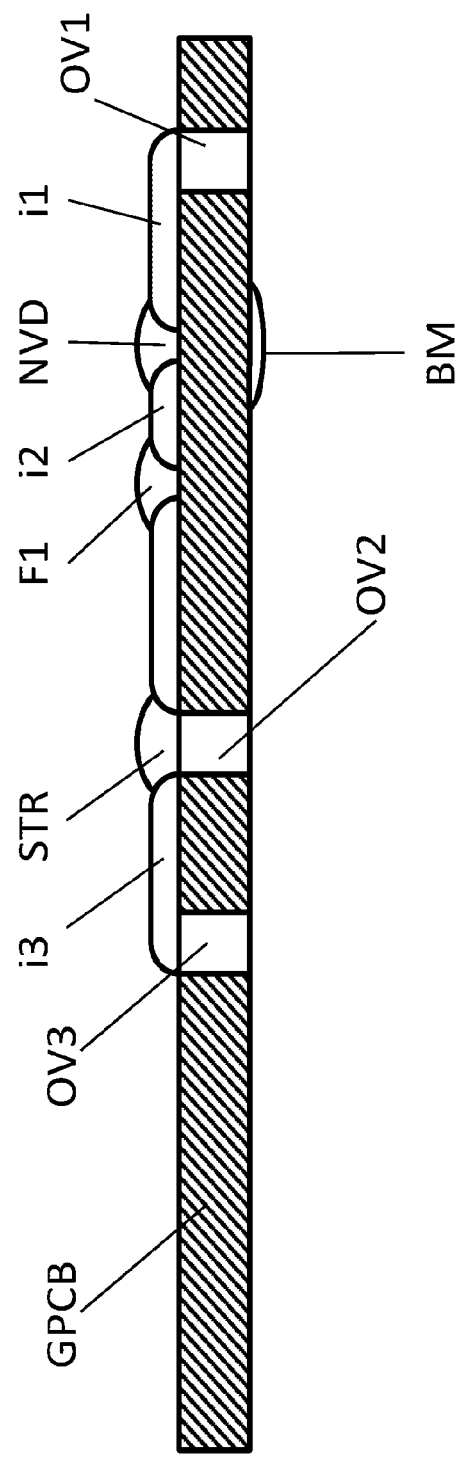

A printing technique preferably applies electrical leads (LT) to the system carrier (GPCB) of FIG. 16 using thick-film technology.

FIG. 18

Figure 17:
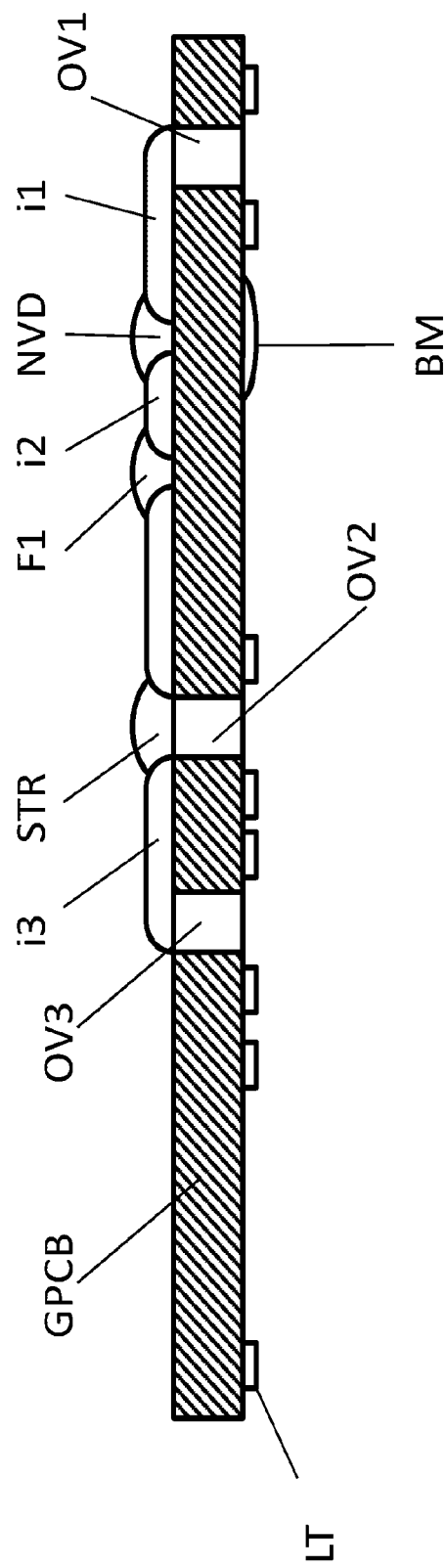
Figure 18:
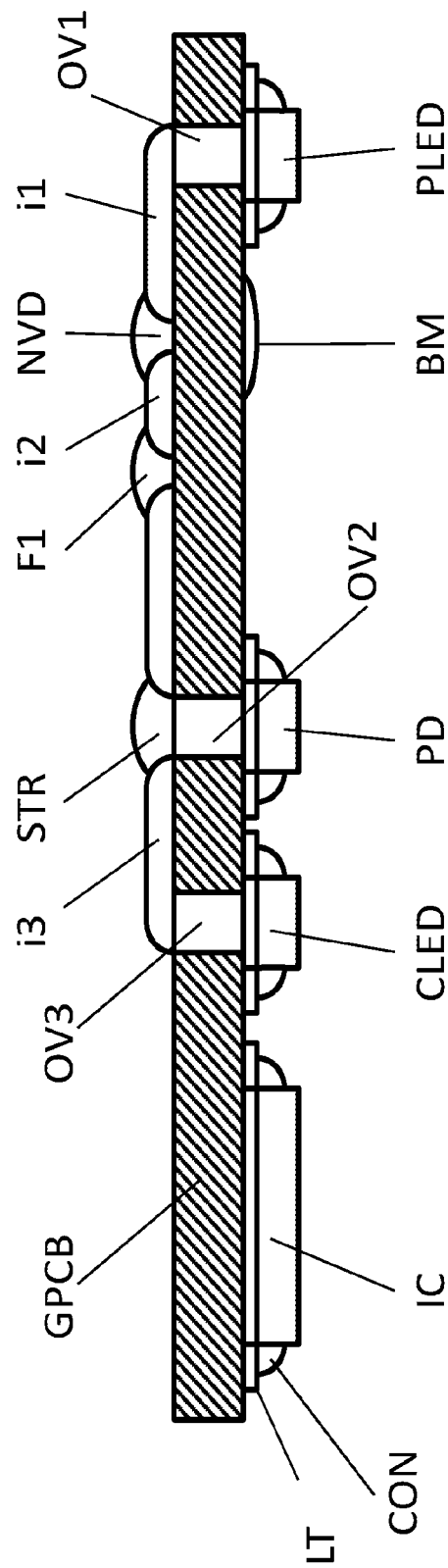

An undrawn manufacturing device prints solder paste onto the system carrier (GPCB) of FIG. 17. An undrawn assembly device assembles the system carrier (GPCB) of FIG. 17 comprising electronic components (IC, CLED, PD, PLED). The system carrier is soldered, for example, in a soldering device not drawn, for example a reflow oven. The pump radiation source (PLED), for example a green LED, can now feed the pump radiation (LB), which is for example green, via the first exemplary optically transparent feedthrough (OV1) into the first transmission path (i1), which now acts as an optical waveguide (LWL) after melting. The pump radiation (LB) impinges on the sensor element (NVD), which here comprises NV centers as an example. The sensor element (NVD) functions here as a short optical waveguide (LWL) comprising active components, the NV centers. The sensor element (NVD) emits fluorescence radiation (FL) into the second transmission path (i2), into which pump radiation (LB) also enters and which also acts as an optical waveguide (LWL). Here, the optical filter (F1) acts as a wavelength-selective optical waveguide (LWL). Due to its coloring, the optical filter (F1) only allows fluorescence radiation (FL) to pass. The fluorescence radiation (FL) now enters another optical waveguide (LWL). On the other side, the compensating radiation source (CLED) radiates the compensation radiation (CL) into the third transmission link (i3) via the third exemplary optically transparent feedthrough (OV3). The compensation radiation (CL) enters the diffuser device (STR) via the third transmission path (i3), which acts as an optical waveguide (LWL) comprising a highly scattering material. The diffuser device (STR) scatters the compensation radiation (CL) toward the radiation receiver (PD) via the second exemplary optically transparent feedthrough (OV2). The diffuser device (STR) scatters the fluorescence radiation (FL) from the further optical waveguide (LWL) also via the second exemplary optically transparent feedthrough (OV2) towards the radiation receiver (PD), where the fluorescence radiation (FL) and the compensation radiation (CL) overlap. The radiation receiver (PD) receives the total radiation intensity from the intensity of the incident fluorescence radiation (FL) and incident compensation radiation (CL). For the rest, please refer to the description of the control circuits from here on.

What is claimed is:

1. A quantum optical system comprising:
    at least one quantum dot arranged in one or more crystals, and
    a circuit carrier made of an optically transparent material different from a material of the one or more crystals,
    wherein the quantum dot can interact with an optical radiation,
    wherein the circuit carrier interacts with the quantum dot such that the circuit carrier acts as an optical functional element for at least a portion of the optical radiation that can interact or has interacted with the quantum dot,
    wherein the circuit carrier includes at least one electronic component,
    wherein the circuit carrier includes at least one electrical lead, and
    wherein the at least one electrical lead of the circuit carrier is electrically connected to at least one terminal of the at least one electronic component by soldering electrically conductive bonding.

2. A module comprising:
    a pump radiation source, configured to radiate a pump radiation having a wavelength $\lambda_{pmp}$;
    a sensing element, wherein, the sensing element comprises the quantum optical system of claim 1;
    wherein:
    the quantum dot of the quantum optical system receives the pump radiation and emits a fluorescent radiation having wavelength ($\lambda$n); and
    the material of the circuit carrier is, at least locally, transparent to the pump radiation and the fluorescent radiation.

3. The module according to claim 2,
    wherein at least one line is mechanically connected to the circuit carrier, such that the circuit carrier comprises at least this at least one line.

4. The module according to claim 2,
    wherein an intensity of the fluorescent radiation depends on a value of a magnetic flux density B or a value of another physical parameter at a location of the quantum dot.

5. A magnetometer, comprising:
    the module according to claim 2;
    a radiation receiver configured to convert an intensity of the fluorescent radiation into a receiver output signal; and
    an evaluation circuit including one or more electronic components configured to receive the receiver output signal, and output and/or store a measured value of the receiver output signal;
    wherein the pump radiation source emits the pump radiation when electrically energized with an electrical pump current;
    wherein:
    a) the material of the circuit carrier is at least locally transparent for radiation with the pump radiation in a first radiation path between the pump radiation source and the sensing element and the pump radiation passes this through the first radiation path, and
    b) the material of the circuit carrier is at least locally transparent for the fluorescent radiation a second radiation path between the sensing element and the radiation receiver and the fluorescent radiation passes through the second radiation path,
    and
    at least one the sensing element, the pump radiation source, the radiation receiver, and the evaluation circuit, is mechanically attached to the circuit carrier.

6. A current sensor comprising:
    the module according to claim 2; and
    an electrical conductor;
    wherein the electrical conductor is arranged with respect to the sensing element such that an additional magnetic flux density B generated by an electric current flow in the electrical conductor can influence an intensity of the fluorescent radiation.

7. A power monitoring device comprising:
    an electrical conductor comprising a first conductor position and a second conductor position different from the first conductor position, wherein the first conductor position and the second conductor position are spaced along an intended current flow through the electrical conductor;
    a first current sensor and a second current sensor, wherein each of the first current sensor and the second current sensor comprises the current sensor of claim 6; and
    a measured value evaluation device;
    wherein the first current sensor determines a first measured value of the electrical current in the electrical conductor at the first conductor position;
    wherein the second current sensor determines a second measured value of the electrical current in the electrical conductor at the second conductor position; and
    wherein the measured value evaluation device compares the first measured value with the second measured value and outputs a comparison value.

8. The power monitoring device according to the claim 7, wherein the power monitoring device operates as a ground fault circuit interrupter or fuse.

9. The power monitoring device according to claim 7, further comprising a subdevice, wherein the subdevice comprises a neural network model or an HMM model.

10. A vehicle, or flying vehicle, or missile or projectile, or surface or underwater vehicle, or a surface or underwater floating body; hereinafter referred to as the vehicle,
    wherein the vehicle comprises a subsystem including a sensing element;
    wherein the sensing element comprises the quantum optical system of claim 1 as a subsystem; and
    wherein the subsystem determines or outputs or transmits or provides a measured value which depends on a value of a physical parameter within the vehicle, the physical value including one of a magnetic flux density B or an electric field strength or a temperature or an orientation of the vehicle or an orientation of a vehicle part or a speed of the vehicle or a speed of a vehicle part or an acceleration of the vehicle or an acceleration of a vehicle part, which acts on the sensing element.

11. A usage
of the quantum optical system according to claim 1;
wherein the usage is in an environment with technically induced ionizing particles or photon radiation, and a radiation level in a unit of measurement Sv being more than 1000% above a normal radiation level in the unit of measurement Sv.

12. A method for measuring a magnetic flux density B or another physical parameter within a borehole or a geological search field, comprising:
positioning of the quantum optical system according to claim 1 as a measurement system or part of a measurement system in the borehole;
detecting a value of the magnetic flux density B or the value of the physical parameter at a location of a quantum dot, of the measurement system as a determined measured value; and
transferring or transporting the determined measured value to a surface.

13. A method of manufacturing an optical system of the quantum optical system according to claim 1 comprising:
providing a system carrier with an interface;
applying or gluing or laminating a first sheet onto the system carrier;
structuring the first sheet to obtain a first sheet structure, wherein the structuring may occur before or after a step of applying, gluing, or laminating; and
using the first sheet structure as an optical functional element;
wherein the sheet comprises sheet material comprising sensing elements, the sensing elements comprising quantum dots in the sheet material.

14. The quantum optical system of claim 1, wherein the at least one quantum dot comprises one or more paramagnetic centers in one or more crystals.

15. The quantum optical system of claim 1, wherein the at least one quantum dot comprises one or more NV centers in one or more diamond crystals.

16. The Quantum optical system of claim 1, wherein the at least one quantum dot comprises one or more SiV centers in one or more diamond crystals.

17. The Quantum optical system of claim 1, wherein the at least one quantum dot comprises one or more G centers in one or more silicon crystals.

18. A circuit carrier for use in a quantum optical system, comprising:
at least one lead;
wherein:
the circuit carrier is equipped with at least one electronic component;
the at least one lead of the circuit carrier is electrically connected to at least one terminal of the at least one of the electronic and/or electrical component by soldering and/or electrically conductive bonding;
the circuit carrier is connected to a sensing element comprising at least one quantum dot;
the at least one quantum dot is arranged in one or more crystals;
the quantum dot can interact with an optical radiation;
the circuit carrier comprises an optically transparent material different from a material of the one or more crystals; and
the circuit carrier interacts with the at least one quantum dot of the sensing element in such a way that the circuit carrier acts as an optical functional element for at least part of the optical radiation that can interact or has interacted with the at least one quantum dot of the sensing element.

19. The circuit carrier according to claim 18;
in which the circuit carrier incorporates optical functional elements comprising at least one of: optical filters, Bragg filters, mirrors, mirror surfaces, lenses, microlenses, digital optical functional elements, diffractive optical functional elements, photonic crystals, photonic crystal structures, optical gratings, photonic gratings, resonators, optical apertures, wave pumps, optical shields, prisms, beam splitters, or fiber optical cables.

20. A method of manufacturing a quantum optical system, comprising:
providing a system carrier with an interface;
applying, preferably dispensing, or printing a first glass frit paste onto the system carrier as a glass frit structure;
wherein the glass frit paste comprises a quantum dot;
melting the glass frit structure to a molten glass frit structure;
solidification of the molten glass frit structure to a solidified glass frit structure; and
using the solidified glass frit structure as an optical functional element;
wherein:
the quantum optical system comprises at least one quantum dot arranged in one or more crystals, and
a circuit carrier made of an optically transparent material different from a material of the one or more crystals, the quantum dot can interact with an optical radiation;
the circuit carrier interacts with the quantum dot such that the circuit carrier acts as an optical functional element for at least a portion of the optical radiation that can interact or has interacted with the quantum dot;
the circuit carrier includes at least one electronic component;
the circuit carrier includes at least one electrical lead, and
the at least one electrical lead of the circuit carrier is electrically connected to at least one terminal of the at least one electronic component by soldering or electrically conductive bonding.

21. The method according to claim 20, wherein the at least one quantum dot comprises one or more NV centers in one or more diamond crystals.

* * * * *